US012120933B2

(12) United States Patent
Lee et al.

(10) Patent No.: US 12,120,933 B2
(45) Date of Patent: Oct. 15, 2024

(54) DISPLAY DEVICE AND TILED DISPLAY DEVICE INCLUDING THE SAME

(71) Applicant: Samsung Display Co., Ltd., Yongin-si (KR)

(72) Inventors: Jae Been Lee, Seoul (KR); Yi Joon Ahn, Seoul (KR); Sung Hoon Kim, Asan-si (KR); Eun Kyung Yeon, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 439 days.

(21) Appl. No.: 17/379,445

(22) Filed: Jul. 19, 2021

(65) Prior Publication Data

US 2022/0028964 A1    Jan. 27, 2022

(30) Foreign Application Priority Data

Jul. 23, 2020    (KR) .......................... 10-2020-0091457

(51) Int. Cl.
*H10K 59/18*    (2023.01)
*H10K 59/124*   (2023.01)
*H10K 59/131*   (2023.01)

(52) U.S. Cl.
CPC ........... *H10K 59/18* (2023.02); *H10K 59/124* (2023.02); *H10K 59/131* (2023.02)

(58) Field of Classification Search
CPC ..... H10K 59/18; H10K 59/124; H10K 59/131
See application file for complete search history.

(56) References Cited

U.S. PATENT DOCUMENTS

| 5,920,083 A * | 7/1999 | Bae ................... H01L 29/42384 |
| | | 257/E27.111 |
| 2005/0212420 A1* | 9/2005 | Sakakura ............. H10K 59/131 |
| | | 313/506 |
| 2012/0313905 A1* | 12/2012 | Kang .................... G02F 1/1345 |
| | | 445/24 |
| 2015/0144952 A1* | 5/2015 | Kim .................. H01L 29/78648 |
| | | 438/158 |
| 2016/0155686 A1* | 6/2016 | Lee ..................... H01L 23/5226 |
| | | 257/737 |
| 2018/0097047 A1* | 4/2018 | Jung .................... H10K 59/123 |
| 2018/0342707 A1* | 11/2018 | Lee ........................ H10K 77/111 |
| 2019/0131377 A1* | 5/2019 | Kwon .................... H10K 77/10 |
| 2020/0312886 A1* | 10/2020 | Yuan ................... H01L 27/1218 |
| 2021/0296373 A1 | 9/2021 | Yeon et al. |

FOREIGN PATENT DOCUMENTS

KR    10-2021-0117380 A    9/2021

* cited by examiner

*Primary Examiner* — Vongsavanh Sengdara
(74) *Attorney, Agent, or Firm* — Lewis Roca Rothgerber Christie LLP

(57) ABSTRACT

A display device includes: a substrate comprising a first contact hole; a thin-film transistor layer on a first surface of the substrate and comprising a plurality of insulating layers and a thin-film transistor; an etching stopper on one or more of the insulating layers and contacting the substrate through a second contact hole surrounding the first contact hole in a plan view; a connection line on the etching stopper; and a pad part on a second surface of the substrate opposite the first surface of the substrate and connected to the connection line through the first contact hole.

11 Claims, 45 Drawing Sheets

DISPLAY DEVICE AND TILED DISPLAY DEVICE INCLUDING THE SAME

CROSS-REFERENCE TO RELATED APPLICATION

The present application claims priority to and the benefit of Korean Patent Application No. 10-2020-0091457 filed on Jul. 23, 2020, in the Korean Intellectual Property Office, the entire contents of which are hereby incorporated by reference.

BACKGROUND

1. Field

Aspects of some example embodiments of the present disclosure relate to a display device and a tiled display device including the same.

2. Description of the Related Art

As the information society develops, the demand for display devices for displaying images is increasing in various forms. For example, display devices are being utilizes with various electronic devices such as smartphones, digital cameras, notebook computers, navigation devices, and smart televisions. The display devices may be flat panel display devices such as liquid crystal display devices, field emission display devices, and organic light emitting display devices. Of the flat panel display devices, a light emitting display device includes a light emitting element that enables each pixel of a display panel to emit light by itself. Thus, the light emitting display device can display an image without a backlight unit that provides light to the display panel.

When a display device is manufactured to have a relatively large size, a defect rate of light emitting elements may increase due to an increase in the number of pixels, and productivity or reliability may be reduced. To address such issues, a tiled display device may be implemented to provide a large screen by connecting a plurality of relatively small display devices. The tiled display device may include a boundary part called a seam between the display devices due to a non-display area or a bezel area of each of the display devices adjacent to each other. When one image is displayed on the entire screen, the boundary part between the display areas gives a sense of separation to the entire screen, thereby reducing the degree of immersion in the image.

The above information disclosed in this Background section is only for enhancement of understanding of the background and therefore the information discussed in this Background section does not necessarily constitute prior art.

SUMMARY

Aspects of some example embodiments of the present disclosure may include a display device which may prevent or reduce damage to a thin-film transistor layer during an etching process by preventing or reducing defects in an etching stopper and a tiled display device including the display device.

Aspects of some example embodiments of the present disclosure may also include a tiled display device which can eliminate or reduce a sense of separation between a plurality of display devices and improve the degree of immersion in images by preventing or reducing user perception of a boundary part or a non-display area between the display devices.

However, aspects of embodiments according to the present disclosure are not restricted to the characteristics set forth herein. The above and other aspects of embodiments according to the present disclosure will become more apparent to one of ordinary skill in the art to which the present disclosure pertains by referencing the detailed description of embodiments according to the present disclosure given below.

According to some example embodiments of the present disclosure, a display device comprises: a substrate comprising a first contact hole, a thin-film transistor layer on a one surface of the substrate and comprising a plurality of insulating layers and a thin-film transistor, an etching stopper on some of the insulating layers and contacting the substrate through a second contact hole surrounding the first contact hole in a plan view, a connection line on the etching stopper, and a pad part on the other surface opposite the one surface of the substrate and connected to the connection line through the first contact hole.

According to some example embodiments, the insulating layers may comprise: a gate insulating layer on the substrate, an interlayer insulating film on the gate insulating layer, and a passivation layer on the interlayer insulating film. The etching stopper may be on the interlayer insulating film.

According to some example embodiments, the display device may further comprise a light emitting element layer on the thin-film transistor layer and having a light emitting element connected to the thin-film transistor. The thin-film transistor layer may further comprise a connection electrode on the interlayer insulating film and connected between a first electrode of the thin-film transistor and the light emitting element.

According to some example embodiments, the first contact hole may additionally pass through the gate insulating layer, the interlayer insulating film, and the etching stopper.

According to some example embodiments, a part of the etching stopper inserted into the second contact hole may surround the pad part at a distance.

According to some example embodiments of the present disclosure, a display device comprises: a substrate comprising a first contact hole, a thin-film transistor layer on a one surface of the substrate and comprising a plurality of insulating layers and a thin-film transistor, an etching stopper on some of the insulating layers and contacting the substrate through a second contact hole surrounding the first contact hole in a plan view, and a pad part on the other surface opposite the one surface of the substrate and connected to the etching stopper through the first contact hole.

According to some example embodiments, the insulating layers may comprise: a gate insulating layer on the substrate, an interlayer insulating film on the gate insulating layer, and a passivation layer on the interlayer insulating film. The etching stopper may be on the interlayer insulating film.

According to some example embodiments, the first contact hole may additionally pass through the gate insulating layer and the interlayer insulating film.

According to some example embodiments, the insulating layers may comprise: a gate insulating layer on the substrate, an interlayer insulating film on the gate insulating layer, and a passivation layer on the interlayer insulating film. The etching stopper may be on the gate insulating layer.

According to some example embodiments, the first contact hole may additionally pass through the gate insulating layer.

According to some example embodiments, the display device may further comprise: a flexible film on the other surface of the substrate and connected to the pad part, and a source driver on the flexible film.

According to some example embodiments of the present disclosure, a display device comprises: a substrate comprising a first contact hole, a thin-film transistor layer on a one surface of the substrate and comprising a plurality of insulating layers and a thin-film transistor, a filling part on the one surface of the substrate and surrounded by some of the insulating layers, an etching stopper on the filling part and contacting the substrate through a second contact hole between the filling part and the some of the insulating layers, and a pad part on the other surface opposite the one surface of the substrate and connected to the etching stopper through the first contact hole.

According to some example embodiments, the insulating layers may comprise: a gate insulating layer on the substrate, an interlayer insulating film on the gate insulating layer, and a passivation layer on the interlayer insulating film. The etching stopper may be on the interlayer insulating film.

According to some example embodiments, a part of the etching stopper inserted into the second contact hole may surround the filling part and may be surrounded by the gate insulating layer and the interlayer insulating film.

According to some example embodiments, the insulating layers may comprise: a gate insulating layer on the substrate, an interlayer insulating film on the gate insulating layer, and a passivation layer on the interlayer insulating film. The etching stopper may be on the gate insulating layer.

According to some example embodiments, a part of the etching stopper inserted into the second contact hole may surround the filling part and may be surrounded by the gate insulating layer.

According to some example embodiments of the present disclosure, a display device comprises: a substrate comprising a first contact hole, a sacrificial layer on a one surface of the substrate, an etching stopper on the sacrificial layer and contacting the substrate through a second contact hole surrounding the first contact hole in a plan view, at least one insulating layer on the etching stopper and having a third contact hole, a connection line on the at least one insulating layer and inserted into the third contact hole, and a pad part on the other surface opposite the one surface of the substrate and connected to the connection line through the first contact hole.

According to some example embodiments, thermal conductivity of the sacrificial layer may be higher than thermal conductivity of the substrate.

According to some example embodiments, the sacrificial layer may comprise at least one inorganic layer.

According to some example embodiments of the present disclosure, a tiled display device comprises: a plurality of display devices, each comprising a display area having a plurality of pixels and a non-display area surrounding the display area, and a coupling member coupling the display devices together. Each of the display devices may comprise: a substrate comprising a first contact hole, a thin-film transistor layer on a one surface of the substrate and comprising a plurality of insulating layers and a thin-film transistor, an etching stopper on some of the insulating layers and contacting the substrate through a second contact hole surrounding the first contact hole in a plan view, and a pad part on the other surface opposite the one surface of the substrate and connected to the etching stopper through the first contact hole.

BRIEF DESCRIPTION OF THE DRAWINGS

These and/or other aspects will become more apparent and more readily appreciated from the following description of the embodiments, taken in conjunction with the accompanying drawings in which.

DETAILED DESCRIPTION

Figure 1:
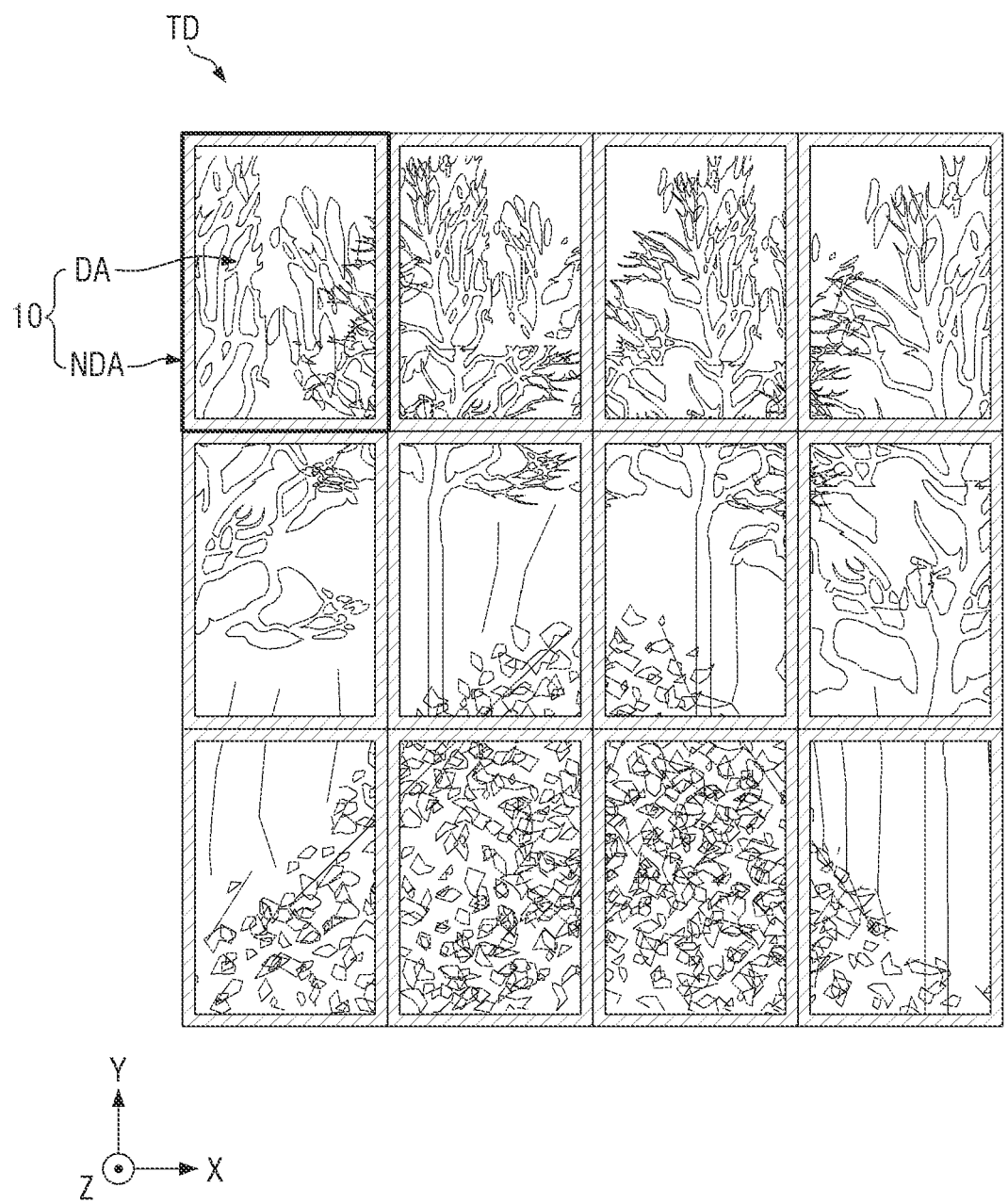
FIG. 1 is a plan view of a tiled display device according to some example embodiments.

In the following description, for the purposes of explanation, numerous example details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics according to some example embodiments may be used or implemented in other embodiments without departing from the inventive concepts.

Unless otherwise specified, the illustrated embodiments are to be understood as providing example features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of a tiled display device TD according to some example embodiments.

Referring to FIG. 1, the tiled display device TD may include a plurality of display devices 10. The display devices 10 may be arranged in a lattice shape, but embodiments according to the present disclosure are not limited thereto. The display devices 10 may be connected to each other in a first direction (X-axis direction) and a second direction (Y-axis direction), and the tiled display device TD may have a specific shape. For example, the display devices 10 may have the same size, but embodiments according to the present disclosure are not limited thereto. For another example, the display devices 10 may have different sizes.

Each of the display devices 10 may be shaped like a rectangle including long sides and short sides. The long sides or short sides of the display devices 10 may be connected to each other. Some of the display devices 10 may be located at an edge of the tiled display device TD to form a side of the tiled display device TD. Some other ones of the display devices 10 may be located at corners of the tiled display device TD and may form two adjacent sides of the tiled display device TD. The other ones of the display devices 10 may be located inside the tiled display device TD and surrounded by other display devices 10.

Each of the display devices 10 may include a display area DA and a non-display area NDA. The display area DA may include a plurality of pixels to display an image. The non-display area NDA may be arranged around the display area DA to surround the display area DA and may not display an image.

The overall shape of the tiled display device TD may be a planar shape, but embodiments according to the present disclosure are not limited thereto. The tiled display device TD may also have a three-dimensional (3D) shape to provide a 3D effect to a user. For example, when the tiled display device TD has a 3D shape, at least some of the display devices 10 may have a curved shape. For another example, the display devices 10 may each have a planar shape but may be connected to each other at an angle (e.g., a set or predetermined angle) so that the tiled display device TD can have a 3D shape.

The tiled display device TD may be formed by connecting the respective non-display areas NDA of adjacent display devices 10. The display devices 10 may be connected to each other through a coupling member or an adhesive member. Therefore, the non-display area NDA between the display devices 10 may be surrounded by adjacent display areas DA. A distance between the respective display areas DA of the display devices 10 may be small enough to make the non-display area NDA between the display devices 10 or a boundary part between the display devices 10 unrecognizable by a user. In addition, external light reflectance of the display area DA of each of the display devices 10 and external light reflectance of the non-display area NDA between the display devices 10 may be substantially equal. Therefore, the tiled display device TD may eliminate a sense of separation between the display devices 10 and improve the degree of immersion in images by preventing or reducing the visibility or perception of the non-display area NDA or the boundary part between the display devices 10.

Figure 2:
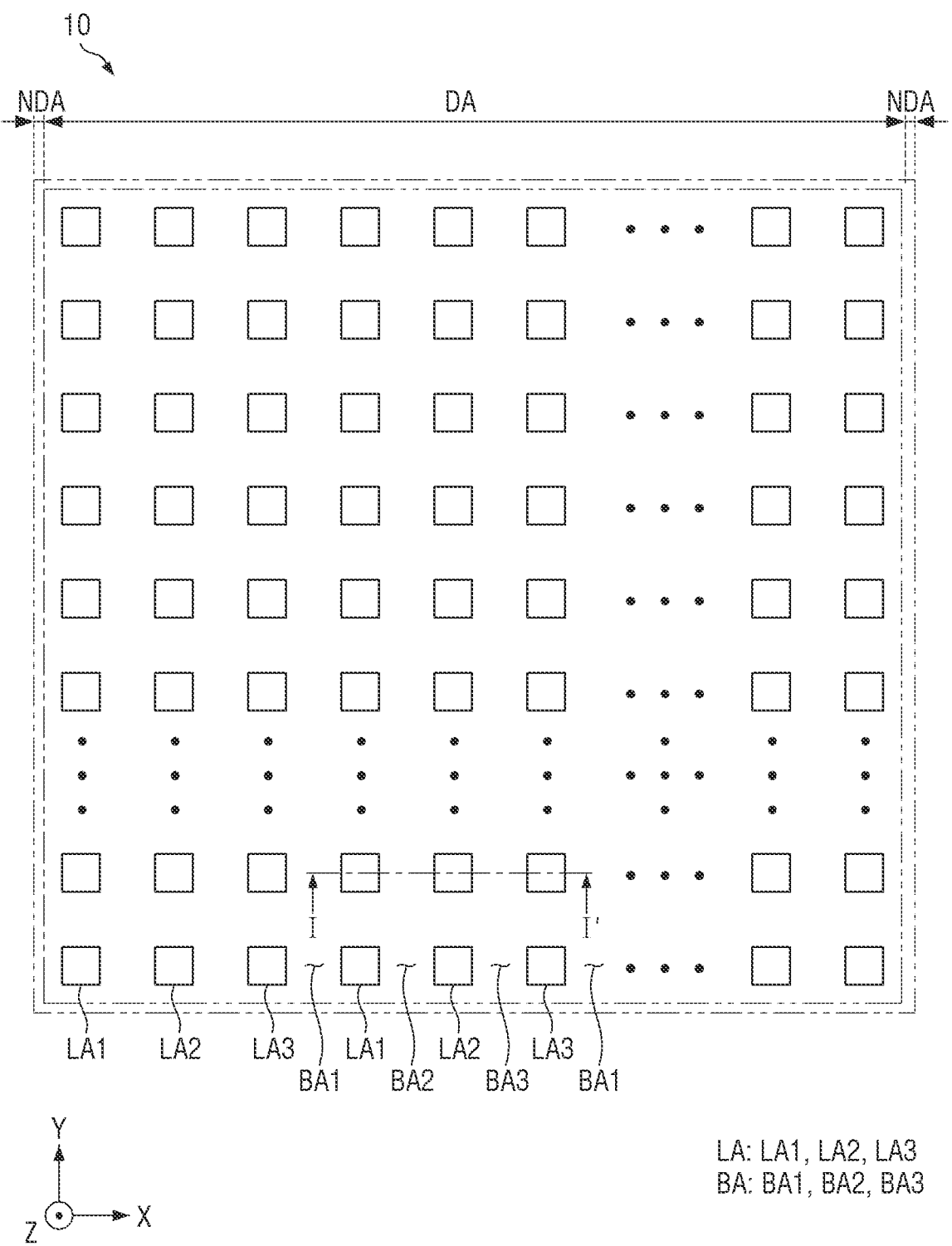
FIG. 2 is a plan view of a display device according to some example embodiments.

FIG. 2 is a plan view of a display device 10 according to some example embodiments.

Referring to FIG. 2, the display device 10 may include a plurality of pixels arranged along a plurality of rows and a plurality of columns in the display area DA. Each of the pixels may include a light emitting area LA defined by a pixel defining layer or a bank and may emit light having a peak wavelength (e.g., a set or predetermined peak wavelength) through the light emitting area LA. For example, the display area DA of the display device 10 may include first through third light emitting areas LA1 through LA3. Each of the first through third light emitting areas LA1 through LA3 may be an area where light generated by a light emitting element of the display device 10 is emitted to the outside of the display device 10.

Each of the first through third light emitting areas LA1 through LA3 may emit light having a peak wavelength (e.g., a set or predetermined peak wavelength) to the outside of the display device 10. The first light emitting area LA1 may emit light of a first color, the second light emitting area LA2 may emit light of a second color, and the third light emitting area LA3 may emit light of a third color. For example, the light of the first color may be red light having a peak wavelength of 610 to 650 nm, the light of the second color may be green light having a peak wavelength of 510 to 550 nm, and the light of the third color may be blue light having a peak wavelength of 440 to 480 nm. However, embodiments according to the present disclosure are not limited thereto.

The first through third light emitting areas LA1 through LA3 may be sequentially and repeatedly arranged along the first direction (X-axis direction) of the display area DA. For example, the area of the first light emitting area LA1 may be larger than the area of the second light emitting area LA2, and the area of the second light emitting area LA2 may be larger than the area of the third light emitting area LA3. For another example, the area of the first light emitting area LA1, the area of the second light emitting area LA2, and the area of the third light emitting area LA3 may be substantially equal.

The display area DA of the display device 10 may include a plurality of light blocking areas BA surrounding the light emitting areas LA. For example, the display area DA may include first through third light blocking areas BA1 through BA3. The first through third light blocking areas BA1 through BA3 may be located on respective sides of the first through third light emitting areas LA1 through LA3, respectively, and may prevent or reduce color mixing of light emitted from the first through third light emitting areas LA1 through LA3.

Figure 3:
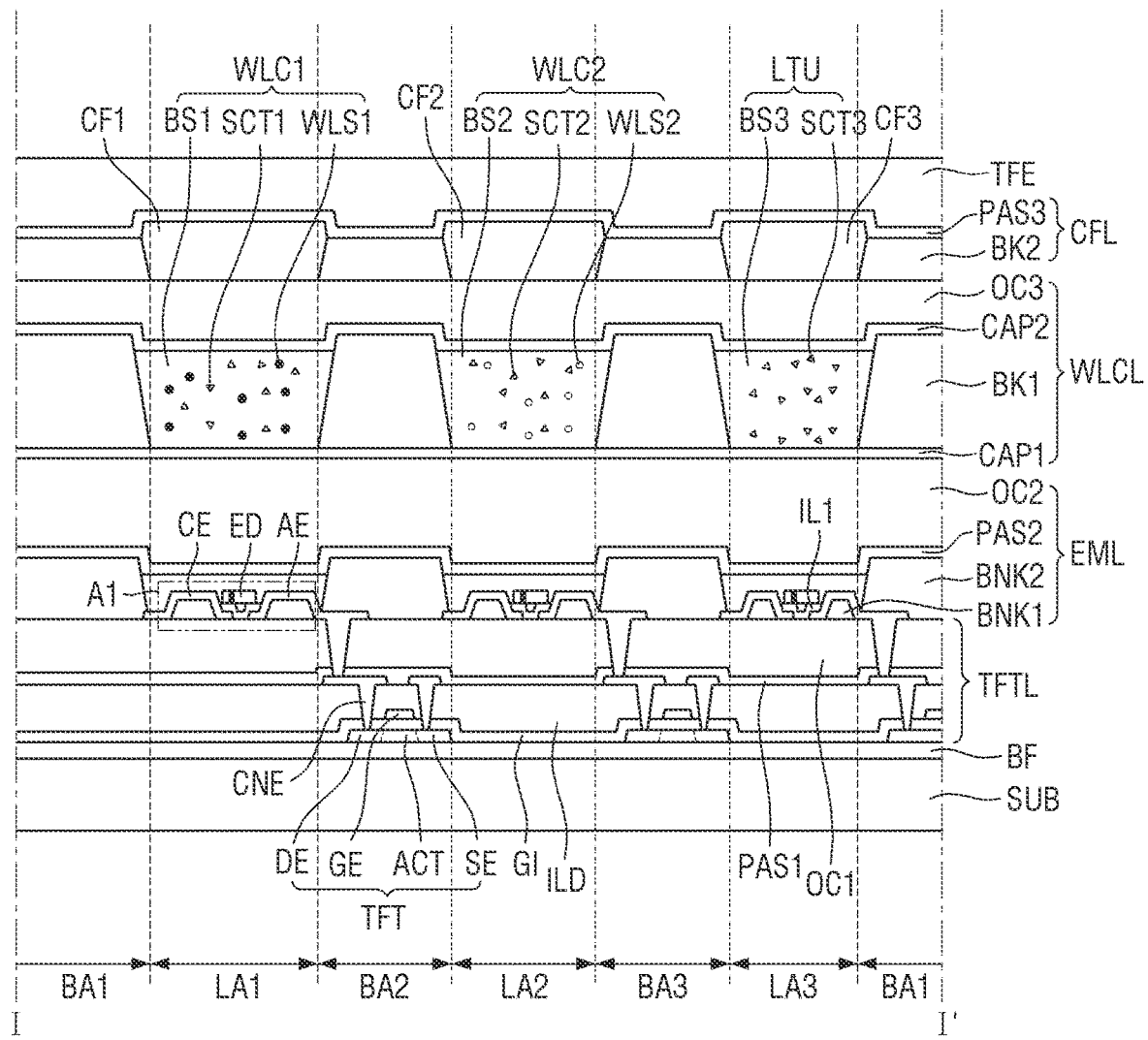
FIG. 3 is a cross-sectional view taken along the line I-I' of FIG. 2.

FIG. 3 is a cross-sectional view taken along the line I-I' of FIG. 2.

Referring to FIG. 3, the display area DA of the display device 10 may include the first through third light emitting areas LA1 through LA3. Each of the first through third light emitting areas LA1 through LA3 may be an area where light generated by a light emitting diode ED of the display device 10 is emitted to the outside of the display device 10.

The display device 10 may include a substrate SUB, a buffer layer BF, a thin-film transistor layer TFTL, a light emitting element layer EML, a wavelength conversion layer WLCL, a color filter layer CFL, and an encapsulation layer TFE.

The substrate SUB may be a base substrate or a base member and may be made of an insulating material such as polymer resin. For example, the substrate SUB may be a rigid substrate. When the substrate SUB is a rigid substrate, it may include, but is not limited to, a glass material or a metal material. For another example, the substrate SUB may be a flexible substrate that can be bent, folded, rolled, etc. When the substrate SUB is a flexible substrate, it may include, but is not limited to, polyimide (PI).

The buffer layer BF may be located on the substrate SUB. The buffer layer BF may be an inorganic layer that can prevent or reduce the introduction of air or moisture or other contaminants. For example, the buffer layer BF may include a plurality of inorganic layers stacked alternately.

The thin-film transistor layer TFTL may include thin-film transistors TFT, a gate insulating layer GI, an interlayer insulating film ILD, connection electrodes CNE, a first passivation layer PAS1, and a first planarization layer OC1.

The thin-film transistors TFT may be located on the buffer layer BF and may form respective pixel circuits of a plurality of pixels. For example, the thin-film transistors TFT may be driving transistors or switching transistors of the pixel circuits. Each of the thin-film transistors TFT may include a semiconductor region ACT, a gate electrode GE, a source electrode SE, and a drain electrode DE.

The semiconductor region ACT, the source electrode SE, and the drain electrode DE may be located on the buffer layer BF. The semiconductor region ACT may be overlapped by the gate electrode GE in a thickness direction and insulated from the gate electrode GE by the gate insulating layer GI. The source electrode SE and the drain electrode DE may be formed by making the material of the semiconductor region ACT conductive.

The gate electrode GE may be located on the gate insulating layer GI. The gate electrode GE may overlap the semiconductor region ACT with the gate insulating layer GI interposed between them.

The gate insulating layer GI may be provided on the semiconductor regions ACT, the source electrodes SE, and the drain electrodes DE. For example, the gate insulating layer GI may cover the semiconductor regions ACT, the source electrodes SE, the drain electrodes DE and the buffer layer BF and insulate the semiconductor regions ACT from the gate electrodes GE. The gate insulating layer GI may include contact holes through which the connection electrodes CNE pass.

The interlayer insulating film ILD may be located on the gate electrodes GE. For example, the interlayer insulating film ILD may include contact holes through which the connection electrodes CNE pass. Here, the contact holes of the interlayer insulating film ILD may be connected to the contact holes of the gate insulating layer GI.

The connection electrodes CNE may be located on the interlayer insulating film ILD. The connection electrodes CNE may connect the drain electrodes DE of the thin-film transistors TFT and first electrodes AE of light emitting elements EL. The connection electrodes CNE may contact the drain electrodes DE through the contact holes provided in the gate insulating layer GI and the interlayer insulating film ILD.

The first passivation layer PAS1 may be provided on the connection electrodes CNE to protect the thin-film transistors TFT. For example, the first passivation layer PAS1 may include contact holes through which the first electrodes AE of the light emitting elements EL pass.

The first planarization layer OC1 may be provided on the first passivation layer PAS1 to planarize the top of the thin-film transistor layer TFTL. For example, the first planarization layer OC1 may include contact holes through which the first electrodes AE of the light emitting elements EL pass. Here, the contact holes of the first planarization layer OC1 may be connected to the contact holes of the first passivation layer PAS1.

The light emitting element layer EML may include the light emitting elements EL, first banks BNK1, a second bank BNK2, a second passivation layer PAS2, and a second planarization layer OC2.

The light emitting elements EL may be provided on the thin-film transistors TFT. Each of the light emitting elements EL may include the first electrode AE, a second electrode CE, and the light emitting diode ED.

The first electrode AE may be provided on the first planarization layer OC1. For example, the first electrode AE may be located on a first bank BNK1 located on the first planarization layer OC1 to cover the first bank BNK1. The first electrode AE may overlap one of the first through third light emitting areas LA1 through LA3 defined by the second bank BNK2. In addition, the first electrode AE may be connected to the drain electrode DE of each thin-film transistor TFT. The first electrode AE may be, but is not limited to, an anode of each light emitting element EL.

The second electrode CE may be located on the first planarization layer OC1 and spaced apart from the first electrode AE. For example, the second electrode CE may be located on a first bank BNK1 located on the first planarization layer OC1 to cover the first bank BNK1. The second electrode CE may overlap one of the first through third light emitting areas LA1 through LA3 defined by the second bank BNK2. For example, the second electrode CE may receive a common voltage supplied to all pixels. The second electrode CE may be, but is not limited to, a cathode of each light emitting element EL.

A first insulating layer IL1 may cover a part of the first electrode AE and a part of the second electrode CE adjacent to the first electrode AE and insulate the first electrode AE and the second electrode CE from each other.

The light emitting diode ED may be located on the first planarization layer OC1 between the first electrode AE and the second electrode CE. The light emitting diode ED may be located on the first insulating layer IL1. An end of the light emitting diode ED may be connected to the first electrode AE, and the other end of the light emitting diode ED may be connected to the second electrode CE. For example, a plurality of light emitting diodes ED may include active layers having the same material to emit light of the same wavelength band or light of the same color. Light emitted from the first through third light emitting areas LA1 through LA3 may have the same color. For example, the light emitting diodes ED may emit light of the third color or blue light having a peak wavelength of 440 to 480 nm. Therefore, the light emitting element layer EML may emit light of the third color or blue light.

The second bank BNK2 may be located on the first planarization layer OC1 to define the first through third light emitting areas LA1 through LA3. For example, the second bank BNK2 may surround each of the first through third light emitting areas LA1 through LA3, but embodiments according to the present disclosure are not limited thereto. The second bank BNK2 may separate and insulate the respective first electrodes AE or second electrodes CE of the light emitting elements EL. The second bank BNK2 may be located in the first through third light blocking areas BA1 through BA3.

The second passivation layer PAS2 may be located on the light emitting elements EL and the second bank BNK2. The second passivation layer PAS2 may cover the light emitting elements EL and protect the light emitting elements EL. The second passivation layer PAS2 may prevent or reduce damage to the light emitting elements EL by preventing or reducing the permeation of impurities such as moisture or air from the outside.

The second planarization layer OC2 may be provided on the second passivation layer PAS2 to planarize the top of the light emitting element layer EML. For example, the second planarization layer OC2 may include an organic material.

The wavelength conversion layer WLCL may include a first capping layer CAP1, a first light blocking member BK1, a first wavelength converting part WLC1, a second wavelength converting part WLC2, a light transmitting part LTU, a second capping layer CAP2, and a third planarization layer OC3.

The first capping layer CAP1 may be located on the second planarization layer OC2 of the light emitting element layer EML. The first capping layer CAP1 may seal lower surfaces of the first and second wavelength converting parts WLC1 and WLC2 and the light transmitting part LTU. For example, the first capping layer CAP1 may include an inorganic material.

The first light blocking member BK1 may be located on the first capping layer CAP1 in the first through third light blocking areas BA1 through BA3. The first light blocking member BK1 may overlap the second bank BNK2 in the thickness direction. The first light blocking member BK1 may block transmission of light. The first light blocking member BK1 may prevent or reduce color mixing by preventing or reducing intrusion of light between the first through third light emitting areas LA1 through LA3, thereby improving a color gamut. The first light blocking member BK1 may be located in a lattice shape surrounding the first through third light emitting areas LA1 through LA3 in a plan view.

The first light blocking member BK1 may include an organic light blocking material and a liquid repellent component. For example, the first light blocking member BK1 may be made of a black organic material including a liquid repellent component. The first light blocking member BK1 may be formed by coating and exposing an organic light blocking material including a liquid repellent component.

The first wavelength converting part WLC1 may be located on the first capping layer CAP1 in the first light emitting area LA1. The first wavelength converting part WLC1 may be surrounded by the first light blocking member BK1. The first wavelength converting part WLC1 may include a first base resin BS1, first scatterers SCT1, and first wavelength shifters WLS1.

The first base resin BS1 may include a material having a relatively high light transmittance. The first base resin BS1 may be made of a transparent organic material. For example, the first base resin BS1 may include at least one of organic materials such as epoxy resin, acrylic resin, cardo resin, or imide resin.

The first scatterers SCT1 may have a refractive index different from that of the first base resin BS1 and may form an optical interface with the first base resin BS1. For example, the first scatterers SCT1 may include a light scattering material or light scattering particles that scatter at least a part of transmitted light. For example, the first scatterers SCT1 may include metal oxide such as titanium oxide ($TiO_2$), zirconium oxide ($ZrO_2$), aluminum oxide ($Al_2O_3$), indium oxide ($In_2O_3$), zinc oxide (ZnO) or tin oxide ($SnO_2$) or may include organic particles such as acrylic resin or urethane resin. The first scatterers SCT1 may scatter incident light in random directions regardless of an incident direction of the incident light without substantially converting a peak wavelength of the incident light.

The first wavelength shifters WLS1 may convert or shift a peak wavelength of incident light into a first peak wavelength. For example, the first wavelength shifters WLS1 may convert blue light provided by the display device 10 into red light having a single peak wavelength of 610 to 650 nm and emit the red light. The first wavelength shifters WLS1 may be quantum dots, quantum rods, or phosphors. The quantum dots may be particulate materials that emit light of a specific color when electrons transition from a conduction band to a valence band.

A part of blue light provided by the light emitting element layer EML may be transmitted through the first wavelength converting part WLC1 without being converted into red light by the first wavelength shifters WLS1. Of the blue light provided by the light emitting element layer EML, light incident on a first color filter CF1 without being converted by the first wavelength converting part WLC1 may be blocked by the first color filter CF1. In addition, red light into which the blue light provided by the light emitting element layer EML has been converted by the first wavelength converting part WLC1 may be emitted to the outside through the first color filter CF1. Therefore, the first light emitting area LA1 may emit red light.

The second wavelength converting part WLC2 may be located on the first capping layer CAP1 in the second light emitting area LA2. The second wavelength converting part WLC2 may be surrounded by the first light blocking member BK1. The second wavelength converting part WLC2 may include a second base resin BS2, second scatterers SCT2, and second wavelength shifters WLS2.

The second base resin BS2 may include a material having a relatively high light transmittance. The second base resin BS2 may be made of a transparent organic material. For example, the second base resin BS2 may be made of the same material as the first base resin BS1 or may be formed using the example materials described with respect to the first base resin BS1.

The second scatterers SCT2 may have a refractive index different from that of the second base resin BS2 and may form an optical interface with the second base resin BS2. For example, the second scatterers SCT2 may include a light scattering material or light scattering particles that scatter at least a part of transmitted light. For example, the second scatterers SCT2 may be made of the same material as the first scatterers SCT1 or may be formed using the example materials described with respect to the first scatterers SCT1. The second scatterers SCT2 may scatter incident light in random directions regardless of an incident direction of the incident light without substantially converting a peak wavelength of the incident light.

The second wavelength shifters WLS2 may convert or shift a peak wavelength of incident light into a second peak wavelength different from the first peak wavelength of the first wavelength shifters WLS1. For example, the second wavelength shifters WLS2 may convert blue light provided by the display device 10 into green light having a single peak wavelength of 510 to 550 nm and emit the green light. The second wavelength shifters WLS2 may be quantum dots, quantum rods, or phosphors. The second wavelength shifters WLS2 may include a material having the same purpose as the example materials described with respect to the first wavelength shifters WLS1. The second wavelength shifters WLS2 may be made of quantum dots, quantum rods, or phosphors such that their wavelength conversion range is different from the wavelength conversion range of the first wavelength shifters WLS1.

The light transmitting part LTU may be located on the first capping layer CAP1 in the third light emitting area LA3. The light transmitting part LTU may be surrounded by the first light blocking member BK1. The light transmitting part LTU may transmit incident light while maintaining a peak wavelength of the incident light. The light transmitting part LTU may include a third base resin BS3 and third scatterers SCT3.

The third base resin BS3 may include a material having a relatively high light transmittance. The third base resin BS3 may be made of a transparent organic material. For example, the third base resin BS3 may be made of the same material as the first or second base resin BS1 or BS2 or may be formed using the example materials described with respect to the first or second base resin BS1 or BS2.

The third scatterers SCT3 may have a refractive index different from that of the third base resin BS3 and may form an optical interface with the third base resin BS3. For example, the third scatterers SCT3 may include a light scattering material or light scattering particles that scatter at least a part of transmitted light. For example, the third scatterers SCT3 may be made of the same material as the first or second scatterers SCT1 or SCT2 or may be formed using the example materials described with respect to the first or second scatterers SCT1 or SCT2. The third scatterer SCT3 may scatter incident light in random directions regardless of an incident direction of the incident light without substantially converting a peak wavelength of the incident light.

Because the wavelength conversion layer WLCL is directly located on the second planarization layer OC2 of the light emitting element layer EML, the display device 10 may not require a separate substrate for the first and second wavelength converting parts WLC1 and WLC2 and the light transmitting part LTU. Therefore, the first and second wavelength converting parts WLC1 and WLC2 and the light transmitting part LTU can be easily aligned in the first through third light emitting areas LA1 through LA3, respectively, and the thickness of the display device 10 can be relatively reduced.

The second capping layer CAP2 may cover the first and second wavelength converting parts WLC1 and WLC2, the light transmitting part LTU, and the first light blocking member BK1. For example, the second capping layer CAP2 may prevent or reduce damage to or contamination of the first and second wavelength converting parts WLC1 and WLC2 and the light transmitting part LTU by sealing the first and second wavelength converting parts WLC1 and WLC2 and the light transmitting part LTU. For example, the second capping layer CAP2 may include an inorganic material.

The third planarization layer OC3 may be located on the second capping layer CAP2 to planarize upper ends of the first and second wavelength converting parts WLC1 and WLC2 and the light transmitting part LTU. For example, the third planarization layer OC3 may include an organic material.

The color filter layer CFL may include a second light blocking member BK2, first through third color filters CF1 through CF3, and a third passivation layer PAS3.

The second light blocking member BK2 may be located on the wavelength conversion layer WLCL and the third planarization layer OC3 in the first through third light blocking areas BA1 through BA3. The second light blocking member BK2 may overlap the first light blocking member BK1 or the second bank BNK2 in the thickness direction. The second light blocking member BK2 may block transmission of light. The second light blocking member BK2 may prevent or reduce color mixing by preventing or reducing intrusion of light between the first through third light emitting areas LA1 through LA3, thereby improving the color gamut. The second light blocking member BK2 may be arranged in a lattice shape surrounding the first through third light emitting areas LA1 through LA3 in a plan view.

The first color filter CF1 may be located on the third planarization layer OC3 in the first light emitting area LA1. The first color filter CF1 may be surrounded by the second light blocking member BK2. The first color filter CF1 may overlap the first wavelength converting part WLC1 in the thickness direction. The first color filter CF1 may selectively transmit light of the first color (e.g., red light) and block or absorb light of the second color (e.g., green light) and light of the third color (e.g., blue light). For example, the first color filter CF1 may be a red color filter and may include a red colorant.

The second color filter CF2 may be located on the third planarization layer OC3 in the second light emitting area LA2. The second color filter CF2 may be surrounded by the second light blocking member BK2. The second color filter CF2 may overlap the second wavelength converting part WLC2 in the thickness direction. The second color filter CF2 may selectively transmit light of the second color (e.g., green light) and block or absorb light of the first color (e.g., red light) and light of the third color (e.g., blue light). For example, the second color filter CF2 may be a green color filter and may include a green colorant.

The third color filter CF3 may be located on the third planarization layer OC3 in the third light emitting area LA3. The third color filter CF3 may be surrounded by the second light blocking member BK2. The third color filter CF3 may overlap the light transmitting part LTU in the thickness direction. The third color filter CF3 may selectively transmit light of the third color (e.g., blue light) and block or absorb light of the first color (e.g., red light) and light of the second color (e.g., green light). For example, the third color filter CF3 may be a blue color filter and may include a blue colorant.

The first through third color filters CF1 through CF3 may absorb a part of light introduced from the outside of the display device 10, thereby reducing reflected light due to the external light. Therefore, the first through third color filters CF1 through CF3 may prevent or reduce color distortion due to reflection of external light.

Because the first through third color filters CF1 through CF3 are directly located on the third planarization layer OC3 of the wavelength conversion layer WLCL, the display device 10 may not require a separate substrate for the first through third color filters CF1 through CF3. Therefore, the thickness of the display device 10 can be relatively reduced.

The third passivation layer PAS3 may cover the first through third color filters CF1 through CF3. The third passivation layer PAS3 may protect the first through third color filters CF1 through CF3.

The encapsulation layer TFE may be located on the third passivation layer PAS3 of the color filter layer CFL. The encapsulation layer TFE may cover upper and side surfaces of a display layer. For example, the encapsulation layer TFE may include at least one inorganic layer to prevent or reduce permeation of oxygen or moisture. In addition, the encapsulation layer TFE may include at least one organic layer to protect the display device 10 from foreign substances such as dust.

Figure 4:
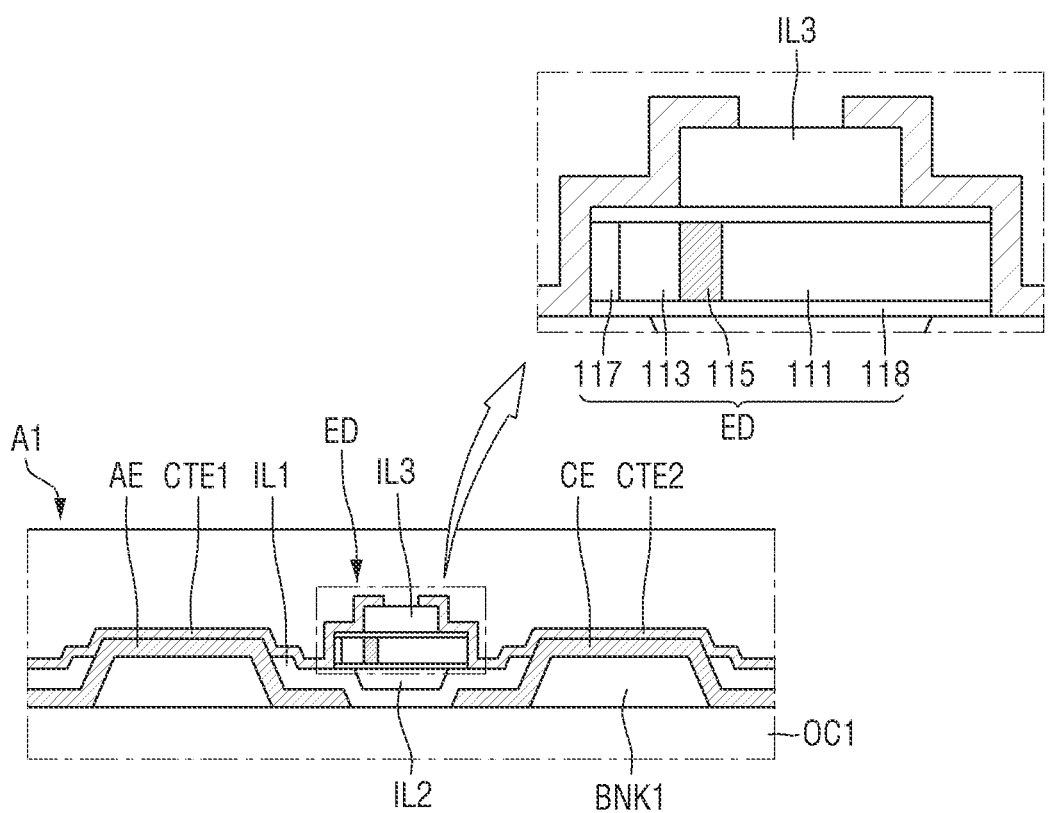
FIG. 4 is an enlarged view of the area A1 of FIG. 3.

FIG. 4 is an enlarged view of area A1 of FIG. 3.

Referring to FIG. 4, the light emitting element layer EML of the display device 10 may be located on the thin-film transistor layer TFTL and may include first through third insulating layers IL1 through IL3.

A plurality of first banks BNK1 may be located in each of the first through third light emitting areas LA1 through LA3. Each of the first banks BNK1 may correspond to the first electrode AE or the second electrode CE. The first banks BNK1 may be located on the first planarization layer OC1, and side surfaces of each of the first banks BNK1 may be inclined from the first planarization layer OC1. The first and second electrodes AE and CE may be located on the corresponding first banks BNK1, respectively. The first banks BNK1 may include, but is not limited to, polyimide (PI).

The first and second electrodes AE and CE may include a transparent conductive material. For example, each of the first and second electrodes AE and CE may include, but is not limited to, at least one of indium tin oxide (ITO), indium zinc oxide (IZO), or indium tin zinc oxide (ITZO).

The first and second electrodes AE and CE may include a conductive material having high reflectivity. For example, the first and second electrodes AE and CE may include a metal having high reflectivity, such as silver (Ag), copper (Cu) or aluminum (Al). The first and second electrodes AE and CE may reflect light incident from the light emitting diode ED to above the display device 10.

The first insulating layer IL1 may be located on the first planarization layer OC1, the first electrode AE, and the second electrode CE. The first insulating layer IL1 may cover a part of each of the first and second electrodes AE and CE. For example, the first insulating layer IL1 may expose parts of the first and second electrodes AE and CE which correspond to upper surfaces of the first banks BNK1 and cover parts of the first and second electrodes AE and CE which do not correspond to the upper surfaces. Therefore, the first insulating layer IL1 may include openings that expose the parts of the first and second electrodes AE and CE which correspond to the upper surfaces of the first banks BNK1.

For example, the first insulating layer IL1 may include an inorganic insulating material and include a recessed step between the first and second electrodes AE and CE. The second insulating layer IL2 may fill the recessed step of the first insulating layer IL1. Therefore, the second insulating layer IL2 may planarize an upper surface of the first insulating layer IL1, and the light emitting diode ED may be located on the first and second insulating layers IL1 and IL2.

The first insulating layer IL1 may protect the first and second electrodes AE and CE and insulate the first and second electrodes AE and CE from each other. The first insulating layer IL1 may prevent or reduce the light emitting diode ED from directly contacting other members and thus being damaged.

The light emitting diode ED may be located on the first and second insulating layers IL1 and IL2 between the first electrode AE and the second electrode CE. An end of the light emitting diode ED may be connected to the first electrode AE, and the other end of the light emitting diode ED may be connected to the second electrode CE. For example, the light emitting diode ED may be connected to the first electrode AE through a first contact electrode CTE1 and may be connected to the second electrode CE through a second contact electrode CTE2.

The light emitting diode ED may be an inorganic light emitting diode having a size of micrometers or nanometers and including an inorganic material. The inorganic light emitting diode may be aligned between two electrodes facing each other according to an electric field formed in a specific direction between the two electrodes.

The light emitting diode ED may include a first semiconductor layer 111, a second semiconductor layer 113, an active layer 115, an electrode layer 117, and an insulating film 118.

The first semiconductor layer 111 may be an n-type semiconductor. For example, when the light emitting diode ED emits blue light, the first semiconductor layer 111 may include a semiconductor material having a chemical formula of $Al_xGa_yIn_{1-x-y}N$ ($0 \le x \le 1$, $0 \le y \le 1$, $0 \le x+y \le 1$). The first semiconductor layer 111 may include at least one semiconductor material selected from n-type doped AlGaInN, GaN, AlGaN, InGaN, AlN, and InN. The first semiconductor layer 111 may be doped with an n-type dopant such as Si, Ge, or Sn. The first semiconductor layer 111 may be n-GaN doped with n-type Si.

The second semiconductor layer 113 may be located on the active layer 115. For example, when the light emitting diode ED emits blue light or green light, the second semiconductor layer 113 may include a semiconductor material having a chemical formula of $Al_xGa_yIn_{1-x-y}N$ ($0 \le x \le 1$, $0 \le y \le 1$, $0 \le x+y \le 1$). For example, the second semiconductor layer 113 may include at least one semiconductor material selected from p-type doped AlGaInN, GaN, AlGaN, InGaN, AlN, and InN. The second semiconductor layer 113 may be doped with a p-type dopant such as Mg, Zn, Ca, Se, or Ba. The second semiconductor layer 113 may be p-GaN doped with p-type Mg.

The active layer 115 may be located between the first and second semiconductor layers 111 and 113. The active layer 115 may include a material having a single or multiple quantum well structure. When the active layer 115 includes a material having a multiple quantum well structure, it may have a structure in which a plurality of quantum layers and a plurality of well layers are alternately stacked. The active layer 115 may emit light through combination of electron-hole pairs according to electrical signals received through the first and second semiconductor layers 111 and 113. For example, when the active layer 115 emits blue light, it may include a material such as AlGaN or AlGaInN. When the active layer 115 has a multiple quantum well structure in which a quantum layer and a well layer are alternately stacked, the quantum layer may include a material such as AlGaN or AlGaInN, and the well layer may include a material such as GaN or AlInN. The active layer 115 may include AlGaInN as a quantum layer and AlInN as a well layer to emit blue light.

The electrode layer 117 may be an ohmic contact electrode. Alternatively, the electrode layer 117 may be a Schottky contact electrode. The light emitting diode ED may include at least one electrode layer 117. When the light emitting diode ED is electrically connected to an electrode or a contact electrode CTE, the electrode layer 117 may reduce the resistance between the light emitting diode ED and the electrode or the contact electrode CTE. The electrode layer 117 may include a conductive metal.

The insulating film 118 may surround outer surfaces of a plurality of semiconductor layers and a plurality of electrode layers. The insulating film 118 may surround an outer surface of the active layer 115 and extend in a direction in which the light emitting diode ED extends. The insulating film 118 may protect the light emitting diode ED. For example, the insulating film 118 may surround side surfaces of the light emitting diode ED and expose both ends of the light emitting diode ED in a longitudinal direction. In addition, the insulating film 118 may protect an outer surface of the light emitting diode ED including the active layer 115, thereby preventing or reducing a reduction in luminous efficiency.

The third insulating layer IL3 may be located on a part of the light emitting diode ED located between the first and second electrodes AE and CE. The third insulating layer IL3 may partially cover the outer surface of the light emitting diode ED. The third insulating layer IL3 may protect the light emitting diode ED.

The contact electrodes CTE may include the first and second contact electrodes CTE1 and CTE2. The first contact electrode CTE1 may cover the first electrode AE and a part of the light emitting diode ED and may electrically connect the first electrode AE and the light emitting diode ED. The second contact electrode CTE2 may cover the second electrode CE and another part of the light emitting diode ED and may electrically connect the second electrode CE and the light emitting diode ED.

The contact electrodes CTE may include a conductive material. For example, the contact electrodes CTE may include, but are not limited to, ITO, IZO, ITZO, or aluminum (Al).

Figure 5:
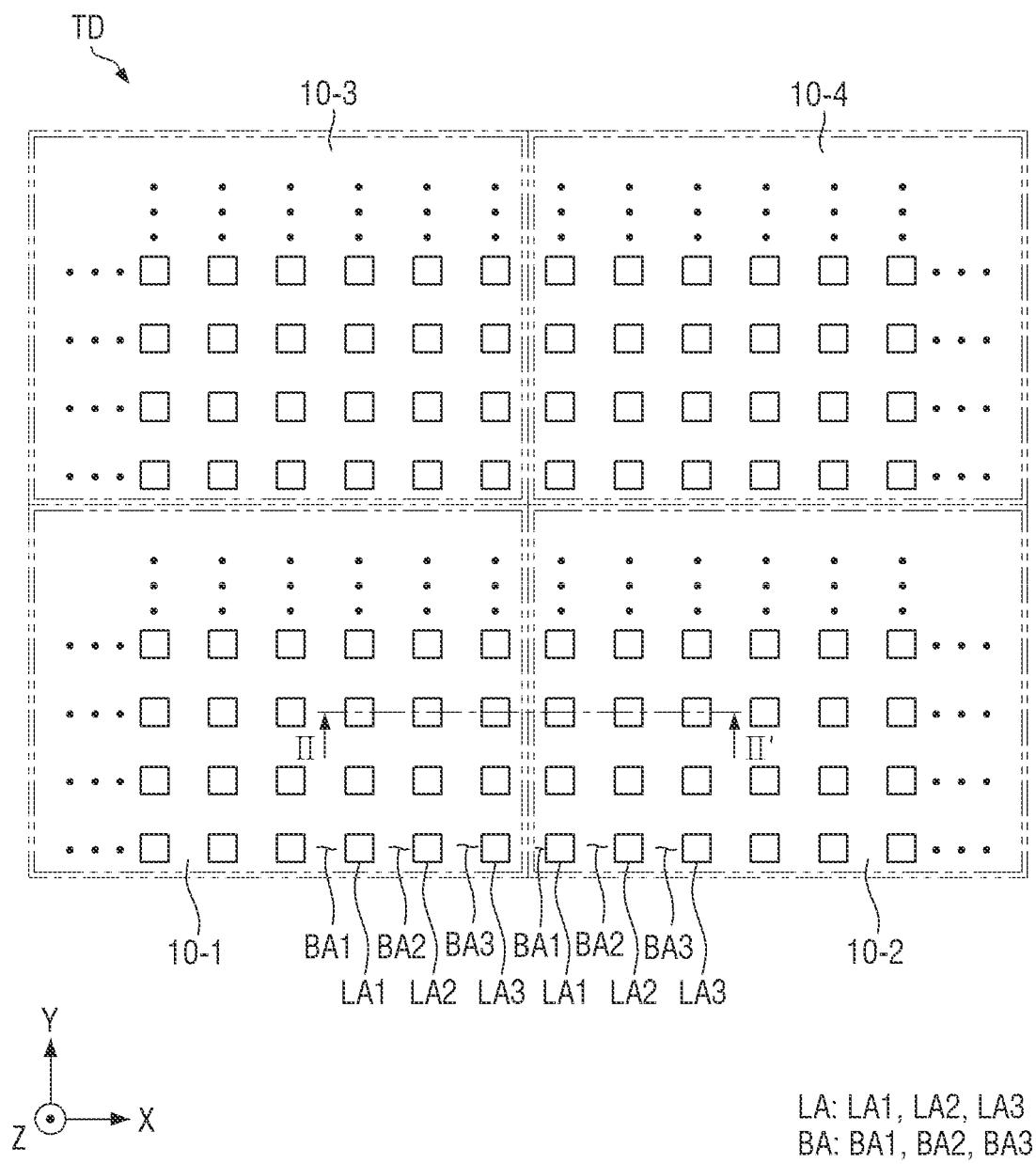
FIG. 5 is a plan view illustrating the coupling structure of a tiled display device according to some example embodiments.
Figure 6:
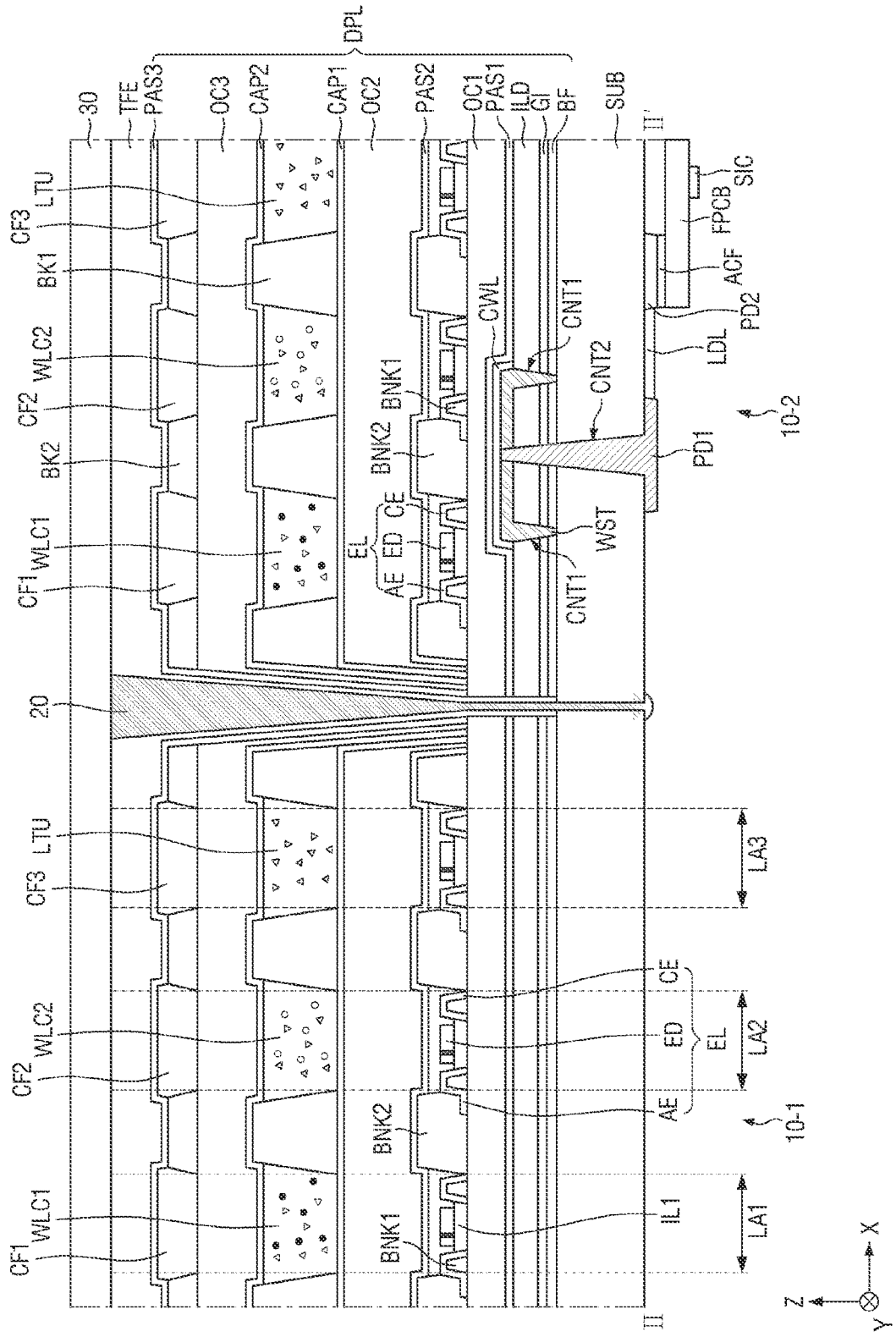
FIG. 6 is a cross-sectional view of an example taken along the line II-II' of FIG. 5.

FIG. 5 is a plan view illustrating the coupling structure of a tiled display device TD according to some example embodiments. FIG. 6 is a cross-sectional view of an example taken along the line II-II' of FIG. 5. A description of the same elements as those described above will be given briefly or omitted.

Referring to FIGS. 5 and 6, the tiled display device TD may include a plurality of display devices 10, a coupling member 20, and a cover member 30. For example, the tiled display device TD may include first through fourth display devices 10-1 through 10-4. However, the number of the display devices 10 is not limited to the embodiments described with respect to FIG. 5. The number of the display devices 10 may be determined by the size of each display device 10 and the size of the tiled display device TD.

Each of the display devices 10 may include a substrate SUB, an etching stopper WST, a connection line CWL, a display layer DPL, an encapsulation layer TFE, a first pad part PD1, a second pad part PD2, a flexible film FPCB, and a source driver SIC.

The substrate SUB may be a base substrate or a base member and may be made of an insulating material such as polymer resin. For example, the substrate SUB may be a rigid substrate. For another example, the substrate SUB may be a flexible substrate that can be bent, folded, rolled, etc.

The etching stopper WST may be located on an interlayer insulating film ILD of a thin-film transistor layer TFTL and may contact the substrate SUB through a first contact hole CNT1. The first contact hole CNT1 may surround a second contact hole CNT2 at a distance in a plan view. The first contact hole CNT1 may pass through the interlayer insulating film ILD, a gate insulating layer GI, and a buffer layer BF. A part of the etching stopper WST may be inserted into the first contact hole CNT1 to surround the first pad part PD1 inserted into the second contact hole CNT2 at a distance. For example, a part of the etching stopper WST which is located on the interlayer insulating film ILD may control an etching depth in a third direction (Z-axis direction) and prevent or reduce the connection line CWL from being damaged during an etching process. The other part of the etching stopper WST which is inserted into the first contact hole CNT1 may control an etching depth in an X-Y plane direction including the first direction (X-axis direction) and the second direction (Y-axis direction). Therefore, the etching stopper WST located on the interlayer insulating film ILD and inserted into the first contact hole CNT1 can prevent or reduce instances of the thin-film transistor layer TFTL being damaged during the etching process.

For example, the etching stopper WST may include, but is not limited to, at least one of molybdenum (Mo), aluminum (Al), chromium (Cr), tungsten (W), gold (Au), titanium (Ti), nickel (Ni), neodymium (Nd), or copper (Cu).

The connection line CWL may be located on the etching stopper WST. The connection line CWL may be connected to the first pad part PD1 inserted into the second contact hole CNT2. The connection line CWL may supply an electrical signal received from the first pad part PD1 to the thin-film transistor layer TFTL. The connection line CWL may be connected to a plurality of data lines to supply data voltages and may be connected to a plurality of scan lines to supply scan signals. The connection line CWL may be formed on the same layer and of the same material as connection electrodes CNE of the thin-film transistor layer TFTL, but embodiments according to the present disclosure are not limited thereto.

For example, the connection line CWL may have, but is not limited to, a stacked structure (Ti/Al/Ti) of aluminum and titanium or a stacked structure (Al/Cu) of aluminum and copper.

The display layer DPL may be located on the substrate SUB. The display layer DPL may include the buffer layer BF, the thin-film transistor layer TFTL, a light emitting element layer EML, a wavelength conversion layer WLCL, and a color filter layer CFL illustrated in FIG. 3. The elements described above in FIG. 3 will not be described below.

The substrate SUB may include the second contact hole CNT2. For example, the second contact hole CNT2 may pass through the substrate SUB from a lower surface to an upper surface of the substrate SUB. The second contact hole CNT2 may overlap a display area DA. The first pad part PD1 inserted into the second contact hole CNT2 may be located in the display area DA. Therefore, each display device 10 may not include a separate pad part located at an outermost position, and a bezel area or a dead space of each display device 10 can be minimized. Because the first pad part PD1 is located on a lower surface of each display device 10, a gap between the display devices 10 can be further reduced compared with when a pad part is located at an outermost position on a substrate or when a flexible film is located on a side surface of the substrate.

The second contact hole CNT2 may additionally pass through the buffer layer BF, the gate insulating layer GI, the interlayer insulating film ILD, and the etching stopper WST. The second contact hole CNT2 may be formed by performing a wet etching process or a dry etching process on the lower surface of the substrate SUB after the display layer DPL and the encapsulation layer TFE are stacked on the upper surface of the substrate SUB. For example, the substrate SUB, the buffer layer BF, the gate insulating layer GI, and the interlayer insulating film ILD may be etched through a wet etching process, and the etching stopper WST may be etched through a dry etching process, but embodiments according to the present disclosure are not limited thereto.

The first pad part PD1 may be located on the lower surface of the substrate SUB and may be connected to the connection line CWL exposed through the second contact hole CNT2.

The second pad part PD2 may be located on the lower surface of the substrate SUB and spaced apart from the first pad part PD1. The second pad part PD2 may be connected to the first pad part PD1 through a lead line LDL. The second pad part PD2 may receive various voltages or signals from the flexible film FPCB and supply the voltages or signals to the first pad part PD1 and the connection line CWL.

A connection film ACF may attach the flexible film FPCB to the second pad part PD2. A surface of the connection film ACF may be attached to the second pad part PD2, and the other surface of the connection film ACF may be attached to the flexible film FPCB. For example, the connection film ACF may cover the entire second pad part PD2, but embodiments according to the present disclosure are not limited thereto.

The connection film ACF may include an anisotropic conductive film. When the connection film ACF includes an anisotropic conductive film, it may have conductivity in an area where the second pad part PD2 and a contact pad of the flexible film FPCB contact each other and may electrically connect the flexible film FPCB to the second pad part PD2.

The flexible film FPCB may be located on the lower surface of the substrate SUB. A side of the flexible film FPCB may be connected to the second pad part PD2, and the other side of the flexible film FPCB may be connected to a source circuit board on the lower surface of the substrate SUB. The flexible film FPCB may transmit signals of the source driver SIC to the display device 10. For example, the source driver SIC may be an integrated circuit. The source driver SIC may convert digital video data into analog data voltages based on a source control signal of a timing controller and supply the analog data voltages to the data lines of the display area DA through the flexible film FPCB.

The tiled display device TD may be formed by coupling side surfaces of adjacent display devices 10 to each other using the coupling member 20 located between the display devices 10. The coupling member 20 may connect side surfaces of the first through fourth display devices 10-1 through 10-4 arranged in a lattice shape, thereby realizing the tiled display device TD. The coupling member 20 may couple side surfaces of the respective substrates SUB and encapsulation layers TFE of adjacent display devices 10.

For example, the coupling member 20 may be made of an adhesive or double-sided tape having a relatively small thickness to minimize the gap between the display devices 10. For another example, the coupling member 20 may be made of a coupling frame having a relatively small thickness to minimize the gap between the display devices 10. Therefore, the tiled display device TD may prevent or reduce non-display areas NDA or a boundary part between the display devices 10 from being recognized by a user.

The cover member 30 may be located on upper surfaces of the display devices 10 and the coupling member 20 to cover the display devices 10 and the coupling member 20. For example, the cover member 30 may be located on an upper surface of the encapsulation layer TFE of each of the display devices 10. The cover member 30 may protect an upper surface of the tiled display device TD.

FIGS. 7 through 11 are cross-sectional views illustrating a process of manufacturing a display device 10 of FIG. 6.

Figure 7:
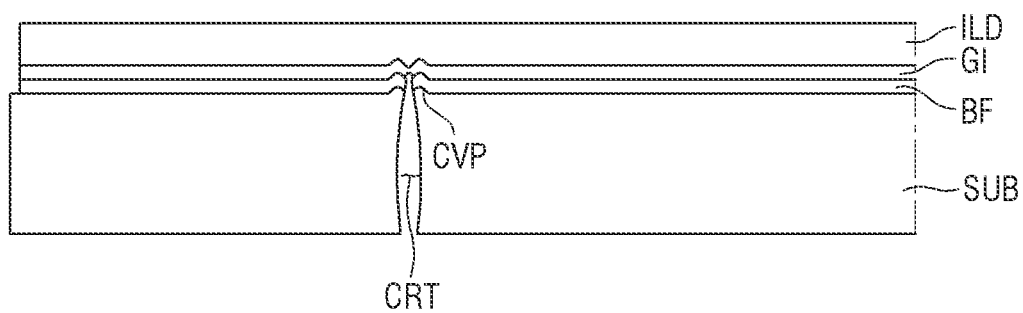
FIGS. 7 through 11 are cross-sectional views illustrating a process of manufacturing a display device of FIG. 6 according to some example embodiments.

In FIG. 7, a laser may be irradiated to a lower surface of a substrate SUB before a buffer layer BF is stacked on the substrate SUB. A part of the substrate SUB exposed to the laser may be deformed by excessive heat. For example, a part of the substrate SUB may be melted by the heat of the laser, and a crater CRT and convex parts CVP may be formed at a point where the heat of the laser is concentrated. The sizes and shapes of the crater CRT and the convex parts CVP are not limited to those illustrated in FIG. 7.

The buffer layer BF, a gate insulating layer GI, and an interlayer insulating film ILD may be sequentially stacked on the substrate SUB. At least some of the buffer layer BF, the gate insulating layer GI, and the interlayer insulating film ILD may be split by the convex parts CVP and the crater CRT of the substrate SUB.

The sum of thicknesses (lengths in the Z-axis direction) of the buffer layer BF, the gate insulating layer GI, and the interlayer insulating film ILD may be equal to or greater than twice a width (a length in the X-axis direction) of the crater CRT. For example, when the width of the crater CRT is 4,000 Å, the sum of the thicknesses of the buffer layer BF, the gate insulating layer GI, and the interlayer insulating film ILD may be, but is not limited to, 8,000 Å or more. Because a plurality of insulating layers are stacked to a thickness equal to or greater than twice the width of the crater CRT in the display device 10, splitting of the top of the insulating layers can be prevented or reduced.

Figure 8:
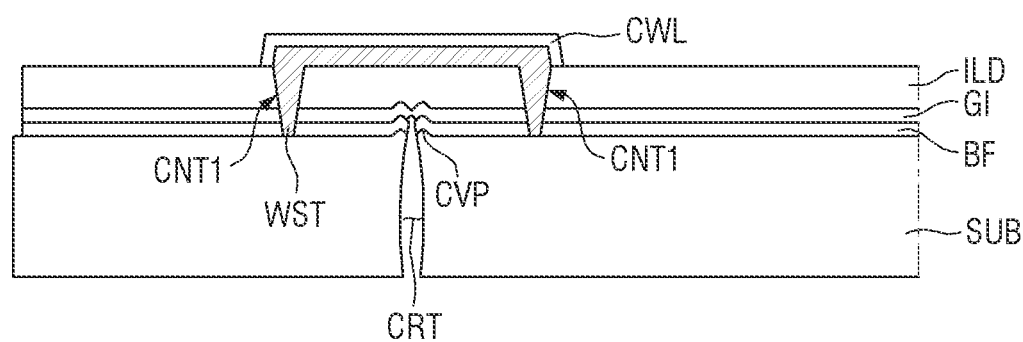

In FIG. 8, an etching stopper WST may be located on the interlayer insulating film ILD and may contact the substrate SUB through a first contact hole CNT1. Because the display device 10 includes the buffer layer BF, the gate insulating layer GI, and the interlayer insulating film ILD stacked to a thickness (e.g., a set or predetermined thickness), it can prevent or reduce instances of the etching stopper WST being split on the interlayer insulating film ILD. By preventing or reducing defects in the etching stopper WST, the display device 10 can prevent or reduce damage to a connection line CWL or a thin-film transistor layer TFTL during an etching process.

The first contact hole CNT1 may surround the crater CRT at a distance in a plan view. The first contact hole CNT1 may be formed to pass through the interlayer insulating film ILD, the gate insulating layer GI, and the buffer layer BF. A part of the etching stopper WST may be inserted into the first contact hole CNT1 to surround the crater CRT at a distance.

The connection line CWL may be located on the etching stopper WST. For example, the connection line CWL may cover the full surface of the etching stopper WST, but embodiments according to the present disclosure are not limited thereto.

Figure 9:
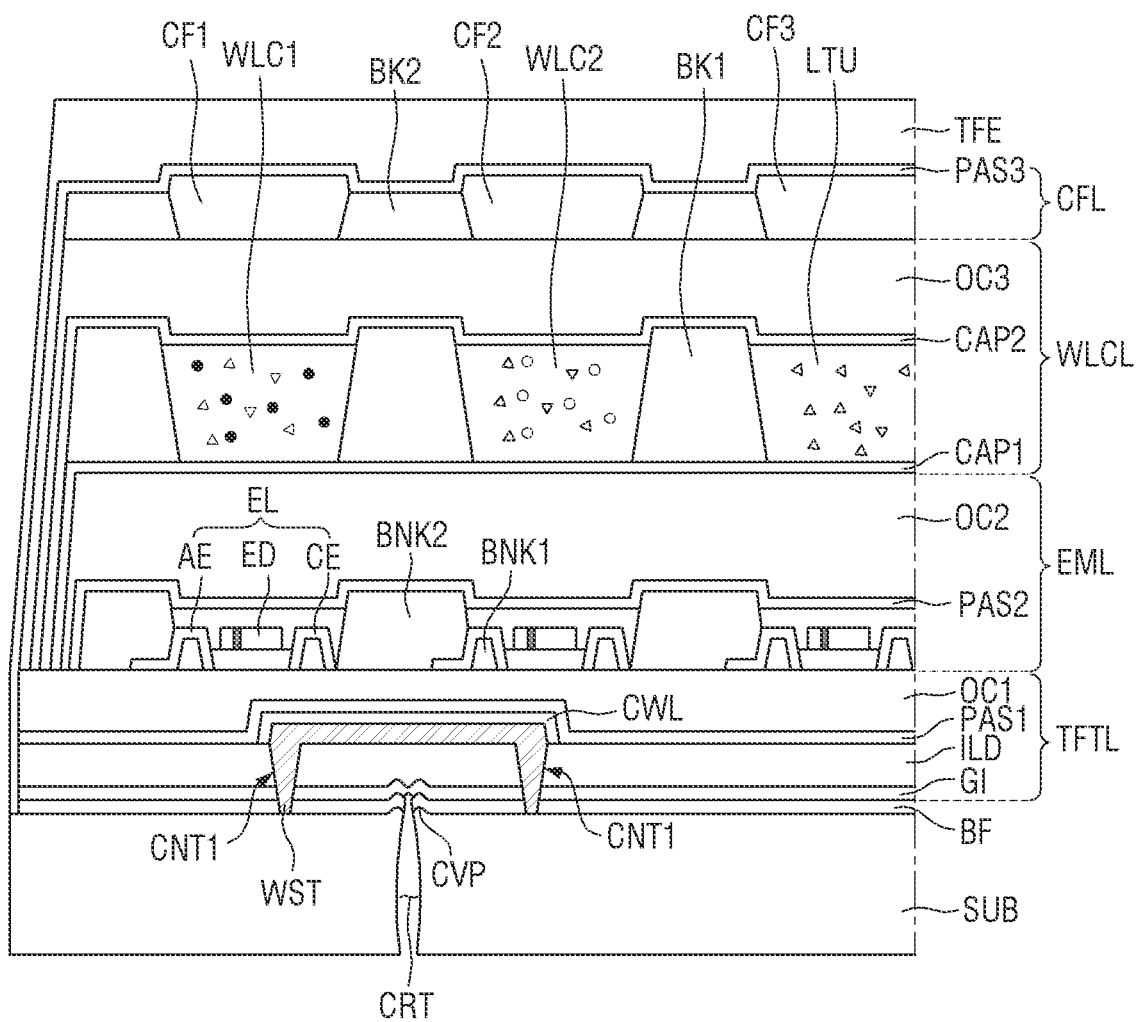

In FIG. 9, a first passivation layer PAS1 may cover the connection line CWL and the interlayer insulating film ILD, and a first planarization layer OC1 may cover the first passivation layer PAS1.

A light emitting element layer EML, a wavelength conversion layer WLCL, a color filter layer CFL, and an encapsulation layer TFE may be sequentially stacked on the thin-film transistor layer TFTL.

Figure 10:
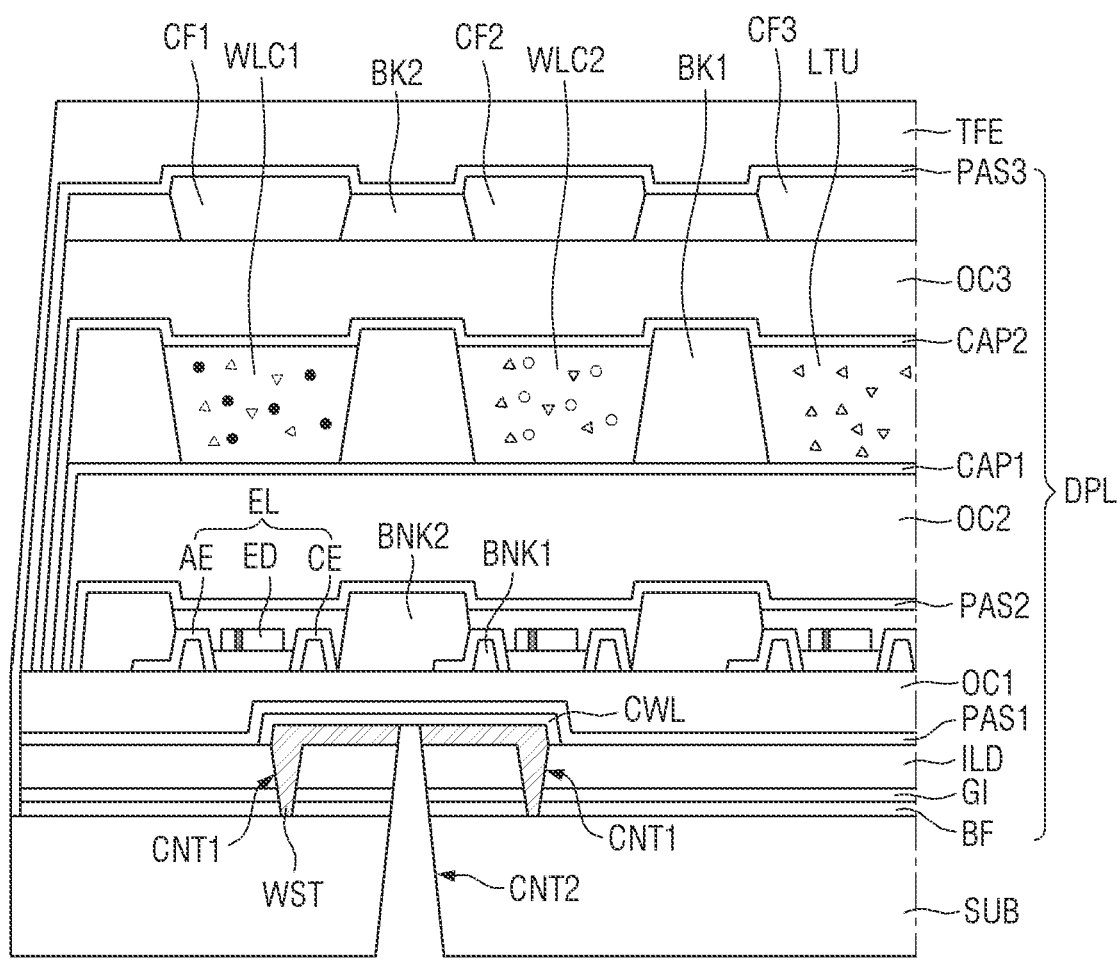

In FIG. 10, a second contact hole CNT2 may pass through the substrate SUB, the buffer layer BF, the gate insulating layer GI, the interlayer insulating film ILD, and the etching stopper WST from the lower surface of the substrate SUB.

A part of the etching stopper WST, which is located on the interlayer insulating film ILD may control an etching depth in the third direction (Z-axis direction) and prevent or reduce damage to the connection line CWL during an etching process. The other part of the etching stopper WST which is inserted into the first contact hole CNT1 may control an etching depth in the X-Y plane direction including the first direction (X-axis direction) and the second direction (Y-axis direction). Therefore, the etching stopper WST located on the interlayer insulating film ILD and inserted into the first contact hole CNT1 can prevent or reduce damage to the thin-film transistor layer TFTL during the etching process.

For example, the substrate SUB, the buffer layer BF, the gate insulating layer GI, and the interlayer insulating film ILD may be primarily etched through a wet etching process, and the etching stopper WST may be secondarily etched through a dry etching process. However, embodiments according to the present disclosure are not limited thereto.

Figure 11:
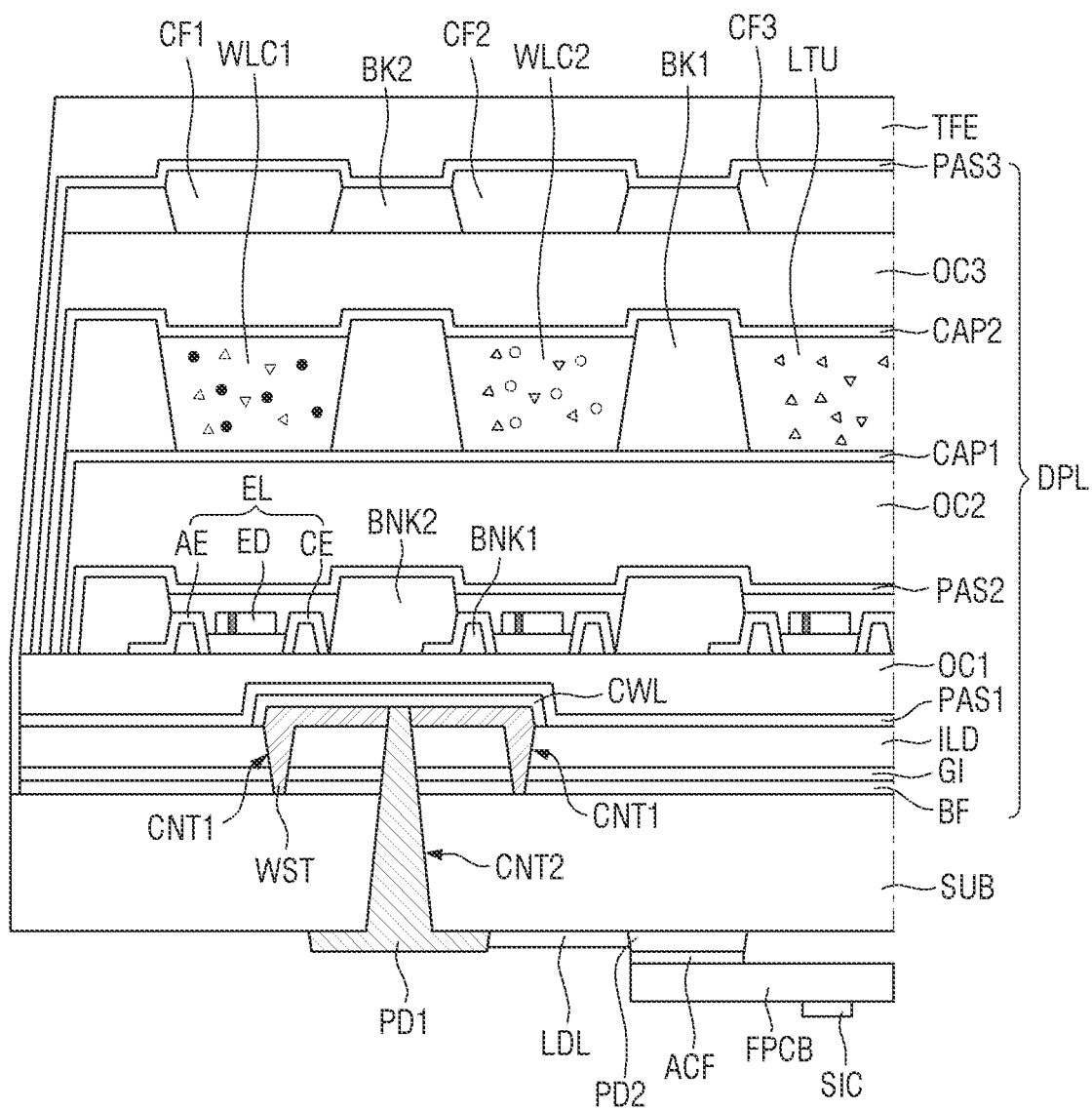

In FIG. 11, a first pad part PD1 may be located on the lower surface of the substrate SUB and connected to the connection line CWL exposed through the second contact hole CNT2.

A second pad part PD2 may be located on the lower surface of the substrate SUB and spaced apart from the first pad part PD1. The second pad part PD2 may be connected to the first pad part PD1 through a lead line LDL. The second pad part PD2 may receive various voltages or signals from a flexible film FPCB and supply the voltages or signals to the first pad part PD1 and the connection line CWL.

The flexible film FPCB may be located on the lower surface of the substrate SUB. A side of the flexible film FPCB may be connected to the second pad part PD2, and the other side of the flexible film FPCB may be connected to a source circuit board on the lower surface of the substrate SUB. The flexible film FPCB may transmit signals of a source driver SIC to the display device 10.

Figure 12:
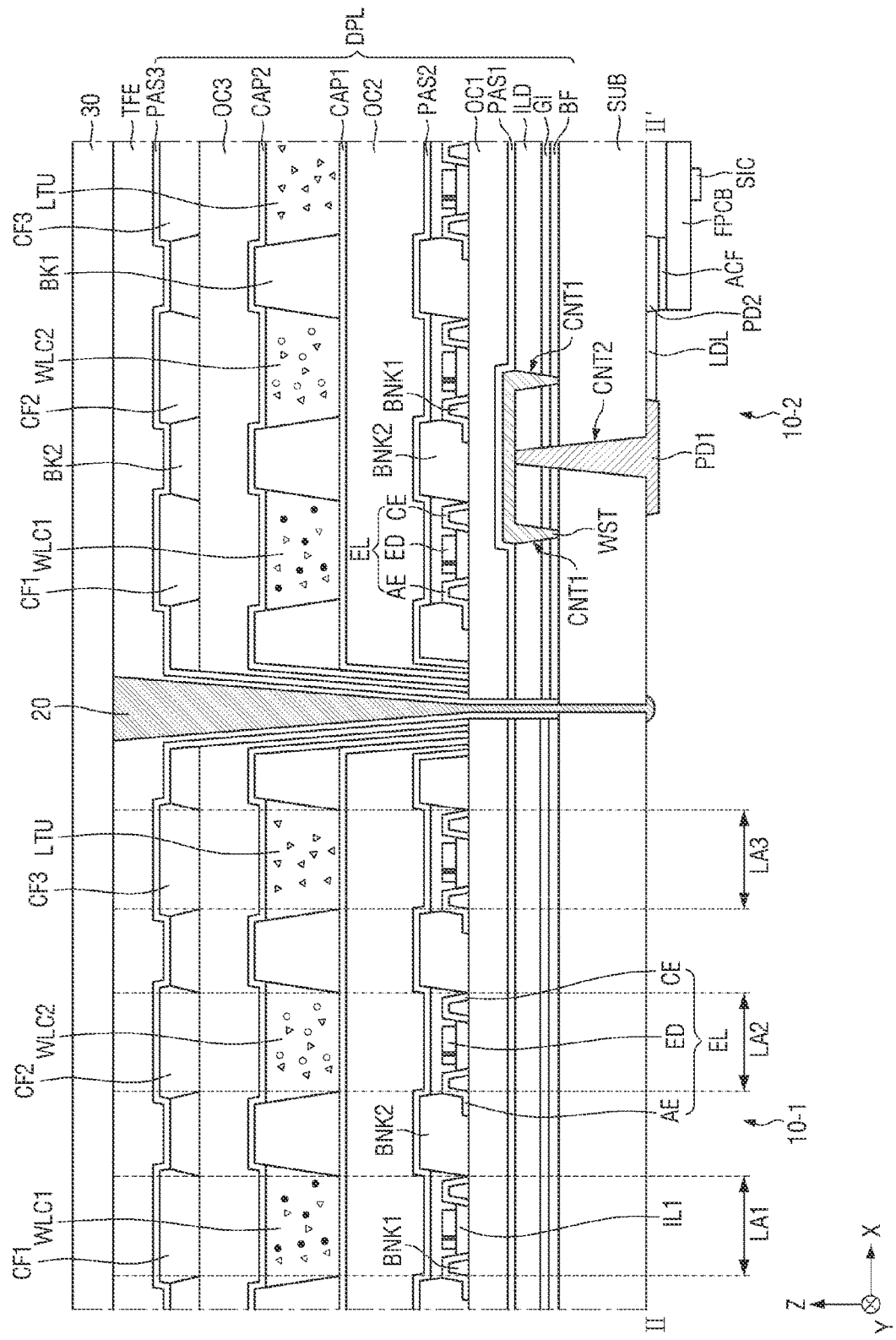
FIG. 12 is a cross-sectional view of an example taken along the line II-II' of FIG. 5.

FIG. 12 is a cross-sectional view of an example taken along the line II-II' of FIG. 5. A tiled display device TD of FIG. 12 is the same as the tiled display device TD of FIG. 6 except for the configuration of an etching stopper WST. Therefore, a description of the same elements as those described above will be given briefly or omitted.

Referring to FIG. 12, the tiled display device TD may include a plurality of display devices 10, a coupling member 20, and a cover member 30.

Each of the display devices 10 may include a substrate SUB, the etching stopper WST, a display layer DPL, an encapsulation layer TFE, a first pad part PD1, a second pad part PD2, a flexible film FPCB, and a source driver SIC.

The substrate SUB may be a base substrate or a base member and may be made of an insulating material such as polymer resin. For example, the substrate SUB may be a rigid substrate. For another example, the substrate SUB may be a flexible substrate that can be bent, folded, rolled, etc.

The etching stopper WST may be located on an interlayer insulating film ILD of a thin-film transistor layer TFTL and may contact the substrate SUB through a first contact hole CNT1. The first contact hole CNT1 may surround a second contact hole CNT2 at a distance in a plan view. The first contact hole CNT1 may pass through the interlayer insulating film ILD, a gate insulating layer GI, and a buffer layer BF. A part of the etching stopper WST may be inserted into the first contact hole CNT1 to surround the first pad part PD1 inserted into the second contact hole CNT2 at a distance. For example, a part of the etching stopper WST, which is located on the interlayer insulating film ILD may control an etching depth in the third direction (Z-axis direction), and the other part of the etching stopper WST which is inserted into the first contact hole CNT1 may control an etching depth in the X-Y plane direction including the first direction (X-axis direction) and the second direction (Y-axis direction). Therefore, the etching stopper WST located on the interlayer insulating film ILD and inserted into the first contact hole CNT1 can prevent or reduce damage to the thin-film transistor layer TFTL during an etching process.

For example, the etching stopper WST may include, but is not limited to, at least one of molybdenum (Mo), aluminum (Al), chromium (Cr), tungsten (W), gold (Au), titanium (Ti), nickel (Ni), neodymium (Nd), or copper (Cu).

The etching stopper WST may be connected to the first pad part PD1 inserted into the second contact hole CNT2. The etching stopper WST may supply an electrical signal received from the first pad part PD1 to the thin-film transistor layer TFTL. The etching stopper WST may be connected to a plurality of data lines to supply data voltages and may be connected to a plurality of scan lines to supply scan signals. The etching stopper WST may be formed on the same layer and of the same material as connection electrodes CNE of the thin-film transistor layer TFTL, but embodiments according to the present disclosure are not limited thereto.

The display layer DPL may be located on the substrate SUB. The display layer DPL may include the buffer layer BF, the thin-film transistor layer TFTL, a light emitting element layer EML, a wavelength conversion layer WLCL, and a color filter layer CFL illustrated in FIG. 3. The elements described above in FIG. 3 will not be described below.

The substrate SUB may include the second contact hole CNT2. For example, the second contact hole CNT2 may pass through the substrate SUB from a lower surface to an upper surface of the substrate SUB. The second contact hole CNT2 may overlap a display area DA. The first pad part PD1 inserted into the second contact hole CNT2 may be located in the display area DA. Therefore, each display device 10 may not include a separate pad part located at an outermost position, and a bezel area or a dead space of each display device 10 can be minimized. Because the first pad part PD1 is located on a lower surface of each display device 10, a gap between the display devices 10 can be further reduced compared with when a pad part is located at an outermost position on a substrate or when a flexible film is located on a side surface of the substrate.

The second contact hole CNT2 may additionally pass through the buffer layer BF, the gate insulting layer GI, and the interlayer insulating film ILD. The second contact hole CNT2 may be formed by performing a wet etching process or a dry etching process on the lower surface of the substrate SUB after the display layer DPL and the encapsulation layer TFE are stacked on the upper surface of the substrate SUB. For example, the substrate SUB, the buffer layer BF, the gate insulting layer GI, and the interlayer insulating film ILD may be etched through a wet etching process, but embodiments according to the present disclosure are not limited thereto.

The first pad part PD1 may be located on the lower surface of the substrate SUB and may be connected to the etching stopper WST exposed through the second contact hole CNT2.

FIGS. 13 through 16 are cross-sectional views illustrating a process of manufacturing a display device 10 of FIG. 12. The display device manufacturing process of FIG. 13 may be a process following the display device manufacturing process of FIG. 7.

Figure 13:
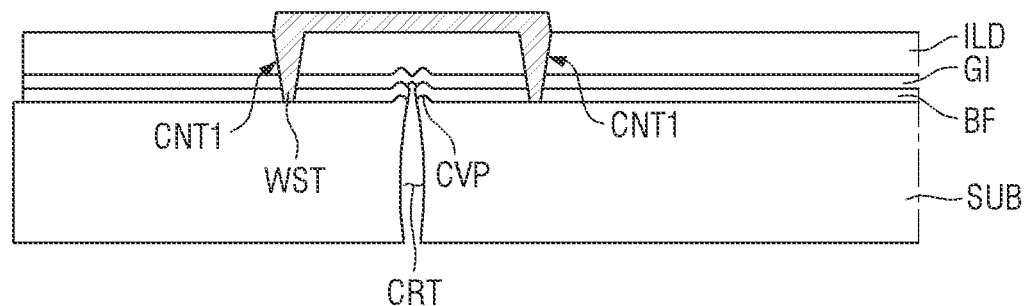
FIGS. 13 through 16 are cross-sectional views illustrating a process of manufacturing a display device of FIG. 12 according to some example embodiments.

In FIG. 13, an etching stopper WST may be located on an interlayer insulating film ILD and may contact a substrate SUB through a first contact hole CNT1. Because the display device 10 includes a buffer layer BF, a gate insulating layer GI, and the interlayer insulating film ILD stacked to a thickness (e.g., a set or predetermined thickness), it can prevent or reduce splitting of the etching stopper WST on the interlayer insulating film ILD. By preventing or reducing defects in the etching stopper WST, the display device 10 can prevent or reduce damage to a thin-film transistor layer TFTL during an etching process.

The first contact hole CNT1 may surround a crater CRT at a distance in a plan view. The first contact hole CNT1 may be formed to pass through the interlayer insulating film ILD, the gate insulating layer GI, and the buffer layer BF. A part of the etching stopper WST may be inserted into the first contact hole CNT1 to surround the crater CRT at a distance.

Figure 14:
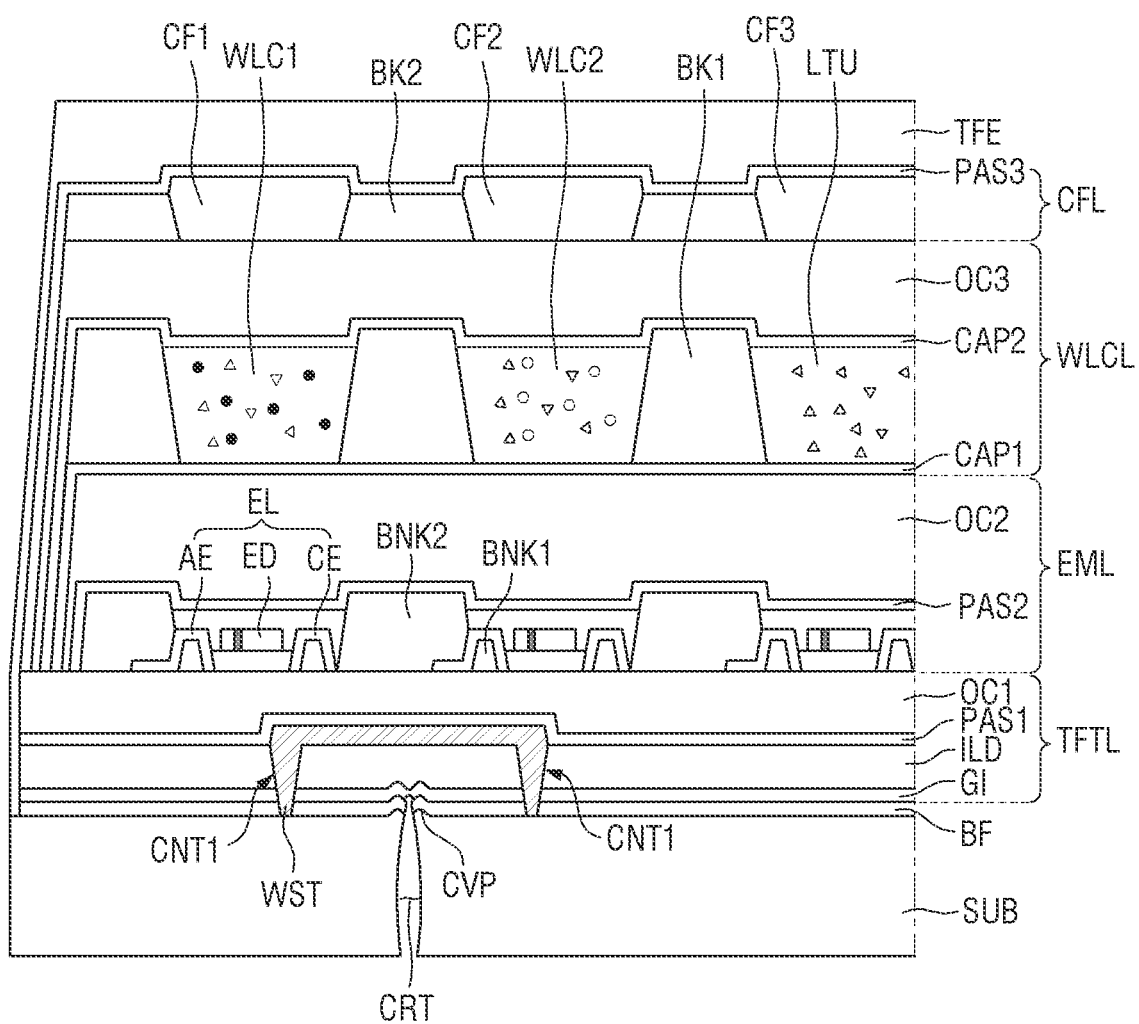

In FIG. 14, a first passivation layer PAS1 may cover the etching stopper WST and the interlayer insulating film ILD, and a first planarization layer OC1 may cover the first passivation layer PAS1.

A light emitting element layer EML, a wavelength conversion layer WLCL, a color filter layer CFL, and an encapsulation layer TFE may be sequentially stacked on the thin-film transistor layer TFTL.

Figure 15:
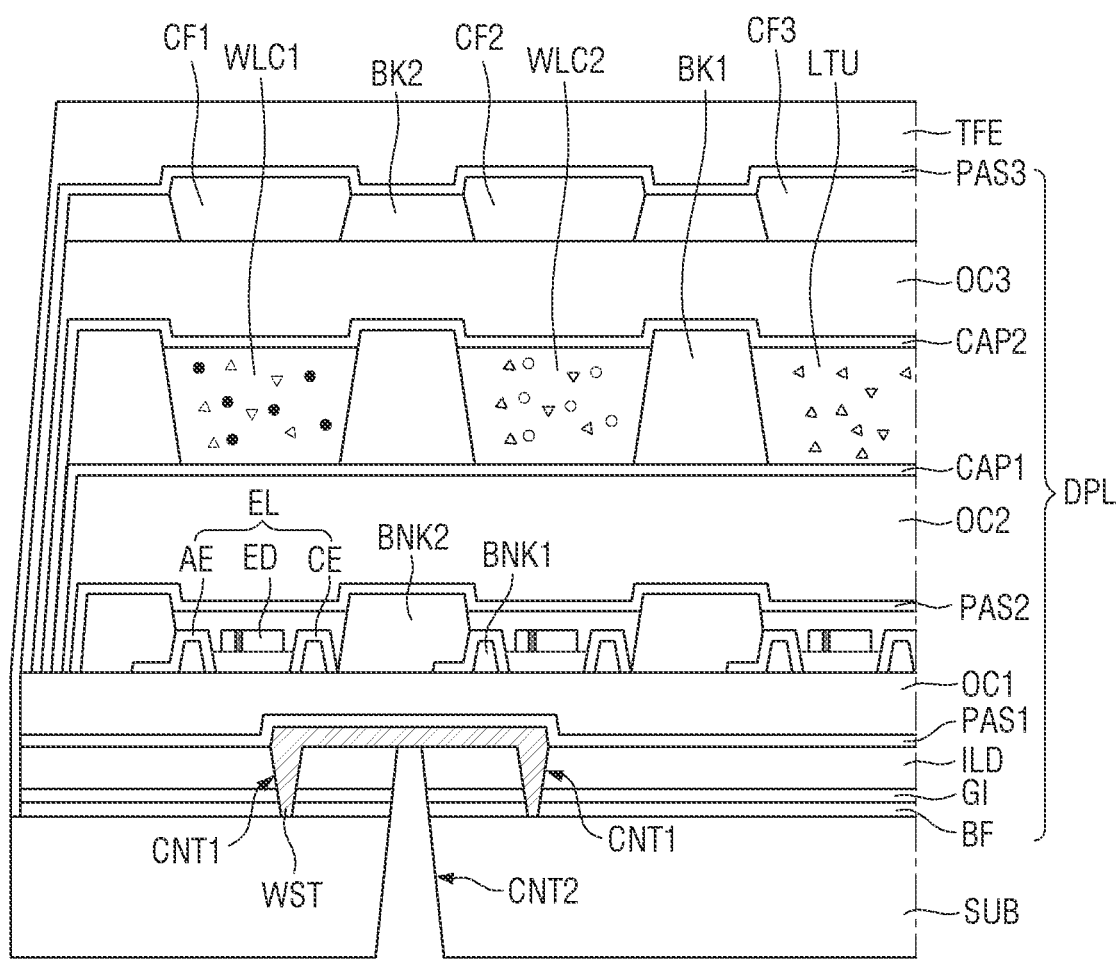

In FIG. 15, a second contact hole CNT2 may pass through the substrate SUB, the buffer layer BF, the gate insulating layer GI, and the interlayer insulating film ILD from a lower surface of the substrate SUB.

A part of the etching stopper WST, which is located on the interlayer insulating film ILD may control an etching depth in the third direction (Z-axis direction), and the other part of the etching stopper WST which is inserted into the first contact hole CNT1 may control an etching depth in the X-Y plane direction including the first direction (X-axis direction) and the second direction (Y-axis direction). Therefore, the etching stopper WST located on the interlayer insulating film ILD and inserted into the first contact hole CNT1 can prevent or reduce damage to the thin-film transistor layer TFTL during an etching process.

For example, the substrate SUB, the buffer layer BF, the gate insulating layer GI, and the interlayer insulating film ILD may be etched through a wet etching process, but embodiments according to the present disclosure are not limited thereto.

Figure 16:
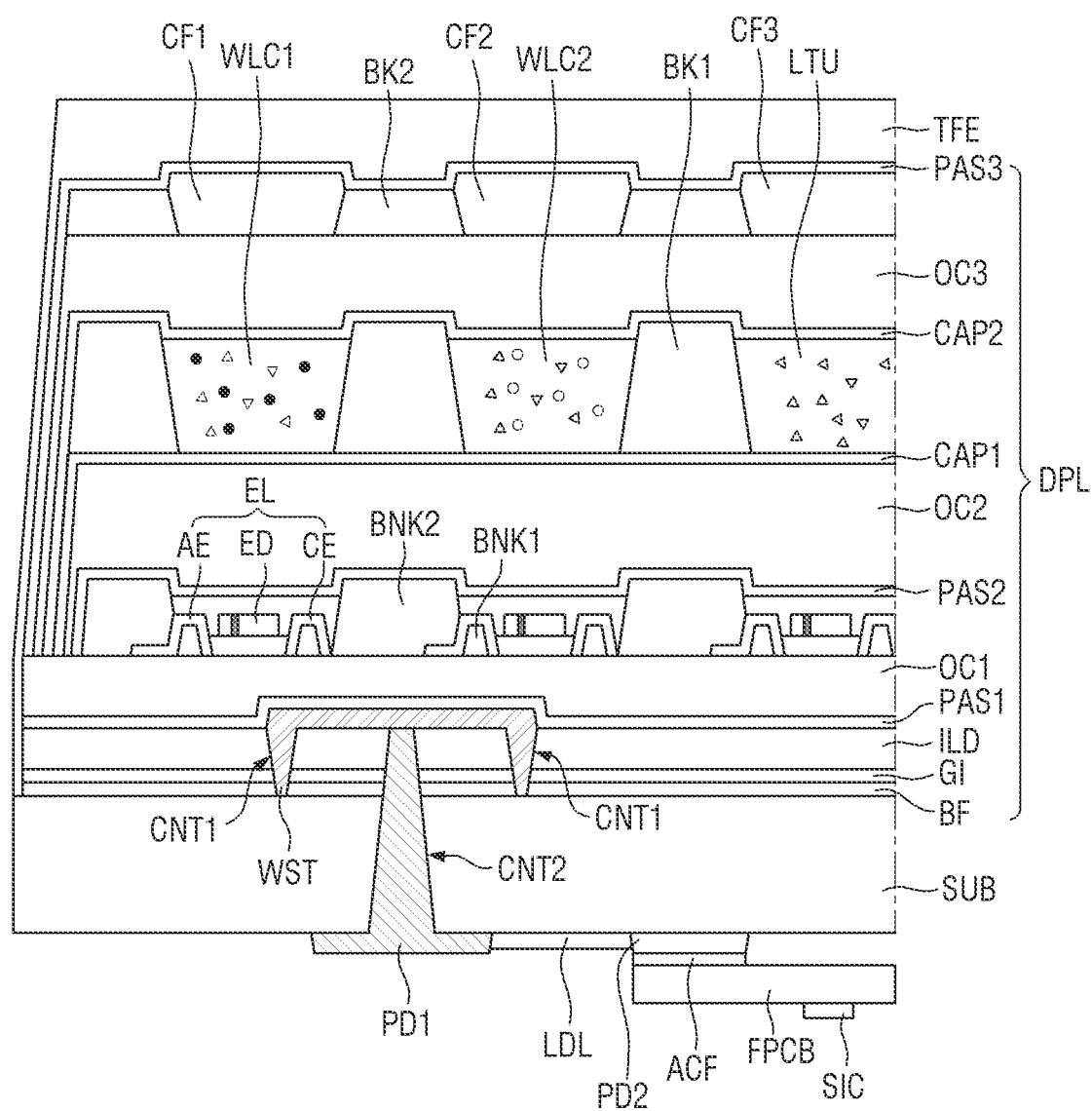

In FIG. 16, a first pad part PD1 may be located on the lower surface of the substrate SUB and connected to the etching stopper WST exposed through the second contact hole CNT2.

A second pad part PD2 may be located on the lower surface of the substrate SUB and spaced apart from the first pad part PD1. The second pad part PD2 may be connected to the first pad part PD1 through a lead line LDL. The second pad part PD2 may receive various voltages or signals from a flexible film FPCB and supply the voltages or signals to the first pad part PD1 and the etching stopper WST.

Figure 17:
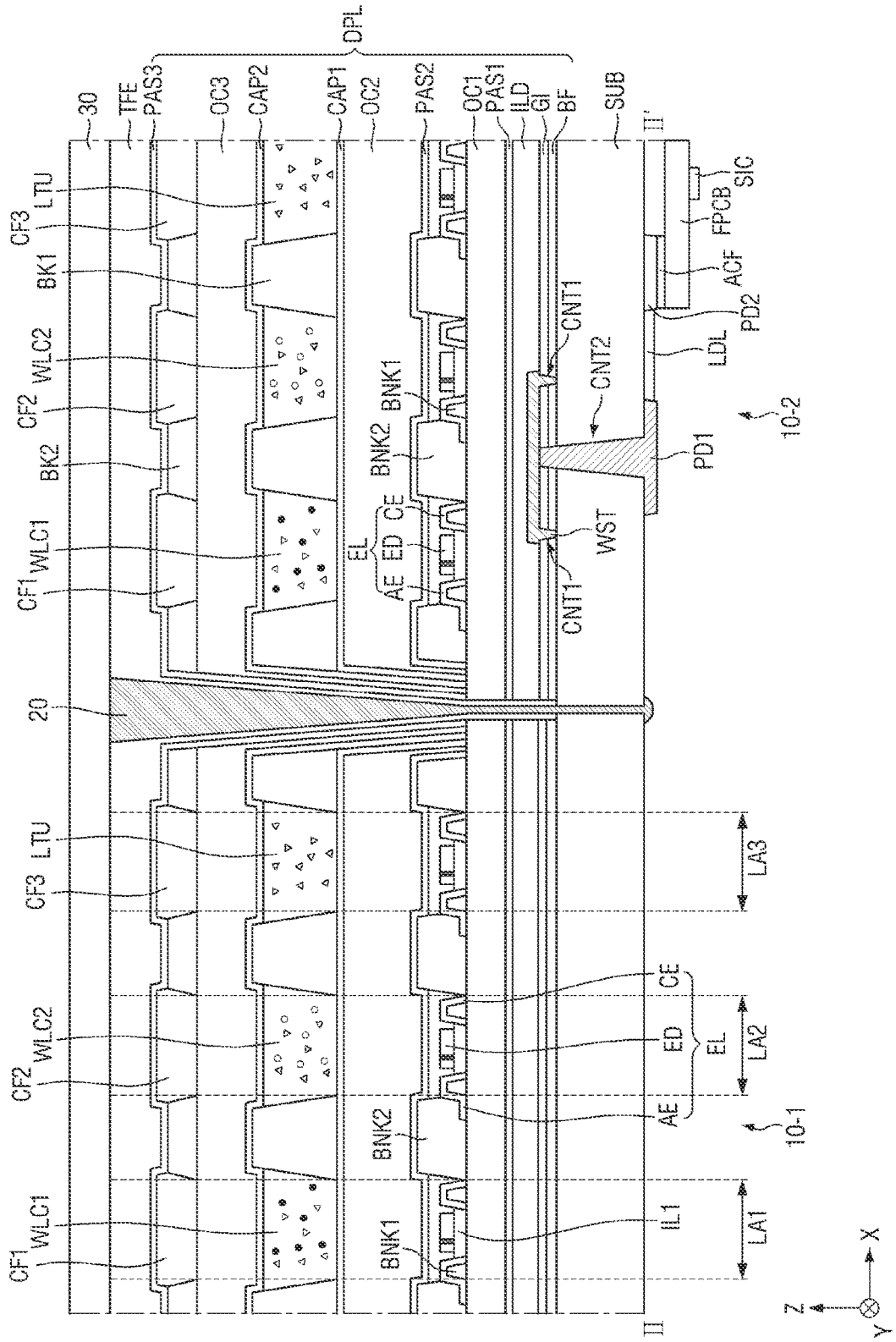
FIG. 17 is a cross-sectional view of an example taken along the line II-II' of FIG. 5.

FIG. 17 is a cross-sectional view of an example taken along the line II-II' of FIG. 5. A tiled display device TD of FIG. 17 is the same as the tiled display device TD of FIG. 12 except for the configuration of an etching stopper WST. Therefore, a description of the same elements as those described above will be given briefly or omitted.

Referring to FIG. 17, the tiled display device TD may include a plurality of display devices 10, a coupling member 20, and a cover member 30.

Each of the display devices 10 may include a substrate SUB, the etching stopper WST, a display layer DPL, an encapsulation layer TFE, a first pad part PD1, a second pad part PD2, a flexible film FPCB, and a source driver SIC.

The substrate SUB may be a base substrate or a base member and may be made of an insulating material such as polymer resin. For example, the substrate SUB may be a rigid substrate. For another example, the substrate SUB may be a flexible substrate that can be bent, folded, rolled, etc.

The etching stopper WST may be located on a gate insulating layer GI of a thin-film transistor layer TFTL and may contact the substrate SUB through a first contact hole CNT1. The first contact hole CNT1 may surround a second contact hole CNT2 at a distance in a plan view. The first contact hole CNT1 may pass through the gate insulating layer GI and a buffer layer BF. A part of the etching stopper WST may be inserted into the first contact hole CNT1 to surround the first pad part PD1 inserted into the second contact hole CNT2 at a distance. For example, a part of the etching stopper WST, which is located on the gate insulating layer GI may control an etching depth in the third direction (Z-axis direction), and the other part of the etching stopper WST which is inserted into the first contact hole CNT1 may control an etching depth in the X-Y plane direction including the first direction (X-axis direction) and the second direction (Y-axis direction). Therefore, the etching stopper WST located on the gate insulating layer GI and inserted into the first contact hole CNT1 can prevent or reduce damage to the thin-film transistor layer TFTL during an etching process.

For example, the etching stopper WST may include, but is not limited to, at least one of molybdenum (Mo), aluminum (Al), chromium (Cr), tungsten (W), gold (Au), titanium (Ti), nickel (Ni), neodymium (Nd), or copper (Cu).

The etching stopper WST may be connected to the first pad part PD1 inserted into the second contact hole CNT2. The etching stopper WST may supply an electrical signal received from the first pad part PD1 to the thin-film transistor layer TFTL. The etching stopper WST may be connected to a plurality of data lines to supply data voltages and may be connected to a plurality of scan lines to supply scan signals. The etching stopper WST may be formed on the same layer and of the same material as gate electrodes GE of thin-film transistors TFT, but embodiments according to the present disclosure are not limited thereto.

The display layer DPL may be located on the substrate SUB. The display layer DPL may include the buffer layer BF, the thin-film transistor layer TFTL, a light emitting element layer EML, a wavelength conversion layer WLCL, and a color filter layer CFL illustrated in FIG. 3. The elements described above in FIG. 3 will not be described below.

The substrate SUB may include the second contact hole CNT2. For example, the second contact hole CNT2 may pass through the substrate SUB from a lower surface to an upper surface of the substrate SUB. The second contact hole CNT2 may overlap a display area DA. The first pad part PD1 inserted into the second contact hole CNT2 may be located in the display area DA. Therefore, each display device 10 may not include a separate pad part located at an outermost position, and a bezel area or a dead space of each display device 10 can be minimized. Because the first pad part PD1 is located on a lower surface of each display device 10, a gap between the display devices 10 can be further reduced compared with when a pad part is located at an outermost position on a substrate or when a flexible film is located on a side surface of the substrate.

The second contact hole CNT2 may additionally pass through the buffer layer BF and the gate insulting layer GI. The second contact hole CNT2 may be formed by performing a wet etching process or a dry etching process on the lower surface of the substrate SUB after the display layer DPL and the encapsulation layer TFE are stacked on the upper surface of the substrate SUB. For example, the substrate SUB, the buffer layer BF, and the gate insulating layer GI may be etched through a wet etching process, but embodiments according to the present disclosure are not limited thereto.

The first pad part PD1 may be located on the lower surface of the substrate SUB and may be connected to the etching stopper WST exposed through the second contact hole CNT2.

FIGS. 18 through 22 are cross-sectional views illustrating a process of manufacturing a display device 10 of FIG. 17.

Figure 18:
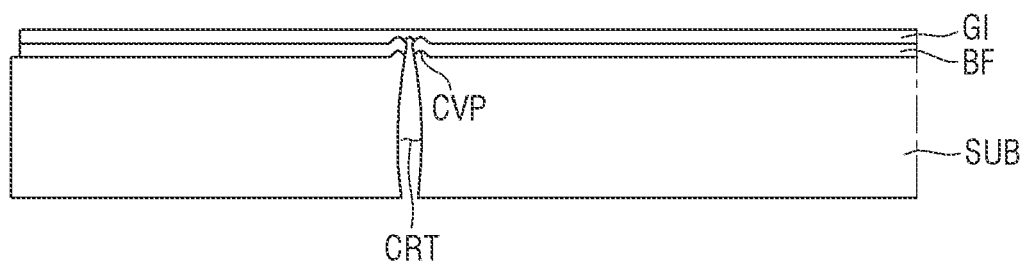
FIGS. 18 through 22 are cross-sectional views illustrating a process of manufacturing a display device of FIG. 17 according to some example embodiments.

In FIG. 18, a laser may be irradiated to a lower surface of a substrate SUB before a buffer layer BF is stacked on the substrate SUB. A part of the substrate SUB exposed to the laser may be deformed by excessive heat. For example, a part of the substrate SUB may be melted by the heat of the laser, and a crater CRT and convex parts CVP may be formed at a point where the heat of the laser is concentrated. The sizes and shapes of the crater CRT and the convex parts CVP are not limited to those illustrated in FIG. 18.

The buffer layer BF and a gate insulating layer GI may be sequentially stacked on the substrate SUB. At least some of the buffer layer BF and the gate insulating layer GI may be split by the convex parts CVP and the crater CRT of the substrate SUB.

The sum of thicknesses (lengths in the Z-axis direction) of the buffer layer BF and the gate insulating layer GI may be equal to or greater than twice a width (a length in the X-axis direction) of the crater CRT. For example, when the width of the crater CRT is 4,000 Å, the sum of the thicknesses of the buffer layer BF and the gate insulating layer GI may be, but is not limited to, 8,000 Å or more. Because a plurality of insulating layers are stacked to a thickness equal to or greater than twice the width of the crater CRT in the display device 10, splitting of the top of the insulating layers can be prevented or reduced.

Figure 19:
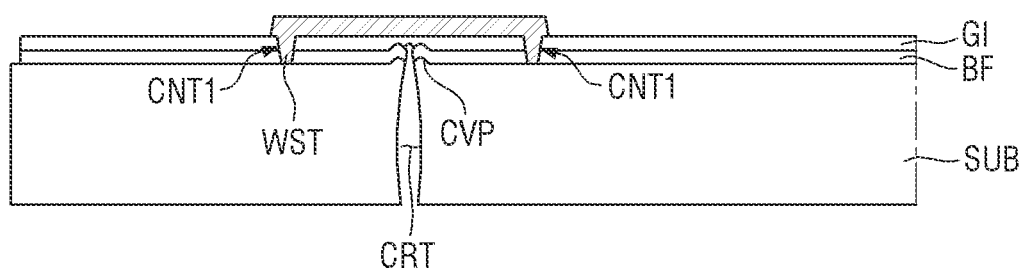

In FIG. 19, an etching stopper WST may be located on the gate insulting layer GI and may contact the substrate SUB through a first contact hole CNT1. Because the display device 10 includes the buffer layer BF and the gate insulating layer GI stacked to a thickness (e.g., a set or predetermined thickness), it can prevent or reduce splitting of the etching stopper WST on the gate insulting layer GI. By preventing or reducing defects in the etching stopper WST, the display device 10 can prevent or reduce damage to a thin-film transistor layer TFTL during an etching process.

The first contact hole CNT1 may surround the crater CRT at a distance in a plan view. The first contact hole CNT1 may be formed to pass through the gate insulating layer GI and the buffer layer BF. A part of the etching stopper WST may be inserted into the first contact hole CNT1 to surround the crater CRT at a distance.

Figure 20:
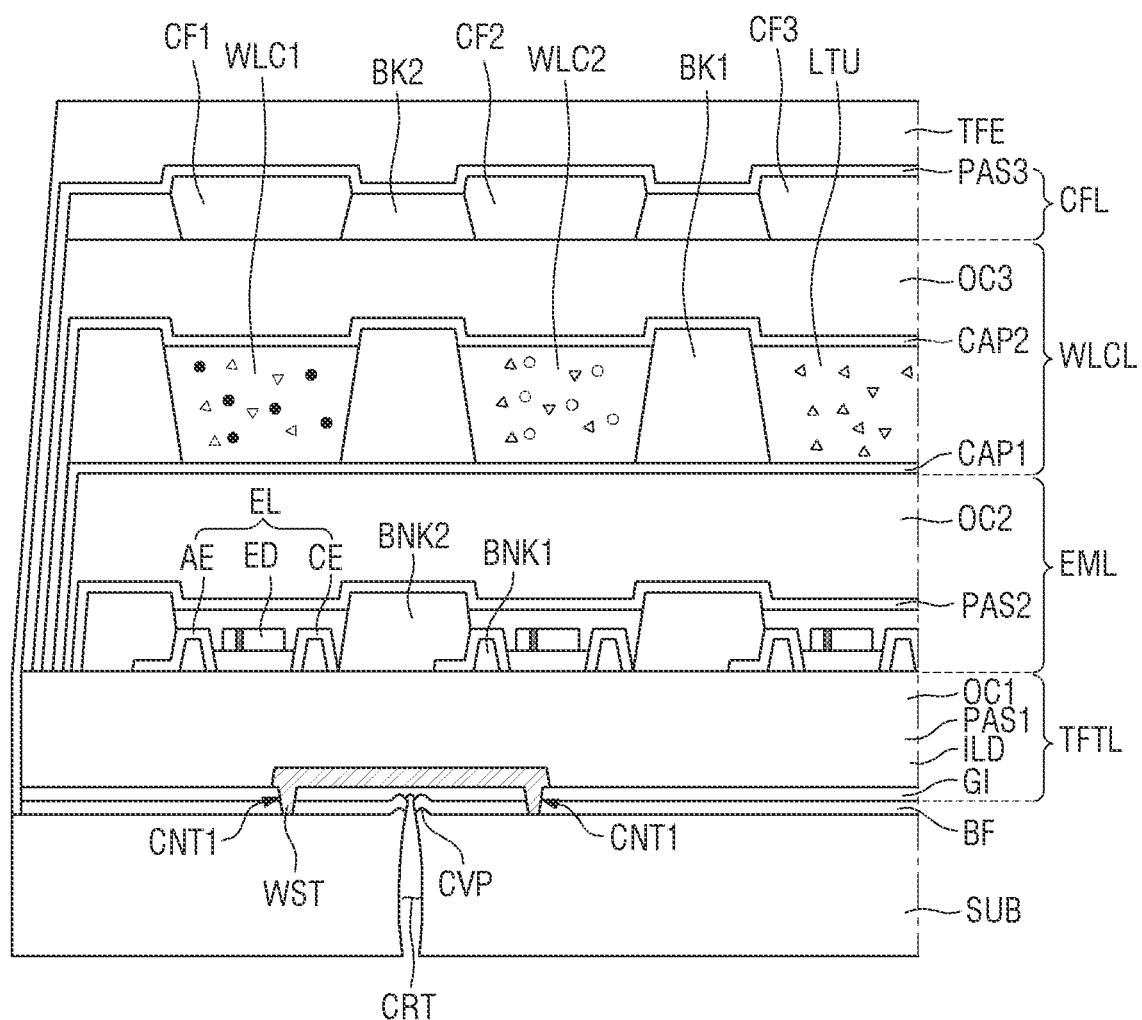

In FIG. 20, an interlayer insulating film ILD may cover the etching stopper WST and the gate insulating layer GI, and a first passivation layer PAS1 and a first planarization layer OC1 may be sequentially stacked on the interlayer insulating film ILD.

A light emitting element layer EML, a wavelength conversion layer WLCL, a color filter layer CFL, and an encapsulation layer TFE may be sequentially stacked on the thin-film transistor layer TFTL.

Figure 21:
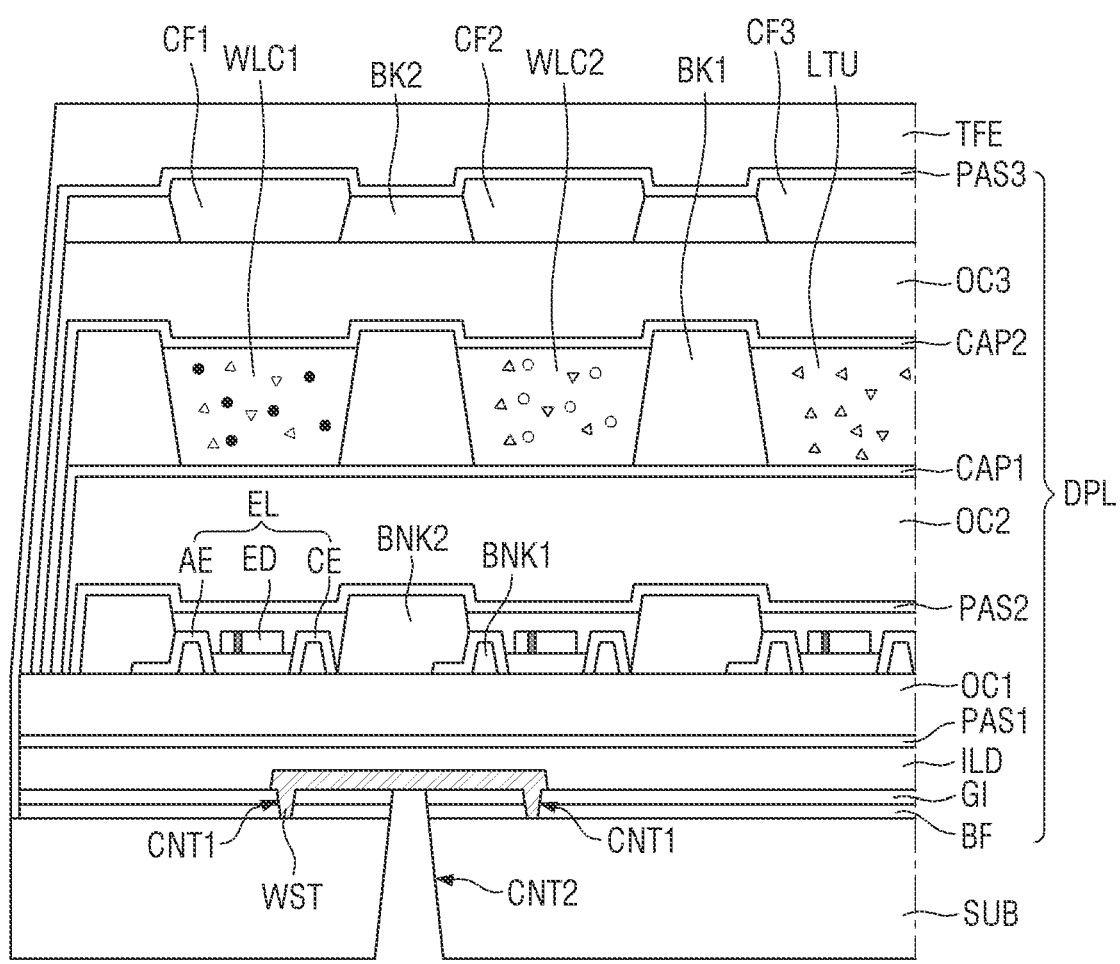

In FIG. 21, a second contact hole CNT2 may pass through the substrate SUB, the buffer layer BF, and the gate insulating layer GI from the lower surface of the substrate SUB.

A part of the etching stopper WST, which is located on the gate insulating layer GI may control an etching depth in the third direction (Z-axis direction), and the other part of the etching stopper WST which is inserted into the first contact hole CNT1 may control an etching depth in the X-Y plane direction including the first direction (X-axis direction) and the second direction (Y-axis direction). Therefore, the etching stopper WST located on the gate insulating layer GI and inserted into the first contact hole CNT1 can prevent or reduce damage to the thin-film transistor layer TFTL during an etching process.

For example, the substrate SUB, the buffer layer BF, and the gate insulating layer GI may be etched through a wet etching process, but embodiments according to the present disclosure are not limited thereto.

Figure 22:
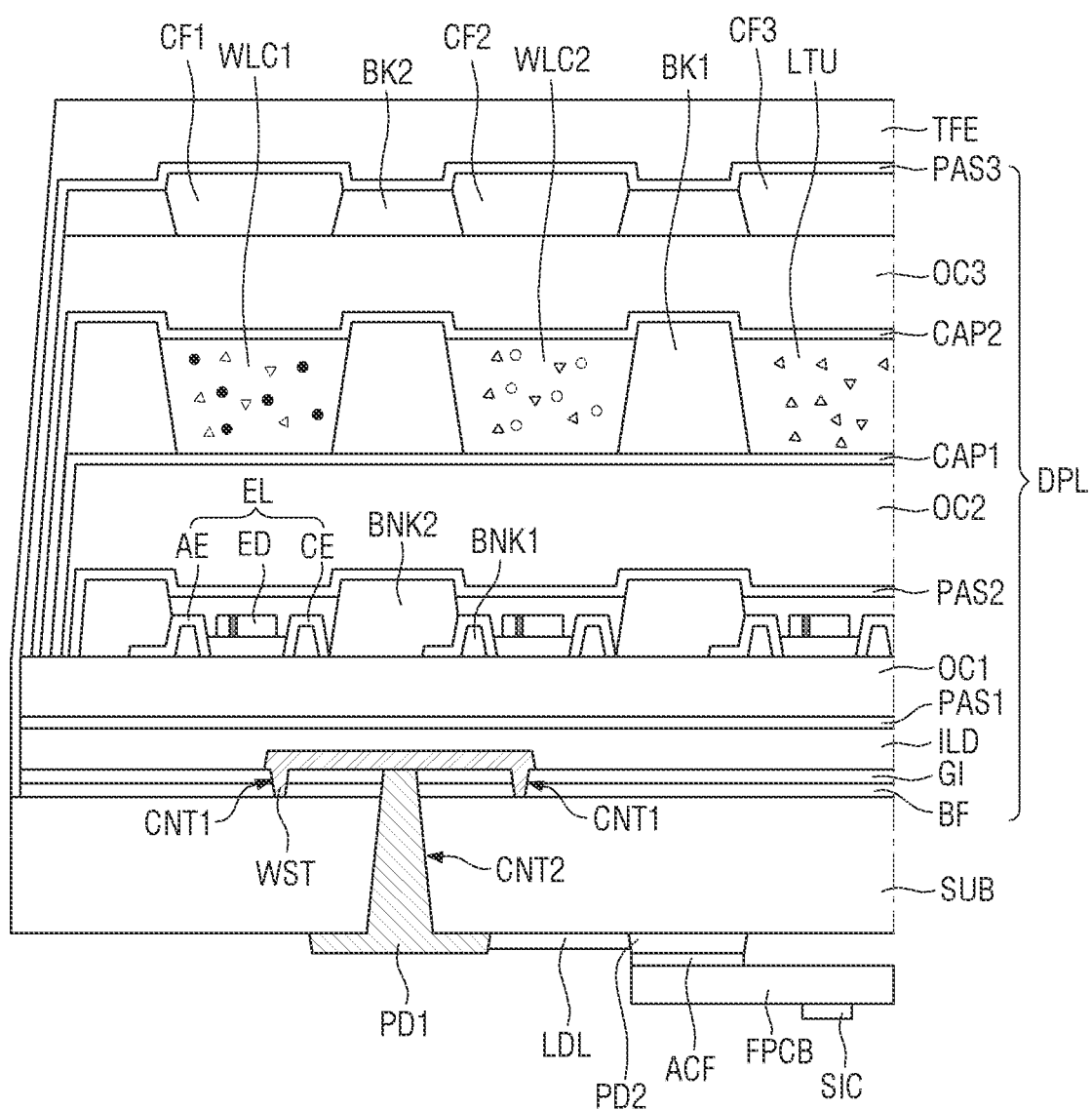

In FIG. 22, a first pad part PD1 may be located on the lower surface of the substrate SUB and connected to the etching stopper WST exposed through the second contact hole CNT2.

A second pad part PD2 may be located on the lower surface of the substrate SUB and spaced apart from the first pad part PD1. The second pad part PD2 may be connected to the first pad part PD1 through a lead line LDL. The second pad part PD2 may receive various voltages or signals from a flexible film FPCB and supply the voltages or signals to the first pad part PD1 and the etching stopper WST.

Figure 23:
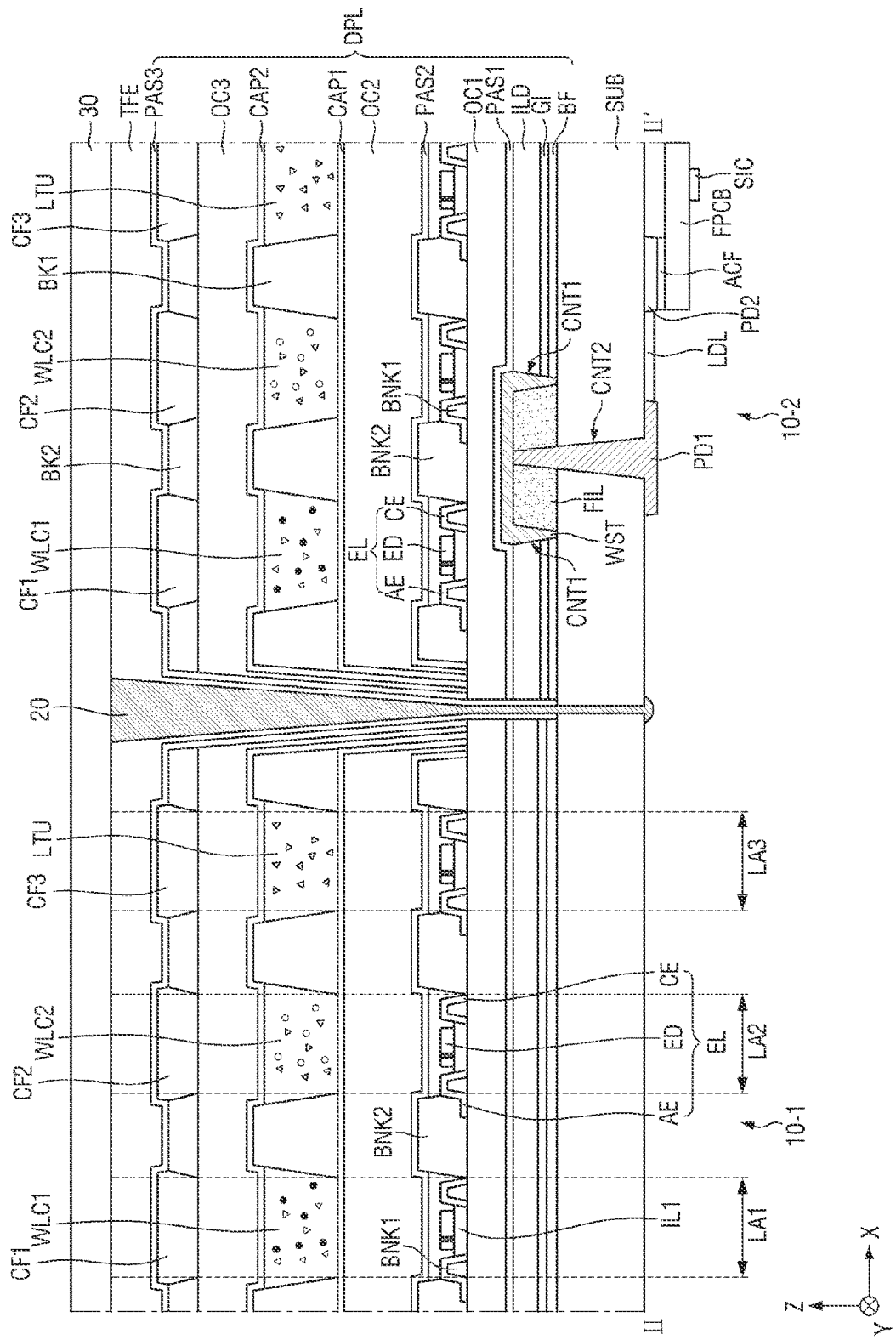
FIG. 23 is a cross-sectional view of an example taken along the line II-II' of FIG. 5.

FIG. 23 is a cross-sectional view of an example taken along the line II-II' of FIG. 5. A tiled display device TD of FIG. 23 is the same as the tiled display device TD of FIG. 12 except that it further includes a filling part FIL. Therefore, a description of the same elements as those described above will be given briefly or omitted.

Referring to FIG. 23, the tiled display device TD may include a plurality of display devices 10, a coupling member 20, and a cover member 30.

Each of the display devices 10 may include a substrate SUB, the filling part FIL, an etching stopper WST, a display layer DPL, an encapsulation layer TFE, a first pad part PD1, a second pad part PD2, a flexible film FPCB, and a source driver SIC.

The substrate SUB may be a base substrate or a base member and may be made of an insulating material such as polymer resin. For example, the substrate SUB may be a rigid substrate. For another example, the substrate SUB may be a flexible substrate that can be bent, folded, rolled, etc.

The filling part FIL may be located on the substrate SUB and may have a flat upper surface. The filling part FIL may provide the flat upper surface on which the etching stopper WST is to be located and may prevent or reduce splitting of the etching stopper WST. A second contact hole CNT2 of the substrate SUB may additionally pass through the filling part FIL. Therefore, the filling part FIL may surround the first pad part PD1 inserted into the second contact hole CNT2. A first contact hole CNT1 may be provided between an interlayer insulating film ILD, a gate insulating layer GI and a buffer layer BF and the filling part FIL. The filling part FIL may be surrounded by the etching stopper WST inserted into the first contact hole CNT1.

For example, the filling part FIL may include an organic material. For example, the filling part FIL may include at least one of acryl resin, epoxy resin, phenolic resin, polyamide resin, or polyimide resin.

The etching stopper WST may be located on the filling part FIL and may contact the substrate SUB through the first contact hole CNT1. The first contact hole CNT1 may surround the second contact hole CNT2 at a distance in a plan view. The first contact hole CNT1 may pass between the interlayer insulating film ILD, the gate insulating layer GI and the buffer layer BF and the filling part FIL. A part of the etching stopper WST may be inserted into the first contact hole CNT1 to surround the first pad part PD1 inserted into the second contact hole CNT2 at a distance. For example, a part of the etching stopper WST, which is located on the filling part FIL may control an etching depth in the third direction (Z-axis direction), and the other part of the etching stopper WST which is inserted into the first contact hole CNT1 may control an etching depth in the X-Y plane direction including the first direction (X-axis direction) and the second direction (Y-axis direction). Therefore, the etching stopper WST located on the filling part FIL and inserted into the first contact hole CNT1 can prevent or reduce damage to a thin-film transistor layer TFTL during an etching process.

For example, the etching stopper WST may include, but is not limited to, at least one of molybdenum (Mo), aluminum (Al), chromium (Cr), tungsten (W), gold (Au), titanium (Ti), nickel (Ni), neodymium (Nd), or copper (Cu).

The etching stopper WST may be connected to the first pad part PD1 inserted into the second contact hole CNT2. The etching stopper WST may supply an electrical signal received from the first pad part PD1 to the thin-film transistor layer TFTL. The etching stopper WST may be connected to a plurality of data lines to supply data voltages and may be connected to a plurality of scan lines to supply scan signals. The etching stopper WST may be formed on the same layer and of the same material as connection electrodes CNE of the thin-film transistor layer TFTL, but embodiments according to the present disclosure are not limited thereto.

The display layer DPL may be located on the substrate SUB. The display layer DPL may include the buffer layer BF, the thin-film transistor layer TFTL, a light emitting element layer EML, a wavelength conversion layer WLCL, and a color filter layer CFL illustrated in FIG. 3. The elements described above in FIG. 3 will not be described below.

The substrate SUB may include the second contact hole CNT2. For example, the second contact hole CNT2 may pass through the substrate SUB from a lower surface to an upper surface of the substrate SUB. The second contact hole CNT2 may overlap a display area DA. The first pad part PD1 inserted into the second contact hole CNT2 may be located in the display area DA. Therefore, each display device 10 may not include a separate pad part located at an outermost position, and a bezel area or a dead space of each display device 10 can be minimized. Because the first pad part PD1 is located on a lower surface of each display device 10, a gap between the display devices 10 can be further reduced compared with when a pad part is located at an outermost position on a substrate or when a flexible film is located on a side surface of the substrate.

The second contact hole CNT2 may additionally pass through the filling part FIL. The second contact hole CNT2 may be formed by performing a wet etching process or a dry etching process on the lower surface of the substrate SUB after the display layer DPL and the encapsulation layer TFE are stacked on the upper surface of the substrate SUB. For example, the substrate SUB and the filling part FIL may be etched through a wet etching process, but embodiments according to the present disclosure are not limited thereto.

The first pad part PD1 may be located on the lower surface of the substrate SUB and may be connected to the etching stopper WST exposed through the second contact hole CNT2.

FIGS. 24 through 28 are cross-sectional views illustrating a process of manufacturing a display device 10 of FIG. 23.

Figure 24:
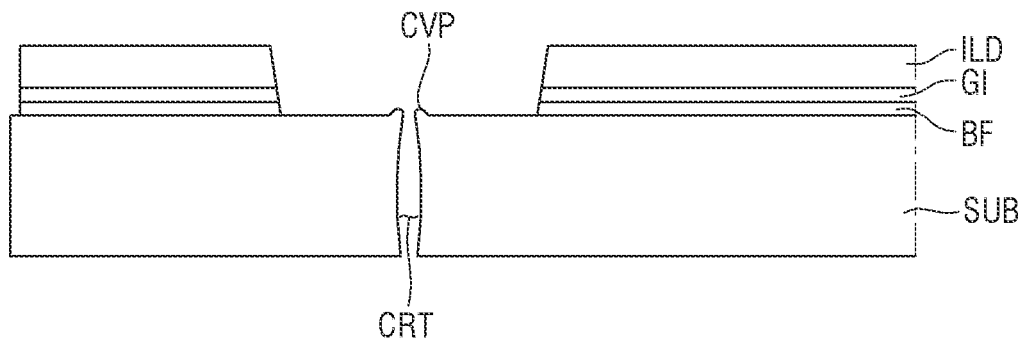
FIGS. 24 through 28 are cross-sectional views illustrating a process of manufacturing a display device of FIG. 23 according to some example embodiments.

The display device manufacturing process of FIG. 24 may be a process following the display device manufacturing process of FIG. 7.

In FIG. 24, a buffer layer BF, a gate insulating layer GI, and an interlayer insulating film ILD may be sequentially stacked on a substrate SUB, and then an area (e.g., a set or predetermined area) surrounding a crater CRT may be patterned. As a part of each of the buffer layer BF, the gate insulating layer GI, and the interlayer insulating film ILD is patterned, a part of an upper surface of the substrate SUB including the crater CRT and convex parts CVP may be exposed.

Figure 25:
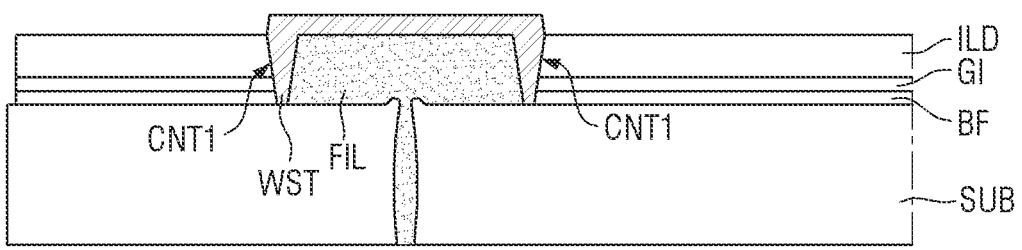

In FIG. 25, a filling part FIL may be located on the substrate SUB exposed by the patterning of the buffer layer BF, the gate insulting layer GI, and the interlayer insulating film ILD. The filling part FIL may fill the crater CRT while covering the upper surface of the exposed substrate SUB. Therefore, the filling part FIL may provide a flat upper surface on which an etching stopper WST is to be arranged.

The etching stopper WST may be located on the filling part FIL and may contact the substrate SUB through a first contact hole CNT1. Because the display device 10 includes the filling part FIL having the flat upper surface, it can prevent or reduce splitting of the etching stopper WST. By preventing or reducing defects in the etching stopper WST, the display device 10 can prevent or reduce damage to a thin-film transistor layer TFTL during an etching process.

The first contact hole CNT1 may surround the crater CRT at a distance in a plan view. The first contact hole CNT1 may be formed between the interlayer insulating film ILD, the gate insulating layer GI and the buffer layer BF and the filling part FIL. A part of the etching stopper WST may be inserted into the first contact hole CNT1 to surround the crater CRT at a distance.

Figure 26:
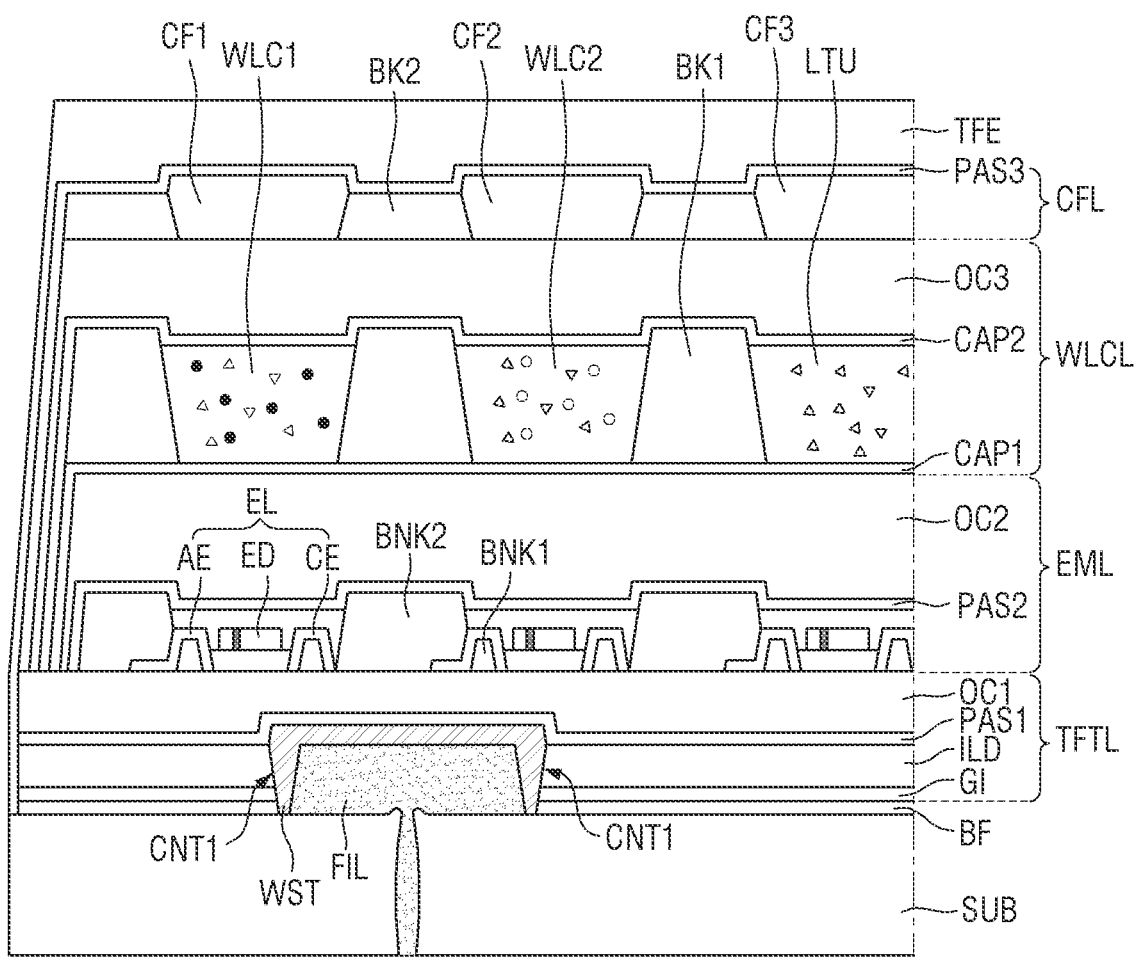

In FIG. 26, a first passivation layer PAS1 may cover the etching stopper WST and the interlayer insulating film ILD, and a first planarization layer OC1 may cover the first passivation layer PAS1.

A light emitting element layer EML, a wavelength conversion layer WLCL, a color filter layer CFL, and an encapsulation layer TFE may be sequentially stacked on the thin-film transistor layer TFTL.

Figure 27:
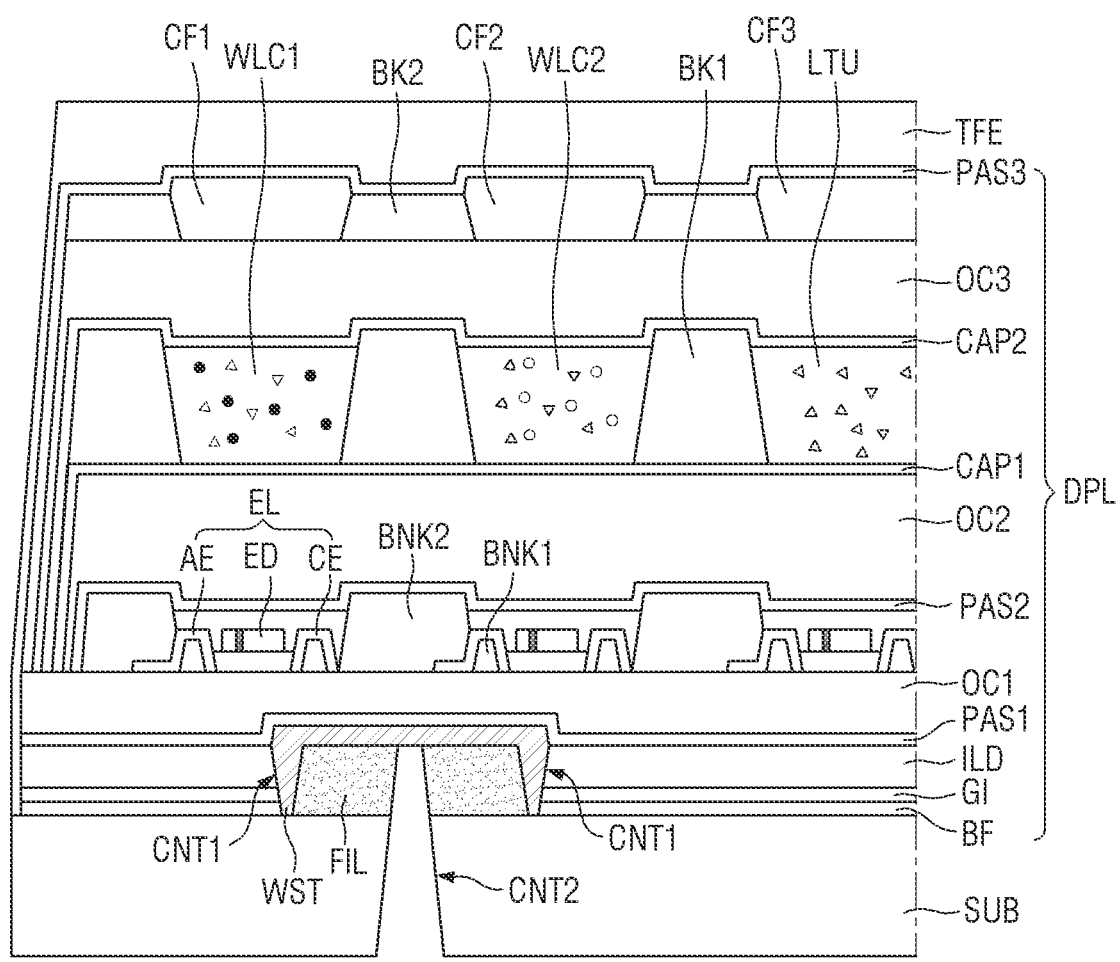

In FIG. 27, a second contact hole CNT2 may pass through the substrate SUB and the filling part FIL from a lower surface of the substrate SUB.

A part of the etching stopper WST, which is located on the filling part FIL may control an etching depth in the third direction (Z-axis direction), and the other part of the etching stopper WST which is inserted into the first contact hole CNT1 may control an etching depth in the X-Y plane direction including the first direction (X-axis direction) and the second direction (Y-axis direction). Therefore, the etching stopper WST located on the filling part FIL and inserted into the first contact hole CNT1 can prevent or reduce damage to the thin-film transistor layer TFTL during an etching process.

For example, the substrate SUB and the filling part FIL may be etched through a wet etching process, but embodiments according to the present disclosure are not limited thereto.

Figure 28:
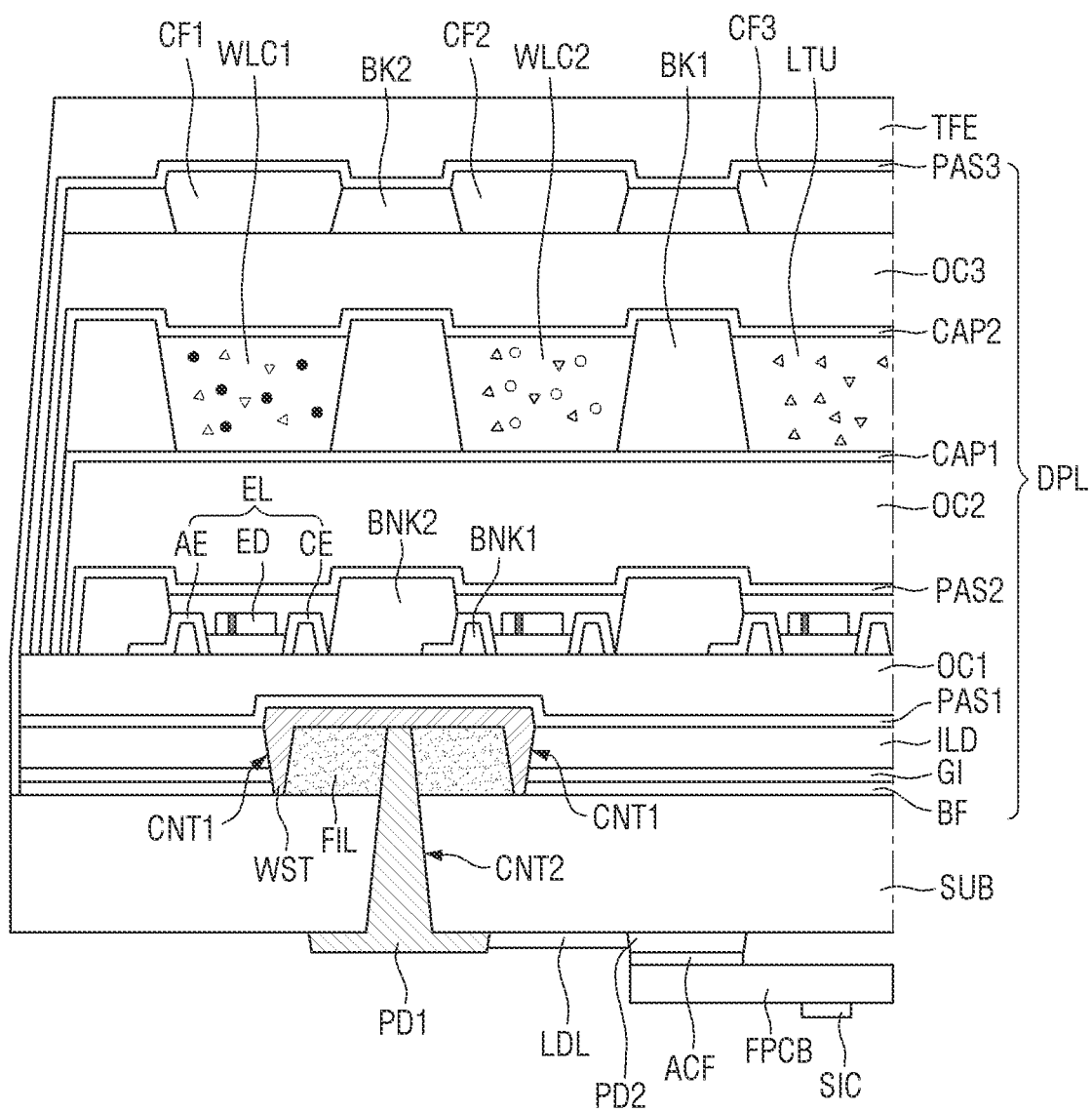

In FIG. 28, a first pad part PD1 may be located on the lower surface of the substrate SUB and connected to the etching stopper WST exposed through the second contact hole CNT2.

A second pad part PD2 may be located on the lower surface of the substrate SUB and spaced apart from the first pad part PD1. The second pad part PD2 may be connected to the first pad part PD1 through a lead line LDL. The second pad part PD2 may receive various voltages or signals from a flexible film FPCB and supply the voltages or signals to the first pad part PD1 and the etching stopper WST.

Figure 29:
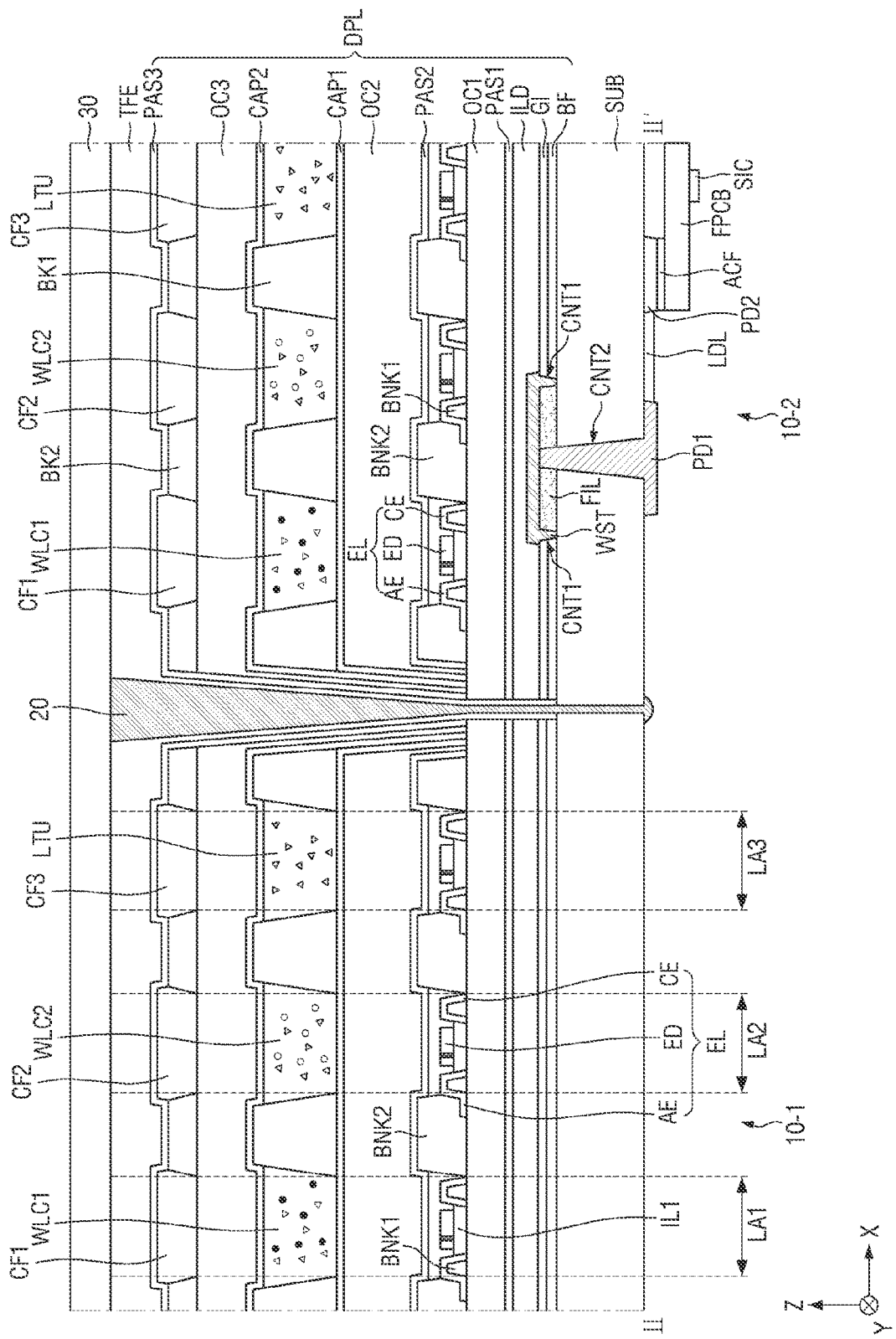
FIG. 29 is a cross-sectional view of an example taken along the line II-II' of FIG. 5.

FIG. 29 is a cross-sectional view of an example taken along the line II-II' of FIG. 5. A tiled display device TD of FIG. 29 is the same as the tiled display device TD of FIG. 23 except for the configuration of an etching stopper WST. Therefore, a description of the same elements as those described above will be given briefly or omitted.

Referring to FIG. 29, the tiled display device TD may include a plurality of display devices 10, a coupling member 20, and a cover member 30.

Each of the display devices 10 may include a substrate SUB, a filling part FIL, the etching stopper WST, a display layer DPL, an encapsulation layer TFE, a first pad part PD1, a second pad part PD2, a flexible film FPCB, and a source driver SIC.

The substrate SUB may be a base substrate or a base member and may be made of an insulating material such as polymer resin. For example, the substrate SUB may be a rigid substrate. For another example, the substrate SUB may be a flexible substrate that can be bent, folded, rolled, etc.

The filling part FIL may be located on the substrate SUB and may have a flat upper surface. The filling part FIL may provide the flat upper surface on which the etching stopper WST is to be located and may prevent or reduce splitting of the etching stopper WST. A second contact hole CNT2 of the substrate SUB may additionally pass through the filling part FIL. Therefore, the filling part FIL may surround the first pad part PD1 inserted into the second contact hole CNT2. A first contact hole CNT1 may be provided between a gate insulating layer GI and a buffer layer BF and the filling part FIL. The filling part FIL may be surrounded by the etching stopper WST inserted into the first contact hole CNT1.

The etching stopper WST may be located on the filling part FIL and may contact the substrate SUB through the first contact hole CNT1. The first contact hole CNT1 may surround the second contact hole CNT2 at a distance in a plan view. The first contact hole CNT1 may pass between the gate insulating layer GI and the buffer layer BF and the filling part FIL. A part of the etching stopper WST may be inserted into the first contact hole CNT1 to surround the first pad part PD1 inserted into the second contact hole CNT2 at a distance. For example, a part of the etching stopper WST, which is located on the filling part FIL may control an etching depth in the third direction (Z-axis direction), and the other part of the etching stopper WST which is inserted into the first contact hole CNT1 may control an etching depth in the X-Y plane direction including the first direction (X-axis direction) and the second direction (Y-axis direction). Therefore, the etching stopper WST located on the filling part FIL and inserted into the first contact hole CNT1 can prevent or reduce damage to a thin-film transistor layer TFTL during an etching process.

For example, the etching stopper WST may include, but is not limited to, at least one of molybdenum (Mo), aluminum (Al), chromium (Cr), tungsten (W), gold (Au), titanium (Ti), nickel (Ni), neodymium (Nd), or copper (Cu).

The etching stopper WST may be connected to the first pad part PD1 inserted into the second contact hole CNT2. The etching stopper WST may supply an electrical signal received from the first pad part PD1 to the thin-film transistor layer TFTL. The etching stopper WST may be connected to a plurality of data lines to supply data voltages and may be connected to a plurality of scan lines to supply scan signals. The etching stopper WST may be formed on the same layer and of the same material as gate electrodes GE of thin-film transistors TFT, but embodiments according to the present disclosure are not limited thereto.

The display layer DPL may be located on the substrate SUB. The display layer DPL may include the buffer layer BF, the thin-film transistor layer TFTL, a light emitting element layer EML, a wavelength conversion layer WLCL, and a color filter layer CFL illustrated in FIG. 3. The elements described above in FIG. 3 will not be described below.

The substrate SUB may include the second contact hole CNT2. For example, the second contact hole CNT2 may pass through the substrate SUB from a lower surface to an upper surface of the substrate SUB. The second contact hole CNT2 may overlap a display area DA. The first pad part PD1 inserted into the second contact hole CNT2 may be located in the display area DA. Therefore, each display device 10 may not include a separate pad part located at an outermost position, and a bezel area or a dead space of each display device 10 can be minimized. Because the first pad part PD1 is located on a lower surface of each display device 10, a gap between the display devices 10 can be further reduced compared with when a pad part is located at an outermost position on a substrate or when a flexible film is located on a side surface of the substrate.

The second contact hole CNT2 may additionally pass through the filling part FIL. The second contact hole CNT2 may be formed by performing a wet etching process or a dry etching process on the lower surface of the substrate SUB after the display layer DPL and the encapsulation layer TFE are stacked on the upper surface of the substrate SUB. For example, the substrate SUB and the filling part FIL may be etched through a wet etching process, but embodiments according to the present disclosure are not limited thereto.

The first pad part PD1 may be located on the lower surface of the substrate SUB and may be connected to the etching stopper WST exposed through the second contact hole CNT2.

FIGS. 30 through 34 are cross-sectional views illustrating a process of manufacturing a display device 10 of FIG. 29. The display device manufacturing process of FIG. 30 may be a process following the display device manufacturing process of FIG. 18.

Figure 30:
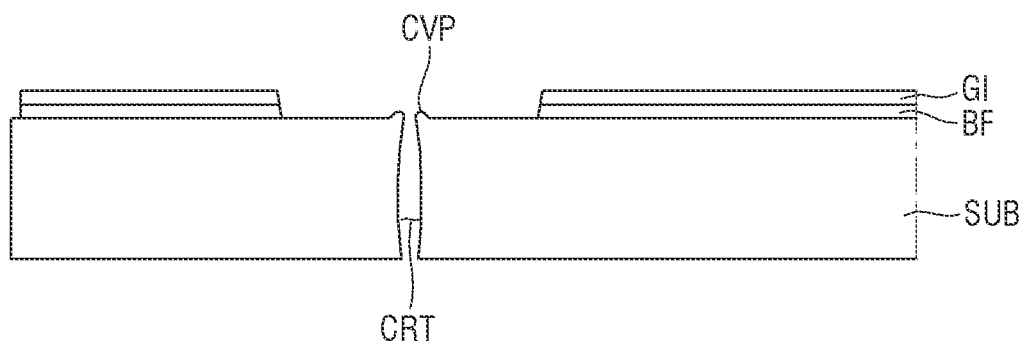
FIGS. 30 through 34 are cross-sectional views illustrating a process of manufacturing a display device of FIG. 29 according to some example embodiments.

In FIG. 30, a buffer layer BF and a gate insulating layer GI may be sequentially stacked on a substrate SUB, and then an area (e.g., a set or predetermined area) surrounding a crater CRT may be patterned. As a part of each of the buffer layer BF and the gate insulating layer GI is patterned, a part of an upper surface of the substrate SUB including the crater CRT and convex parts CVP may be exposed.

Figure 31:
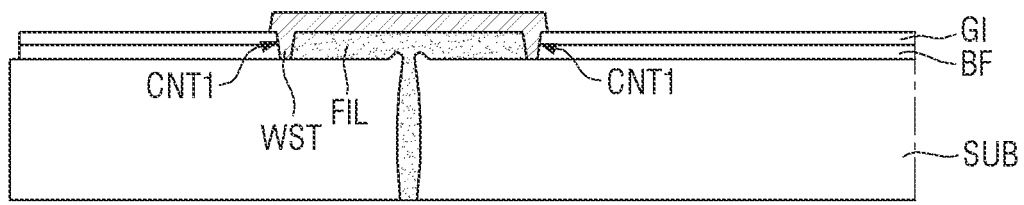

In FIG. 31, a filling part FIL may be located on the substrate SUB exposed by the patterning of the buffer layer BF and the gate insulting layer GI. The filling part FIL may fill the crater CRT while covering the upper surface of the exposed substrate SUB. Therefore, the filling part FIL may provide a flat upper surface on which an etching stopper WST is to be located.

The etching stopper WST may be located on the filling part FIL and may contact the substrate SUB through a first contact hole CNT1. Because the display device 10 includes the filling part FIL having the flat upper surface, it can prevent or reduce splitting of the etching stopper WST. By preventing or reducing defects in the etching stopper WST, the display device 10 can prevent or reduce damage to a thin-film transistor layer TFTL during an etching process.

The first contact hole CNT1 may surround the crater CRT at a distance in a plan view. The first contact hole CNT1 may be formed between the gate insulating layer GI and the buffer layer BF and the filling part FIL. A part of the etching stopper WST may be inserted into the first contact hole CNT1 to surround the crater CRT at a distance.

Figure 32:
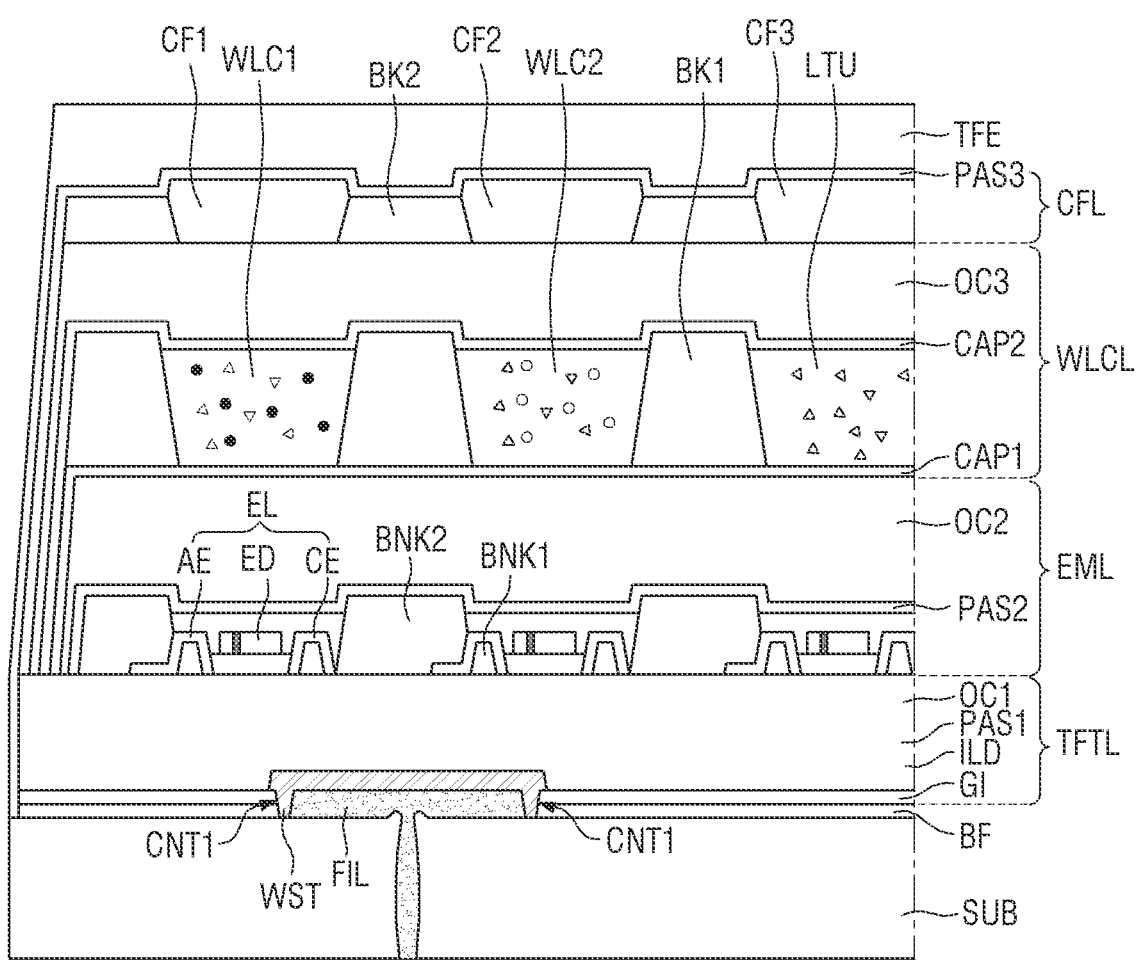

In FIG. 32, an interlayer insulating film ILD may cover the etching stopper WST and the gate insulating layer GI, and a first passivation layer PAS1 and a first planarization layer OC1 may be sequentially stacked on the interlayer insulating film ILD.

A light emitting element layer EML, a wavelength conversion layer WLCL, a color filter layer CFL, and an encapsulation layer TFE may be sequentially stacked on the thin-film transistor layer TFTL.

Figure 33:
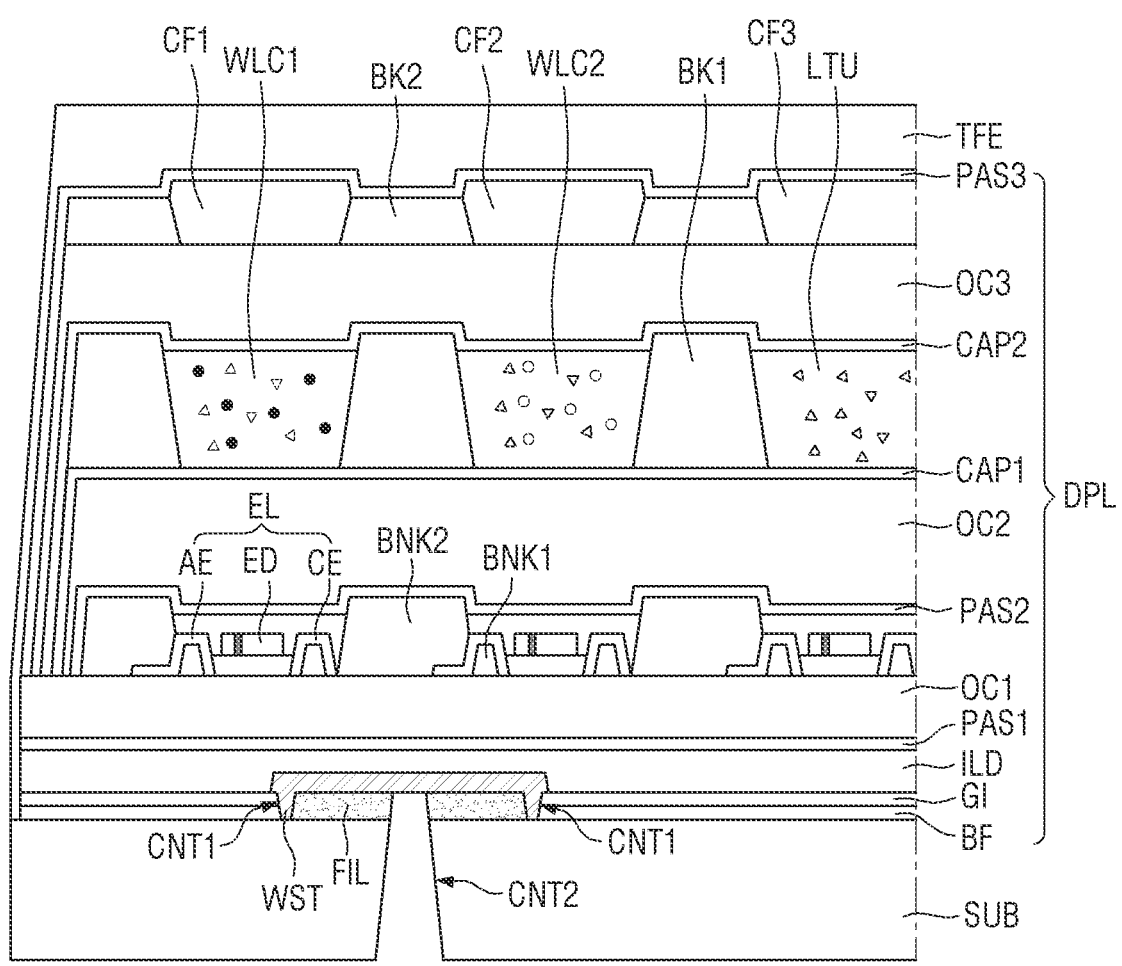

In FIG. 33, a second contact hole CNT2 may pass through the substrate SUB and the filling part FIL from a lower surface of the substrate SUB.

A part of the etching stopper WST, which is located on the filling part FIL may control an etching depth in the third direction (Z-axis direction), and the other part of the etching stopper WST which is inserted into the first contact hole CNT1 may control an etching depth in the X-Y plane direction including the first direction (X-axis direction) and the second direction (Y-axis direction). Therefore, the etching stopper WST located on the filling part FIL and inserted into the first contact hole CNT1 can prevent or reduce damage to the thin-film transistor layer TFTL during an etching process.

For example, the substrate SUB and the filling part FIL may be etched through a wet etching process, but embodiments according to the present disclosure are not limited thereto.

Figure 34:
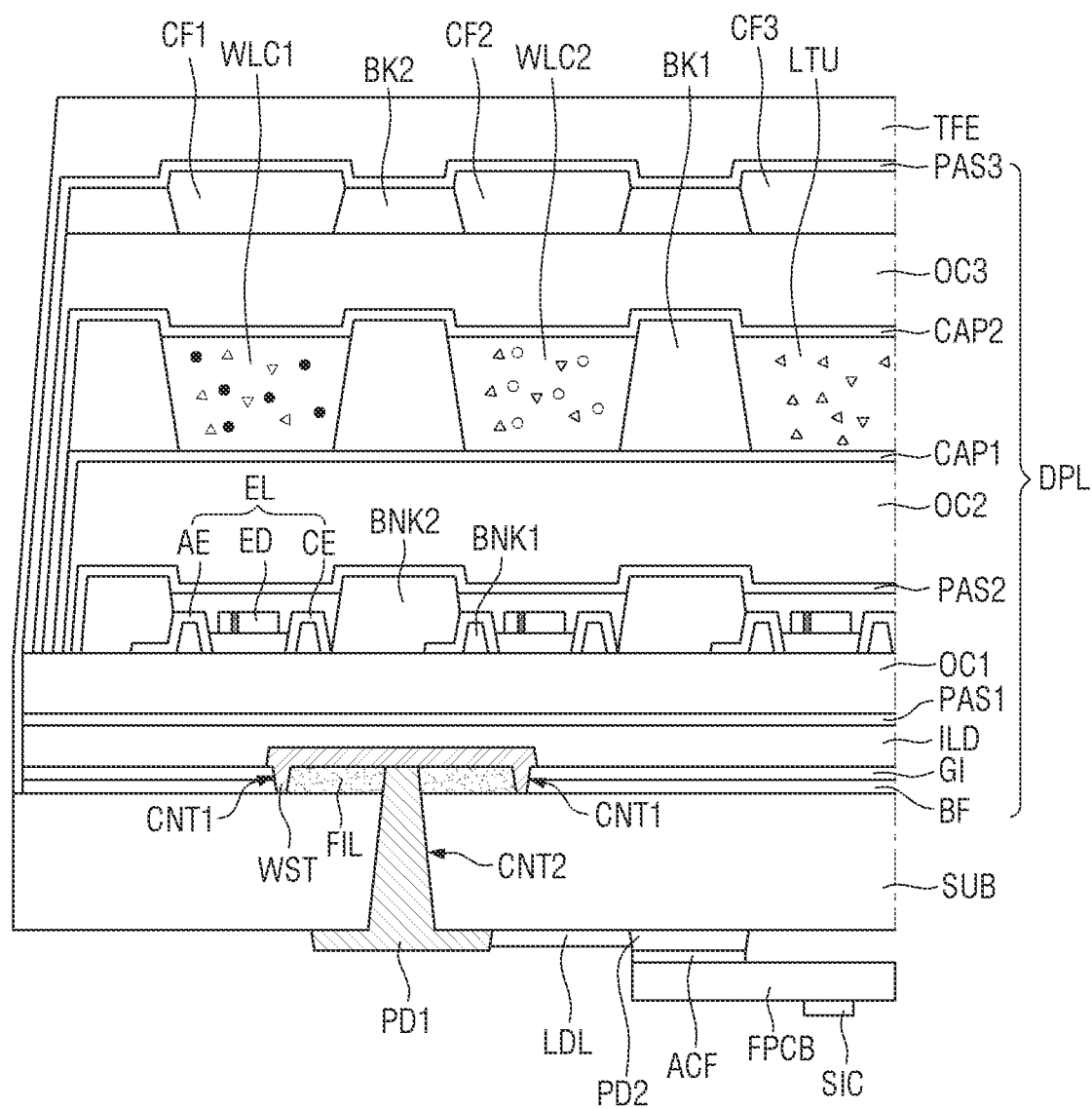

In FIG. 34, a first pad part PD1 may be located on the lower surface of the substrate SUB and connected to the etching stopper WST exposed through the second contact hole CNT2.

A second pad part PD2 may be located on the lower surface of the substrate SUB and spaced apart from the first pad part PD1. The second pad part PD2 may be connected to the first pad part PD1 through a lead line LDL. The second pad part PD2 may receive various voltages or signals from a flexible film FPCB and supply the voltages or signals to the first pad part PD1 and the etching stopper WST.

Figure 35:
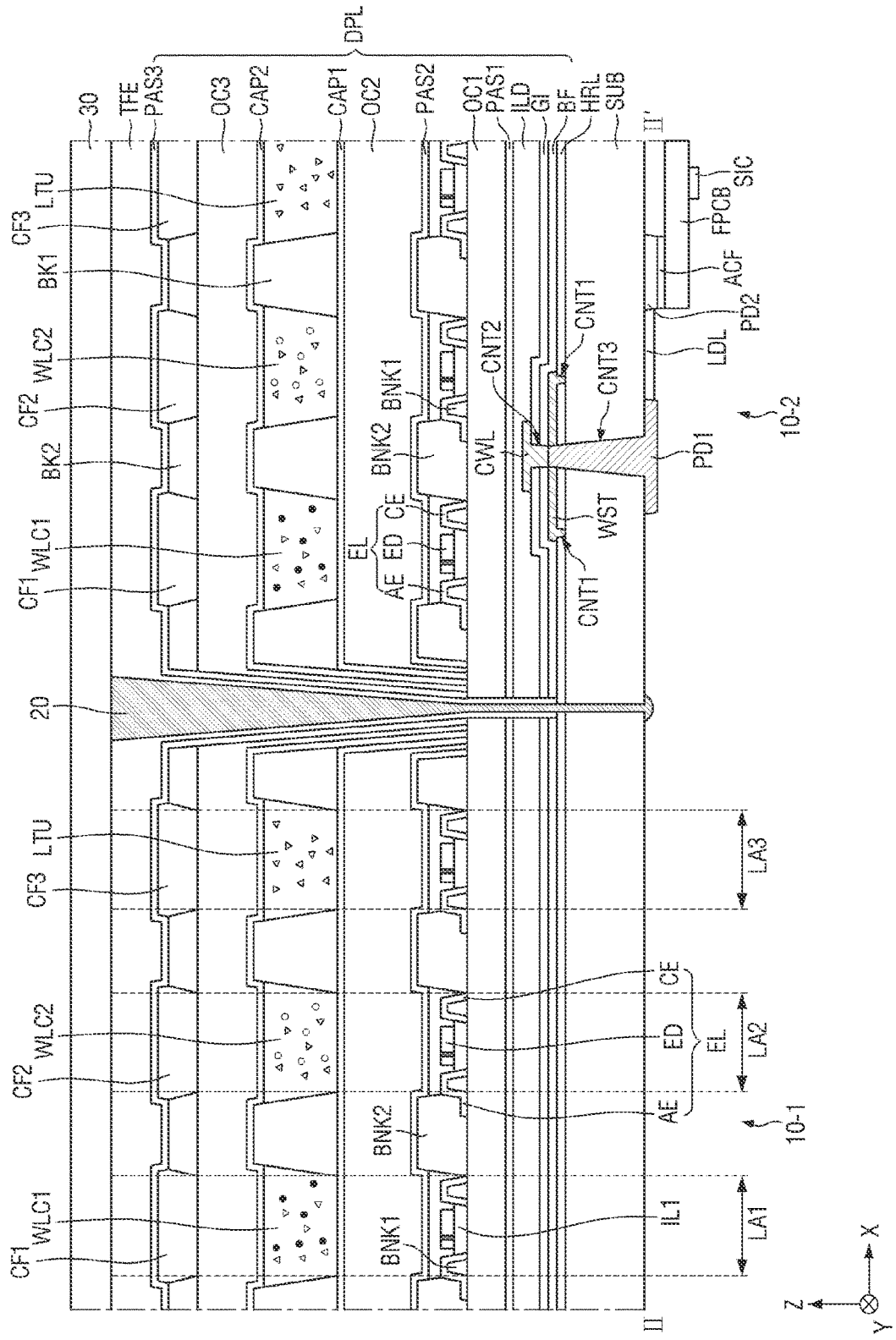
FIG. 35 is a cross-sectional view of an example taken along the line II-II' of FIG. 5.

FIG. 35 is a cross-sectional view of an example taken along the line II-II' of FIG. 5.

Referring to FIG. 35, a tiled display device TD may include a plurality of display devices 10, a coupling member 20, and a cover member 30.

Each of the display devices 10 may include a substrate SUB, a metal layer HRL, an etching stopper WST, a connection line CWL, a display layer DPL, an encapsulation layer TFE, a first pad part PD1, a second pad part PD2, a flexible film FPCB, and a source driver SIC.

The substrate SUB may be a base substrate or a base member and may be made of an insulating material such as polymer resin. For example, the substrate SUB may be a rigid substrate. For another example, the substrate SUB may be a flexible substrate that can be bent, folded, rolled, etc.

The metal layer HRL may be located on the substrate SUB. Thermal conductivity of the metal layer HRL may be higher than thermal conductivity of the substrate SUB. The metal layer HRL may dissipate heat of the substrate SUB. For example, when a laser is irradiated to the substrate SUB, the heat of the laser may be transferred from the substrate SUB to the metal layer HRL, and the substrate SUB may not be deformed by the heat.

The etching stopper WST may be located on the metal layer HRL and may contact the substrate SUB through a first contact hole CNT1. The first contact hole CNT1 may surround a third contact hole CNT3 at a distance in a plan view. The first contact hole CNT1 may pass through the metal layer HRL. A part of the etching stopper WST may be inserted into the first contact hole CNT1 to surround the first pad part PD1 inserted into a second contact hole CNT2 at a distance. For example, a part of the etching stopper WST, which is located on the metal layer HRL may control an etching depth in the third direction (Z-axis direction), and the other part of the etching stopper WST which is inserted into the first contact hole CNT1 may control an etching depth in the X-Y plane direction including the first direction (X-axis direction) and the second direction (Y-axis direction). Therefore, the etching stopper WST located on the metal layer HRL and inserted into the first contact hole CNT1 can prevent or reduce damage to a thin-film transistor layer TFTL during an etching process.

For example, the etching stopper WST may include, but is not limited to, at least one of molybdenum (Mo), aluminum (Al), chromium (Cr), tungsten (W), gold (Au), titanium (Ti), nickel (Ni), neodymium (Nd), or copper (Cu).

The connection line CWL may be located on a gate insulating layer GI and inserted into a second contact hole CNT2. The second contact hole CNT2 may pass through the gate insulating layer GI and a buffer layer BF. The connection line CWL may be connected to the first pad part PD1 inserted into the third contact hole CNT3. The connection line CWL may supply an electrical signal received from the first pad part PD1 to the thin-film transistor layer TFTL. The connection line CWL may be connected to a plurality of data lines to supply data voltages and may be connected to a plurality of scan lines to supply scan signals. The connection line CWL may be formed on the same layer and of the same material as gate electrodes GE of thin-film transistors TFT, but embodiments according to the present disclosure are not limited thereto.

The display layer DPL may be located on the substrate SUB. The display layer DPL may include the buffer layer BF, the thin-film transistor layer TFTL, a light emitting element layer EML, a wavelength conversion layer WLCL, and a color filter layer CFL illustrated in FIG. 3. The elements described above in FIG. 3 will not be described below.

The substrate SUB may include the third contact hole CNT3. For example, the third contact hole CNT3 may pass through the substrate SUB from a lower surface to an upper surface of the substrate SUB. The third contact hole CNT3 may overlap a display area DA. The first pad part PD1 inserted into the third contact hole CNT3 may be located in the display area DA. Therefore, each display device 10 may not include a separate pad part located at an outermost position, and a bezel area or a dead space of each display device 10 can be minimized. Because the first pad part PD1 is located on a lower surface of each display device 10, a gap between the display devices 10 can be further reduced compared with when a pad part is located at an outermost position on a substrate or when a flexible film is located on a side surface of the substrate.

The third contact hole CNT3 may additionally pass through the metal layer HRL and the etching stopper WST. The third contact hole CNT3 may be formed by performing a wet etching process or a dry etching process on the lower surface of the substrate SUB after the display layer DPL and the encapsulation layer TFE are stacked on the upper surface of the substrate SUB. For example, the substrate SUB and the metal layer HRL may be etched through a wet etching process, and the etching stopper WST may be etched through a dry etching process. However, embodiments according to the present disclosure are not limited thereto.

The first pad part PD1 may be located on the lower surface of the substrate SUB and may be connected to the connection line CWL exposed through the third contact hole CNT3.

FIGS. 36 through 41 are cross-sectional views illustrating a process of manufacturing a display device 10 of FIG. 35.

Figure 36:
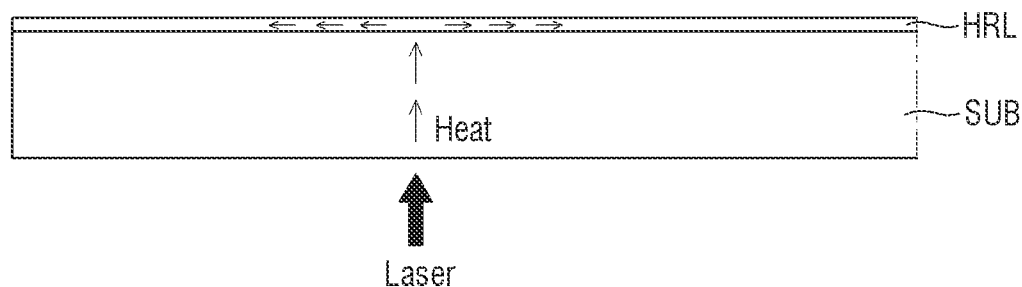
FIGS. 36 through 41 are cross-sectional views illustrating a process of manufacturing a display device of FIG. 35 according to some example embodiments.

In FIG. 36, a metal layer HRL may be located on a substrate SUB. Thermal conductivity of the metal layer HRL may be higher than thermal conductivity of the substrate SUB. The metal layer HRL may dissipate heat of the substrate SUB.

A laser may be irradiated to a lower surface of the substrate SUB. For example, when a laser is irradiated to the substrate SUB, the heat of the laser may be transferred from the substrate SUB to the metal layer HRL, and the substrate SUB may not be deformed by the heat. Therefore, the substrate SUB may not have a crater or a convex part.

Figure 37:
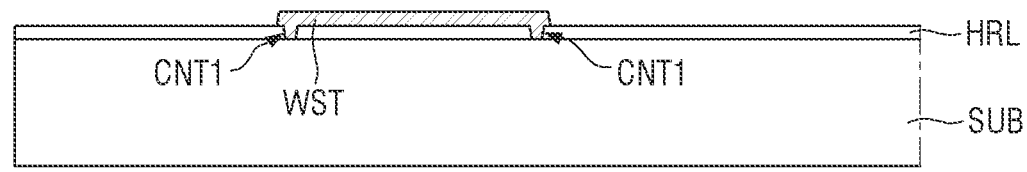

In FIG. 37, an etching stopper WST may be located on the metal layer HRL and may contact the substrate SUB through a first contact hole CNT1. Because the display device 10 prevents or reduces damage to the substrate SUB through the metal layer HRL, it can prevent or reduce instances of the etching stopper WST being split on the substrate SUB. By preventing or reducing defects in the etching stopper WST, the display device 10 can prevent or reduce damage to a thin-film transistor layer TFTL during an etching process.

The first contact hole CNT1 may surround a point (e.g., a set or predetermined point) at a distance in a plan view. Here, the point (e.g., the set or predetermined point) may correspond to a point where a third contact hole CNT3 is to be provided. The first contact hole CNT1 may be formed to pass through the metal layer HRL. A part of the etching stopper WST may be inserted into the first contact hole CNT1 to surround the point where the third contact hole CNT3 is to be provided at a distance.

Figure 38:
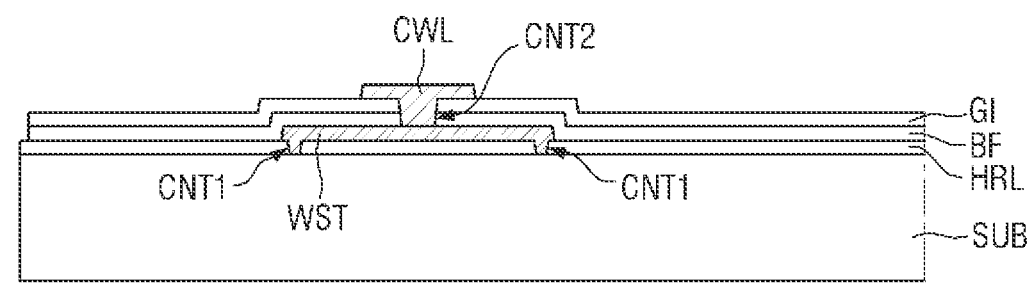

In FIG. 38, a buffer layer BF and a gate insulating layer GI may be sequentially stacked on the etching stopper WST. The buffer layer BF and the gate insulating layer GI may include a second contact hole CNT2.

A connection line CWL may be located on the gate insulating layer GI and inserted into the second contact hole CNT2 to contact the etching stopper WST. The connection line CWL may be formed on the same layer and of the same material as gate electrodes GE of thin-film transistors TFT, but embodiments according to the present disclosure are not limited thereto.

Figure 39:
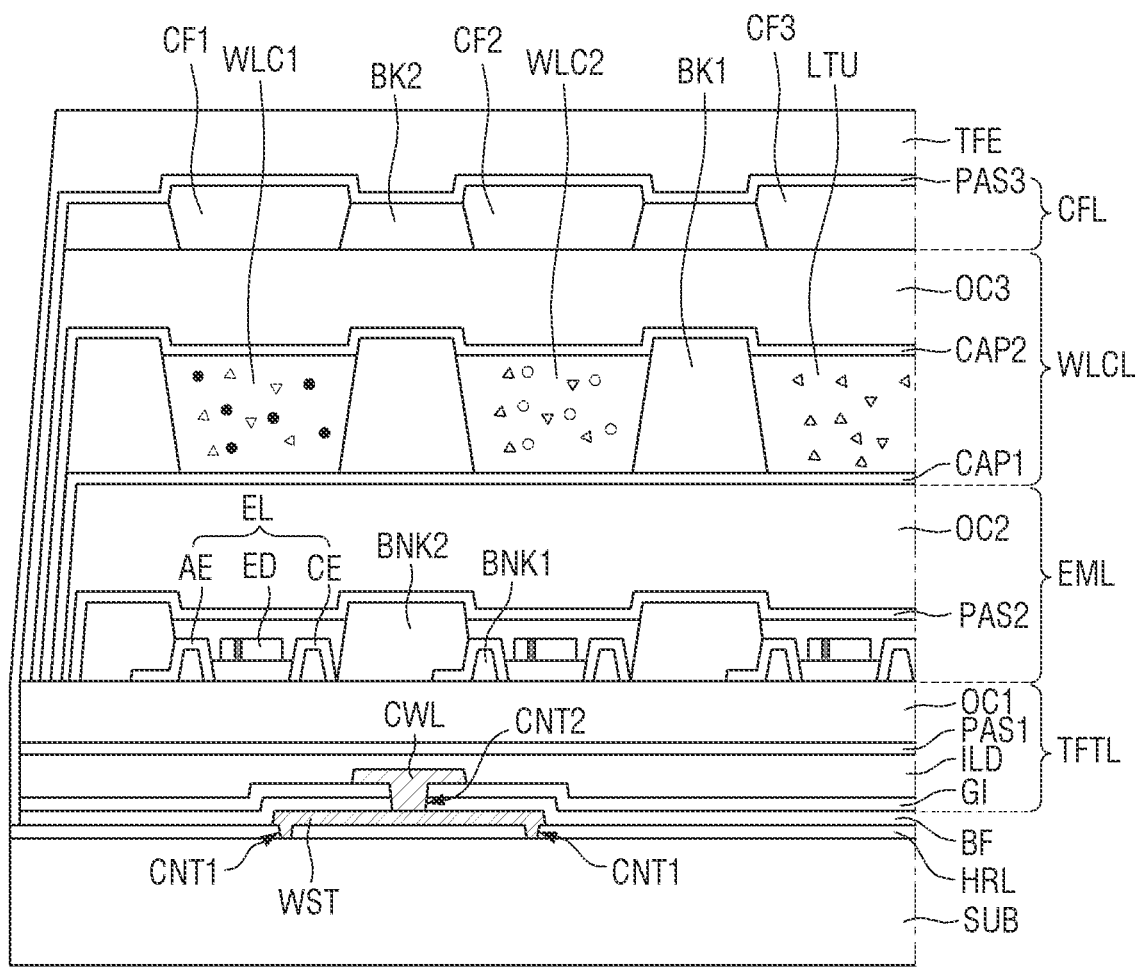

In FIG. 39, an interlayer insulating film ILD may cover the connection line CWL and the gate insulating layer GI, and a first passivation layer PAS1 and a first planarization layer OC1 may be sequentially stacked on the interlayer insulating film ILD.

A light emitting element layer EML, a wavelength conversion layer WLCL, a color filter layer CFL, and an encapsulation layer TFE may be sequentially stacked on the thin-film transistor layer TFTL.

Figure 40:
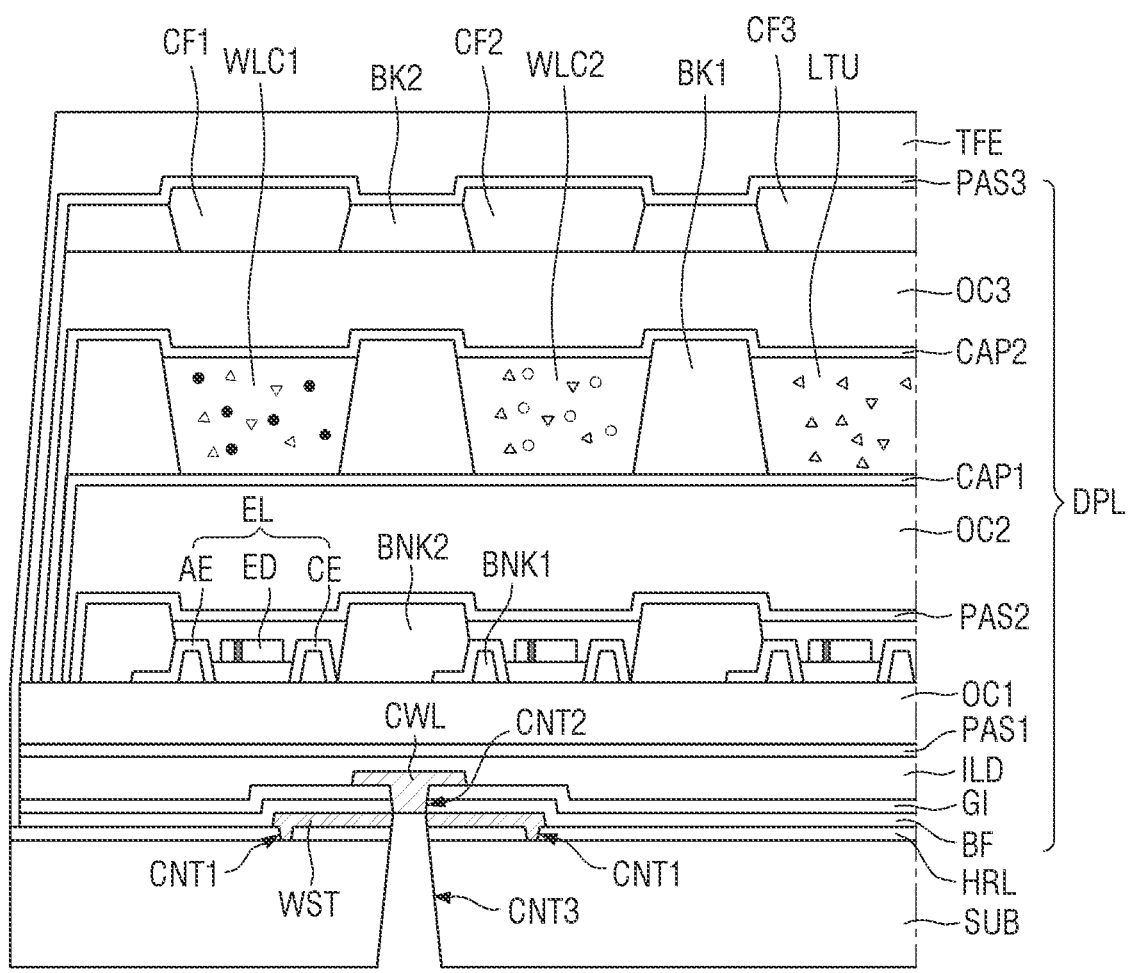

In FIG. 40, the third contact hole CNT3 may pass through the substrate SUB, the metal layer HRL, and the etching stopper WST from the lower surface of the substrate SUB.

A part of the etching stopper WST, which is located on the metal layer HRL may control an etching depth in the third direction (Z-axis direction), and the other part of the etching stopper WST which is inserted into the first contact hole CNT1 may control an etching depth in the X-Y plane direction including the first direction (X-axis direction) and the second direction (Y-axis direction). Therefore, the etching stopper WST located on the metal layer HRL and inserted into the first contact hole CNT1 can prevent or reduce damage to the thin-film transistor layer TFTL during an etching process.

For example, the substrate SUB and the metal layer HRL may be etched through a wet etching process, and the etching stopper WST may be etched through a dry etching process. However, embodiments according to the present disclosure are not limited thereto.

Figure 41:
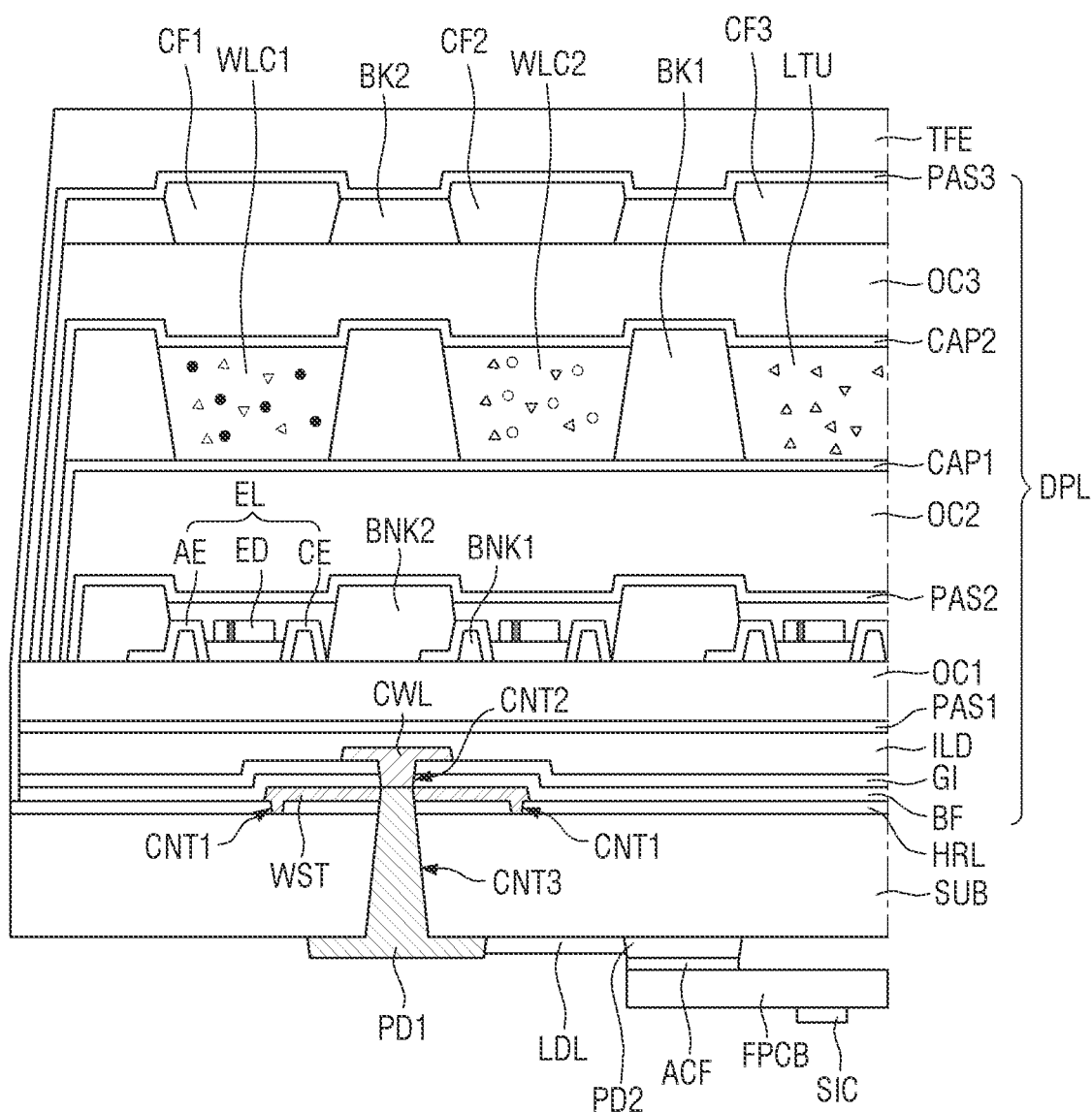

In FIG. 41, a first pad part PD1 may be located on the lower surface of the substrate SUB and connected to the connection line CWL exposed through the third contact hole CNT3.

A second pad part PD2 may be located on the lower surface of the substrate SUB and spaced apart from the first pad part PD1. The second pad part PD2 may be connected to the first pad part PD1 through a lead line LDL. The second pad part PD2 may receive various voltages or signals from a flexible film FPCB and supply the voltages or signals to the first pad part PD1 and the connection line CWL.

Figure 42:
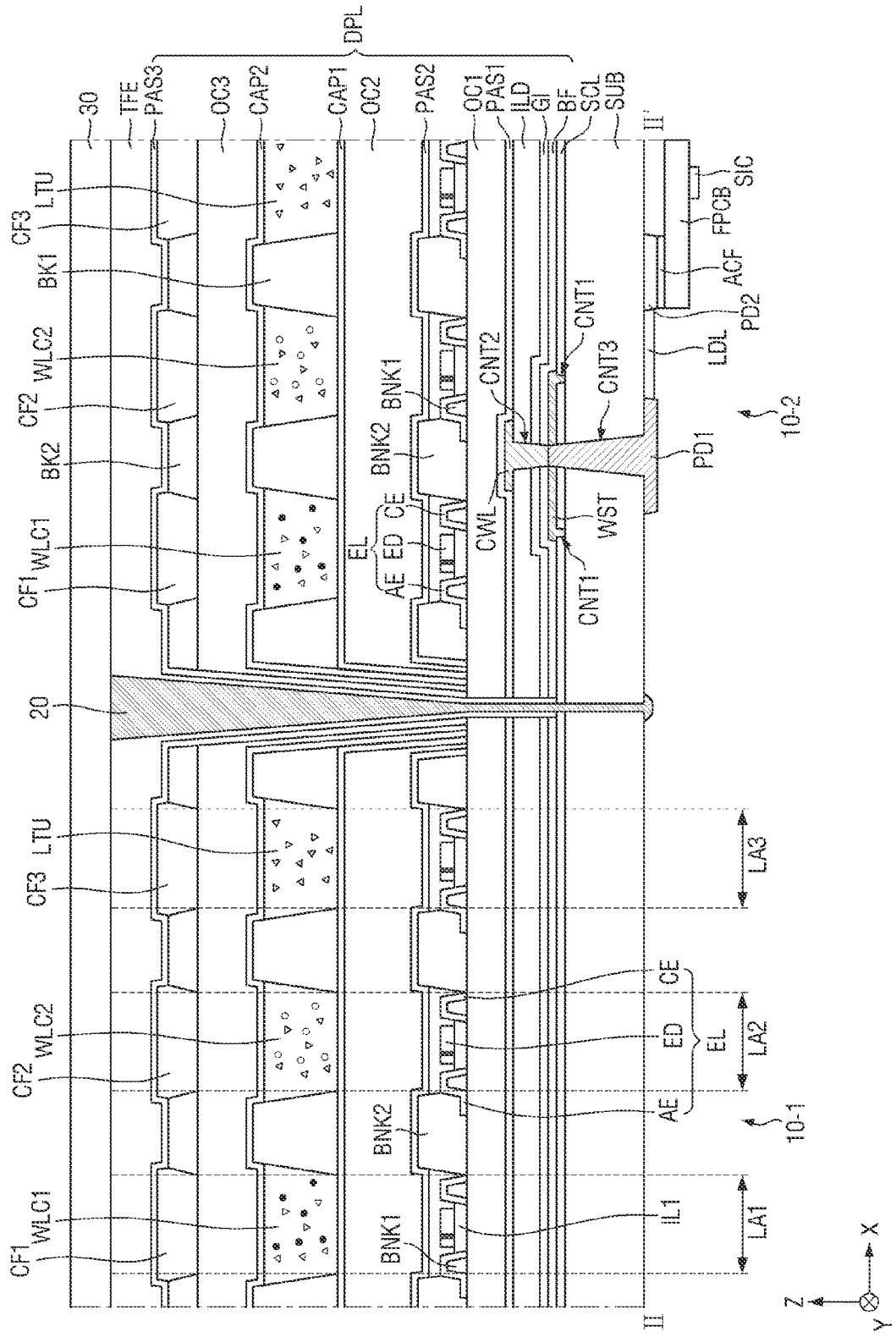
FIG. 42 is a cross-sectional view of an example taken along the line II-II' of FIG. 5.

FIG. 42 is a cross-sectional view of an example taken along the line II-II' of FIG. 5.

Referring to FIG. 42, a tiled display device TD may include a plurality of display devices 10, a coupling member 20, and a cover member 30.

Each of the display devices 10 may include a substrate SUB, a sacrificial layer SCL, an etching stopper WST, a connection line CWL, a display layer DPL, an encapsulation layer TFE, a first pad part PD1, a second pad part PD2, a flexible film FPCB, and a source driver SIC.

The substrate SUB may be a base substrate or a base member and may be made of an insulating material such as polymer resin. For example, the substrate SUB may be a rigid substrate. For another example, the substrate SUB may be a flexible substrate that can be bent, folded, rolled, etc.

The sacrificial layer SCL may be located on the substrate SUB. The sacrificial layer SCL may include an inorganic material. For example, the sacrificial layer SCL may include at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride. The sacrificial layer SCL may dissipate heat of the substrate SUB. For example, when a laser is irradiated to the substrate SUB, the heat of the laser may be transferred from the substrate SUB to the sacrificial layer SCL, and the substrate SUB may not be deformed by the heat.

The etching stopper WST may be located on the sacrificial layer SCL and may contact the substrate SUB through a first contact hole CNT1. The first contact hole CNT1 may surround a third contact hole CNT3 at a distance in a plan view. The first contact hole CNT1 may pass through the sacrificial layer SCL. A part of the etching stopper WST may be inserted into the first contact hole CNT1 to surround the first pad part PD1 inserted into a second contact hole CNT2 at a distance. For example, a part of the etching stopper WST, which is located on the sacrificial layer SCL may control an etching depth in the third direction (Z-axis direction), and the other part of the etching stopper WST which is inserted into the first contact hole CNT1 may control an etching depth in the X-Y plane direction including the first direction (X-axis direction) and the second direction (Y-axis direction). Therefore, the etching stopper WST located on the sacrificial layer SCL and inserted into the first contact hole CNT1 can prevent or reduce damage to a thin-film transistor layer TFTL during an etching process.

For example, the etching stopper WST may include, but is not limited to, at least one of molybdenum (Mo), aluminum (Al), chromium (Cr), tungsten (W), gold (Au), titanium (Ti), nickel (Ni), neodymium (Nd), or copper (Cu).

The connection line CWL may be located on an interlayer insulating film ILD and inserted into the second contact hole CNT2. The second contact hole CNT2 may pass through the interlayer insulating film ILD, a gate insulating layer GI, and a buffer layer BF. The connection line CWL may be connected to the first pad part PD1 inserted into the third contact hole CNT3. The connection line CWL may supply an electrical signal received from the first pad part PD1 to the thin-film transistor layer TFTL. The connection line CWL may be connected to a plurality of data lines to supply data voltages and may be connected to a plurality of scan lines to supply scan signals. The connection line CWL may be formed on the same layer and of the same material as connection electrodes CNE of the thin-film transistor layer TFTL, but embodiments according to the present disclosure are not limited thereto.

The display layer DPL may be located on the substrate SUB. The display layer DPL may include the buffer layer BF, the thin-film transistor layer TFTL, a light emitting element layer EML, a wavelength conversion layer WLCL, and a color filter layer CFL illustrated in FIG. 3. The elements described above in FIG. 3 will not be described below.

The substrate SUB may include the third contact hole CNT3. For example, the third contact hole CNT3 may pass through the substrate SUB from a lower surface to an upper surface of the substrate SUB. The third contact hole CNT3 may overlap a display area DA. The first pad part PD1 inserted into the third contact hole CNT3 may be located in the display area DA. Therefore, each display device 10 may not include a separate pad part located at an outermost position, and a bezel area or a dead space of each display device 10 can be minimized. Because the first pad part PD1 is located on a lower surface of each display device 10, a gap between the display devices 10 can be further reduced compared with when a pad part is located at an outermost position on a substrate or when a flexible film is located on a side surface of the substrate.

The third contact hole CNT3 may additionally pass through the sacrificial layer SCL and the etching stopper WST. The third contact hole CNT3 may be formed by performing a wet etching process or a dry etching process on the lower surface of the substrate SUB after the display layer DPL and the encapsulation layer TFE are stacked on the upper surface of the substrate SUB. For example, the substrate SUB and the sacrificial layer SCL may be etched through a wet etching process, and the etching stopper WST may be etched through a dry etching process. However, embodiments according to the present disclosure are not limited thereto.

The first pad part PD1 may be located on the lower surface of the substrate SUB and may be connected to the connection line CWL exposed through the third contact hole CNT3.

FIGS. 43 through 48 are cross-sectional views illustrating a process of manufacturing a display device 10 of FIG. 42.

Figure 43:
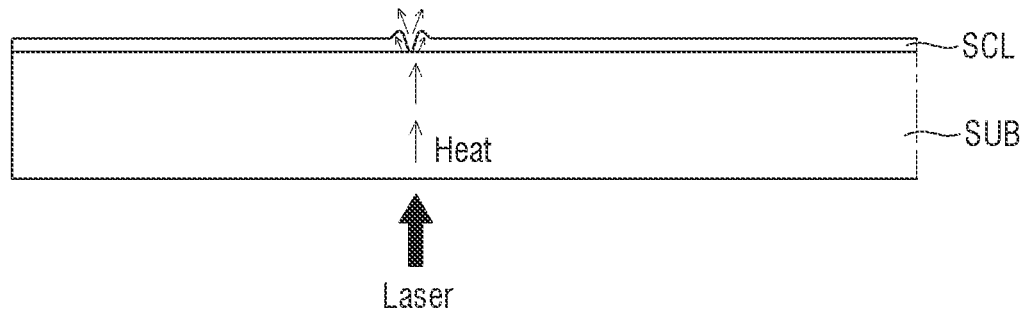
FIGS. 43 through 48 are cross-sectional views illustrating a process of manufacturing a display device of FIG. 42 according to some example embodiments.

In FIG. 43, a sacrificial layer SCL may be located on a substrate SUB. The sacrificial layer SCL may include an inorganic material. For example, the sacrificial layer SCL may include at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride. The sacrificial layer SCL may dissipate heat of the substrate SUB.

A laser may be irradiated to a lower surface of the substrate SUB. For example, when a laser is irradiated to the substrate SUB, the heat of the laser may be transferred from the substrate SUB to the sacrificial layer SCL, and the substrate SUB may not be deformed by the heat. Therefore, the substrate SUB may not have a crater or a convex part.

Figure 44:
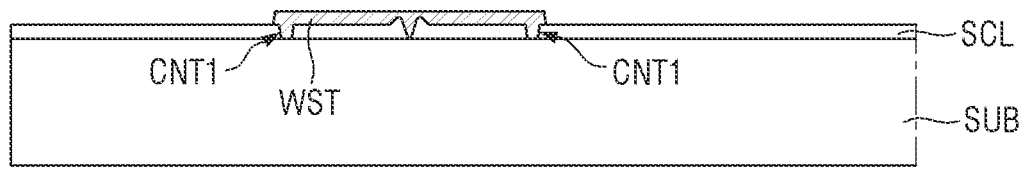

In FIG. 44, an etching stopper WST may be located on the sacrificial layer SCL and may contact the substrate SUB through a first contact hole CNT1. Because the display device 10 prevents or reduces damage to the substrate SUB through the sacrificial layer SCL, it can prevent or reduce splitting of the etching stopper WST on the substrate SUB. By preventing or reducing defects in the etching stopper WST, the display device 10 can prevent or reduce damage to a thin-film transistor layer TFTL during an etching process.

The first contact hole CNT1 may surround a point (e.g., a set or predetermined point) at a distance in a plan view. Here, the point (e.g., the set or predetermined point) may correspond to a point where a third contact hole CNT3 is to be provided. The first contact hole CNT1 may be formed to pass through the sacrificial layer SCL. A part of the etching stopper WST may be inserted into the first contact hole CNT1 to surround the point where the third contact hole CNT3 is to be provided at a distance.

Figure 45:
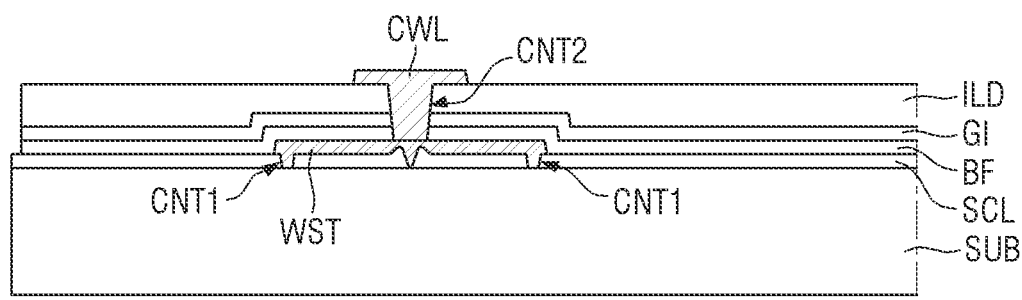

In FIG. 45, a buffer layer BF, a gate insulating layer GI, and an interlayer insulating film ILD may be sequentially stacked on the etching stopper WST. The buffer layer BF, the gate insulating layer GI, and the interlayer insulating film ILD may include a second contact hole CNT2.

A connection line CWL may be located on the interlayer insulating film ILD and inserted into the second contact hole CNT2 to contact the etching stopper WST. The connection line CWL may be formed on the same layer and of the same material as connection electrodes CNE of the thin-film transistor layer TFTL, but embodiments according to the present disclosure are not limited thereto.

Figure 46:
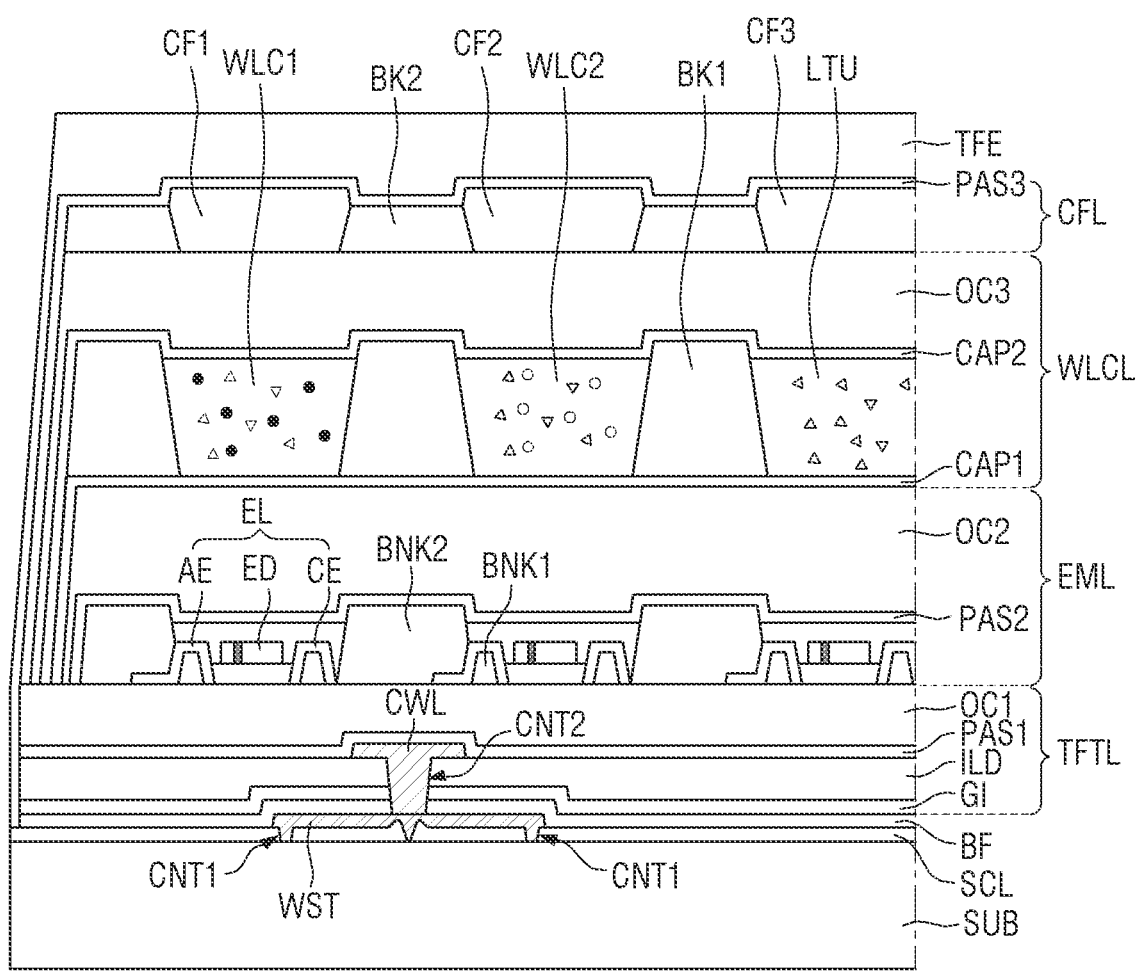

In FIG. 46, a first passivation layer PAS1 may cover the connection line CWL and the interlayer insulating film ILD, and a first planarization layer OC1 may cover the first passivation layer PAS1.

A light emitting element layer EML, a wavelength conversion layer WLCL, a color filter layer CFL, and an encapsulation layer TFE may be sequentially stacked on the thin-film transistor layer TFTL.

Figure 47:
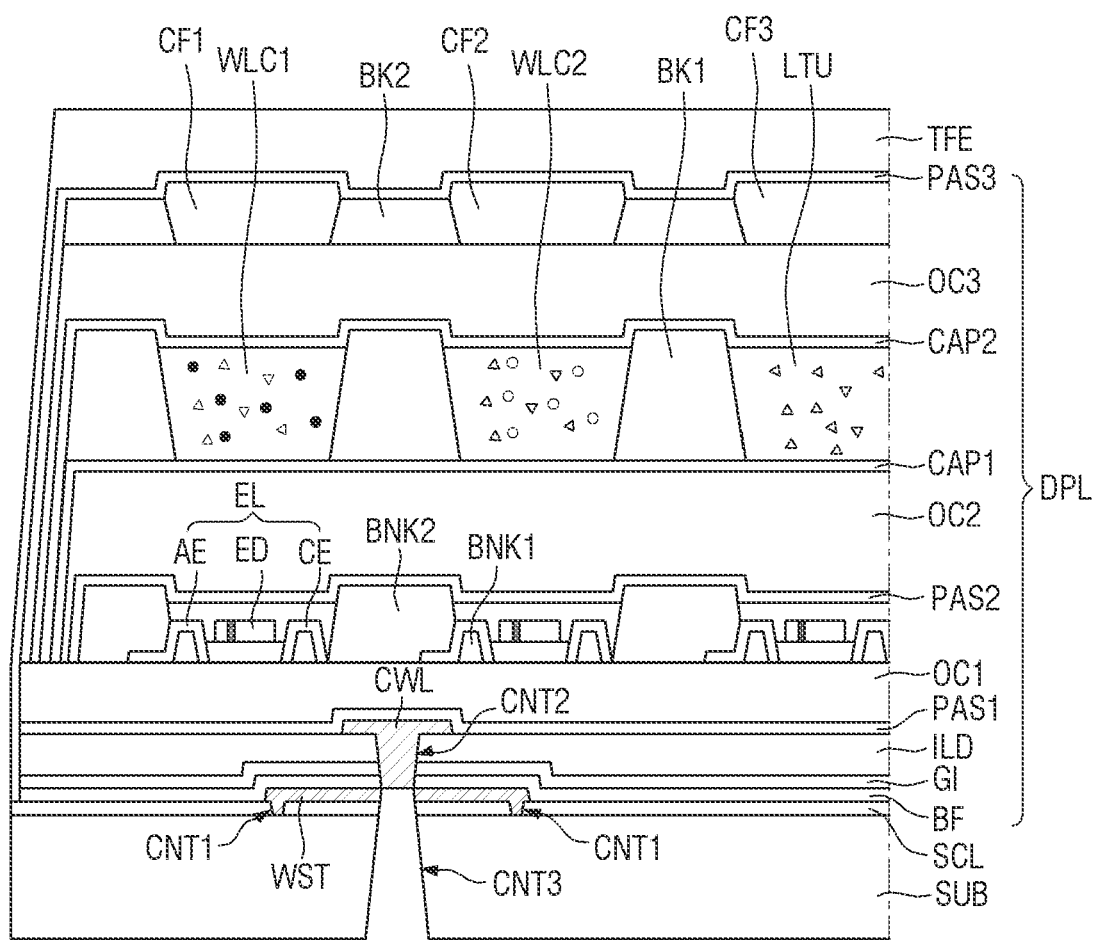

In FIG. 47, the third contact hole CNT3 may pass through the substrate SUB, the sacrificial layer SCL, and the etching stopper WST from the lower surface of the substrate SUB.

A part of the etching stopper WST, which is located on the sacrificial layer SCL may control an etching depth in the third direction (Z-axis direction), and the other part of the etching stopper WST which is inserted into the first contact hole CNT1 may control an etching depth in the X-Y plane direction including the first direction (X-axis direction) and the second direction (Y-axis direction). Therefore, the etching stopper WST located on the sacrificial layer SCL and inserted into the first contact hole CNT1 can prevent or reduce damage to the thin-film transistor layer TFTL during an etching process.

For example, the substrate SUB and the sacrificial layer SCL may be etched through a wet etching process, and the etching stopper WST may be etched through a dry etching process. However, embodiments according to the present disclosure are not limited thereto.

Figure 48:
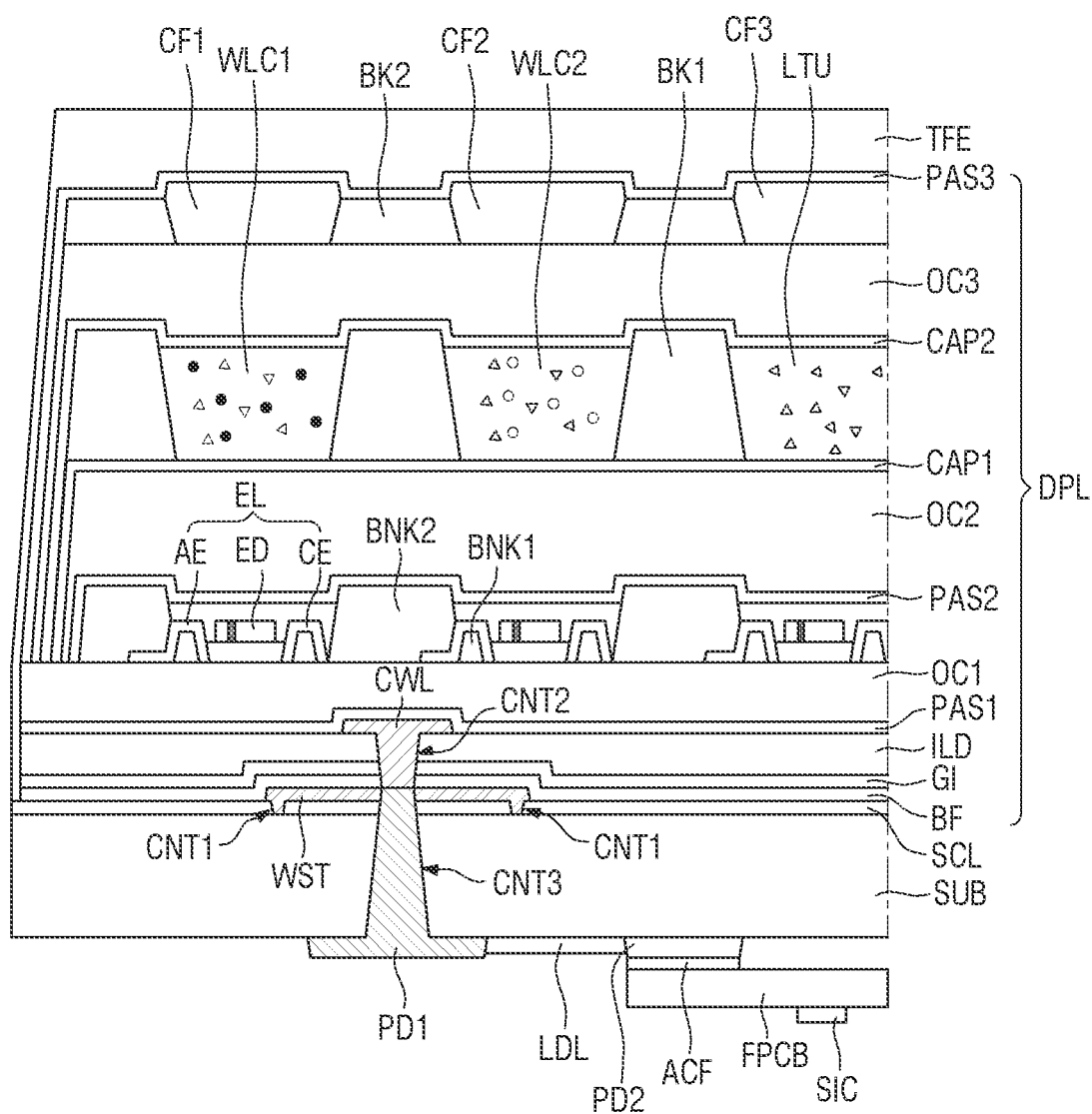

In FIG. 48, a first pad part PD1 may be located on the lower surface of the substrate SUB and connected to the connection line CWL exposed through the third contact hole CNT3.

A second pad part PD2 may be located on the lower surface of the substrate SUB and spaced apart from the first pad part PD1. The second pad part PD2 may be connected to the first pad part PD1 through a lead line LDL. The second pad part PD2 may receive various voltages or signals from a flexible film FPCB and supply the voltages or signals to the first pad part PD1 and the connection line CWL.

Figure 49:
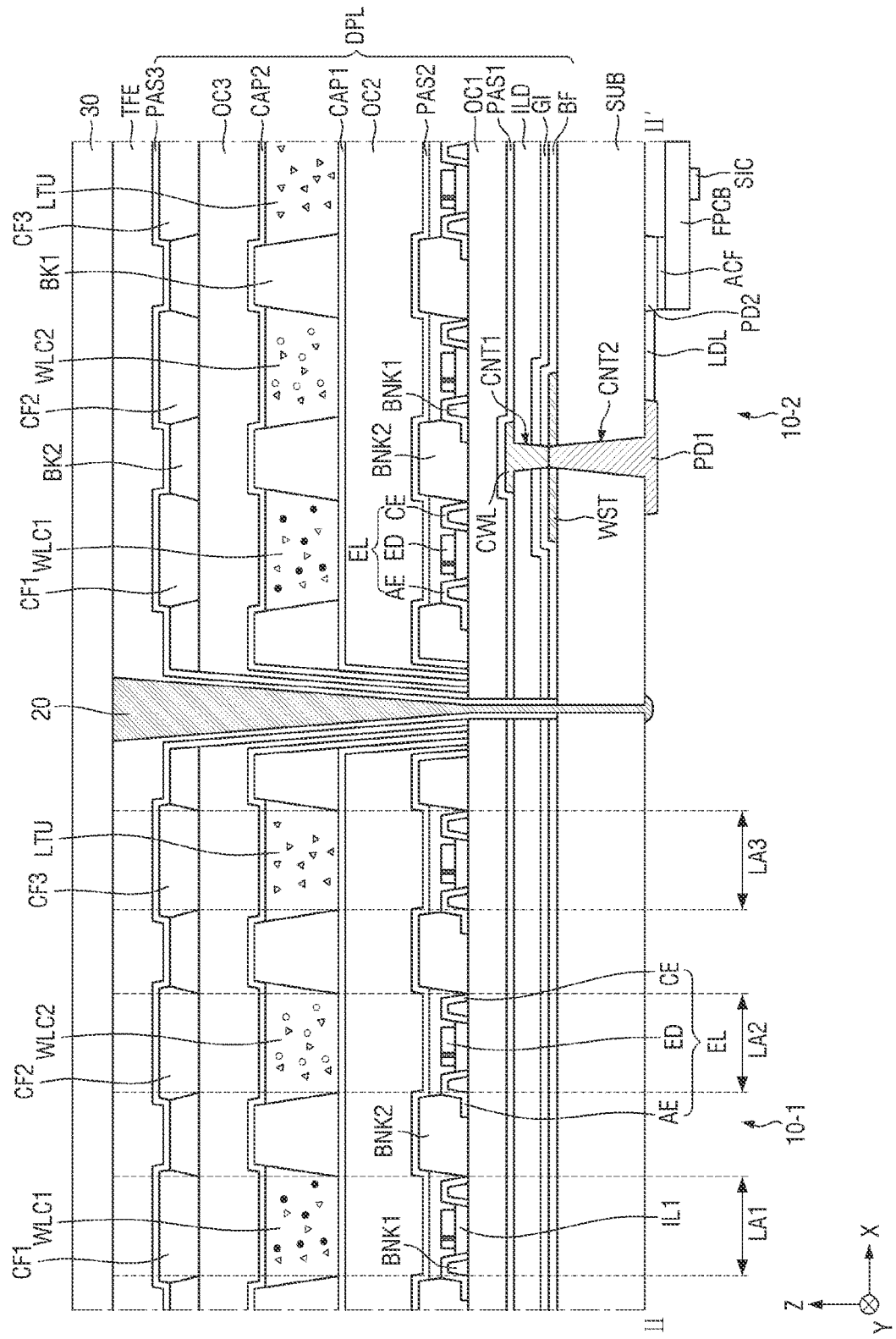
FIG. 49 is a cross-sectional view of an example taken along the line II-II' of FIG. 5.

FIG. 49 is a cross-sectional view of an example taken along the line II-II' of FIG. 5.

Referring to FIG. 49, a tiled display device TD may include a plurality of display devices 10, a coupling member 20, and a cover member 30.

Each of the display devices 10 may include a substrate SUB, an etching stopper WST, a connection line CWL, a display layer DPL, an encapsulation layer TFE, a first pad part PD1, a second pad part PD2, a flexible film FPCB, and a source driver SIC.

The substrate SUB may be a base substrate or a base member and may be made of an insulating material such as polymer resin. For example, the substrate SUB may be a rigid substrate. For another example, the substrate SUB may be a flexible substrate that can be bent, folded, rolled, etc.

The etching stopper WST may be located on the substrate SUB. For example, the etching stopper WST may control an etching depth in the third direction (Z-axis direction). Therefore, the etching stopper WST can prevent or reduce damage to a thin-film transistor layer TFTL during an etching process.

For example, the etching stopper WST may include, but is not limited to, at least one of molybdenum (Mo), aluminum (Al), chromium (Cr), tungsten (W), gold (Au), titanium (Ti), nickel (Ni), neodymium (Nd), or copper (Cu).

The connection line CWL may be located on an interlayer insulating film ILD and inserted into a first contact hole CNT1. The first contact hole CNT1 may pass through the interlayer insulating film ILD, a gate insulating layer GI, and a buffer layer BF. The connection line CWL may be connected to the first pad part PD1 inserted into a second contact hole CNT2. The connection line CWL may supply an electrical signal received from the first pad part PD1 to the thin-film transistor layer TFTL. The connection line CWL may be connected to a plurality of data lines to supply data voltages and may be connected to a plurality of scan lines to supply scan signals. The connection line CWL may be formed on the same layer and of the same material as connection electrodes CNE of the thin-film transistor layer TFTL, but embodiments according to the present disclosure are not limited thereto.

The display layer DPL may be located on the substrate SUB. The display layer DPL may include the buffer layer BF, the thin-film transistor layer TFTL, a light emitting element layer EML, a wavelength conversion layer WLCL, and a color filter layer CFL illustrated in FIG. 3. The elements described above in FIG. 3 will not be described below.

The substrate SUB may include the second contact hole CNT2. For example, the second contact hole CNT2 may pass through the substrate SUB from a lower surface to an upper surface of the substrate SUB. The second contact hole CNT2 may overlap a display area DA. The first pad part PD1 inserted into the second contact hole CNT2 may be located in the display area DA. Therefore, each display device 10 may not include a separate pad part located at an outermost position, and a bezel area or a dead space of each display device 10 can be minimized. Because the first pad part PD1 is located n a lower surface of each display device 10, a gap between the display devices 10 can be further reduced compared with when a pad part is located at an outermost position on a substrate or when a flexible film is located on a side surface of the substrate.

The second contact hole CNT2 may additionally pass through the etching stopper WST. The second contact hole CNT2 may be formed by performing a wet etching process or a dry etching process on the lower surface of the substrate SUB after the display layer DPL and the encapsulation layer TFE are stacked on the upper surface of the substrate SUB. For example, the substrate SUB may be etched through a wet etching process, and the etching stopper WST may be etched through a dry etching process. However, embodiments according to the present disclosure are not limited thereto.

The first pad part PD1 may be located on the lower surface of the substrate SUB and may be connected to the connection line CWL exposed through the second contact hole CNT2.

FIGS. 50 through 54 are cross-sectional views illustrating a process of manufacturing a display device 10 of FIG. 49.

Figure 50:
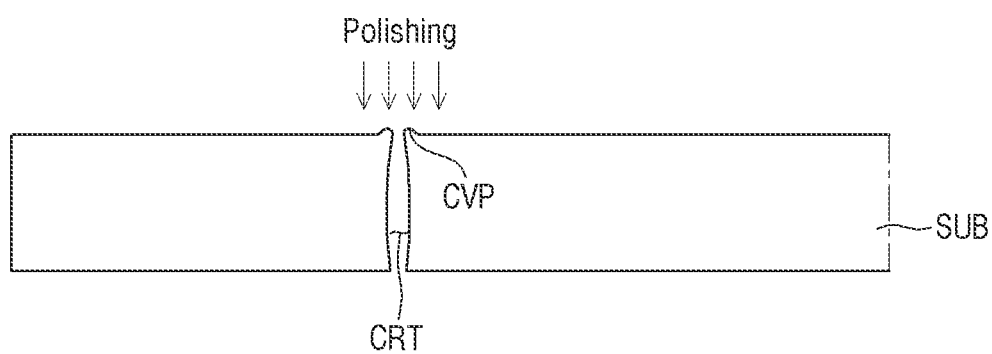
FIGS. 50 through 54 are cross-sectional views illustrating a process of manufacturing a display device of FIG. 49 according to some example embodiments.

In FIG. 50, a laser may be irradiated to a lower surface of a substrate SUB. A part of the substrate SUB exposed to the laser may be deformed by excessive heat. For example, a part of the substrate SUB may be melted by the heat of the laser, and a crater CRT and convex parts CVP may be formed at a point where the heat of the laser is concentrated. The sizes and shapes of the crater CRT and the convex parts CVP are not limited to those illustrated in FIG. 50.

An upper surface of the substrate SUB may be polished through a polishing process. The convex parts CVP may be removed by the polishing process, and the upper surface of the substrate SUB excluding the crater CRT may be flattened. Through the polishing process, the display device 10 can prevent or reduce splitting of an etching stopper WST on the substrate SUB. By preventing or reducing defects in the etching stopper WST, the display device 10 can prevent or reduce damage to a thin-film transistor layer TFTL during an etching process.

Figure 51:
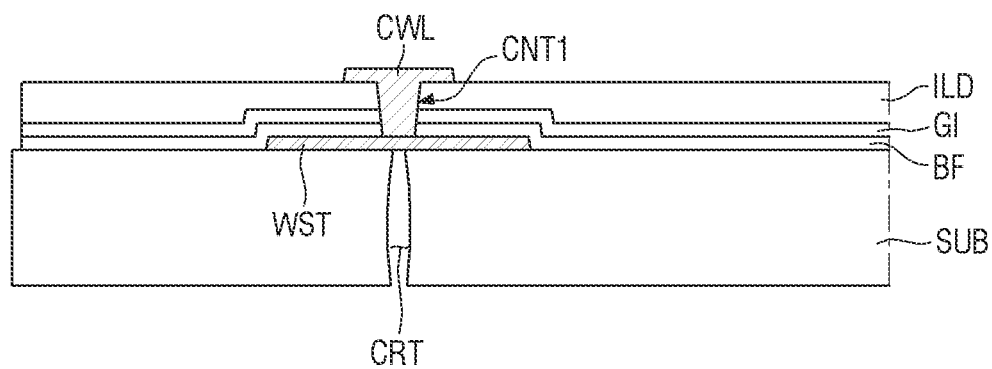

In FIG. 51, the etching stopper WST may be located on the substrate SUB. The etching stopper WST may cover a part of the upper surface of the substrate SUB including the crater CRT.

A buffer layer BF, a gate insulating layer GI, and an interlayer insulating film ILD may be sequentially stacked on the etching stopper WST. The buffer layer BF, the gate insulating layer GI, and the interlayer insulating film ILD may include a first contact hole CNT1.

A connection line CWL may be located on the interlayer insulating film ILD and inserted into the first contact hole CNT1 to contact the etching stopper WST. The connection line CWL may be formed on the same layer and of the same material as connection electrodes CNE of the thin-film transistor layer TFTL, but embodiments according to the present disclosure are not limited thereto.

Figure 52:
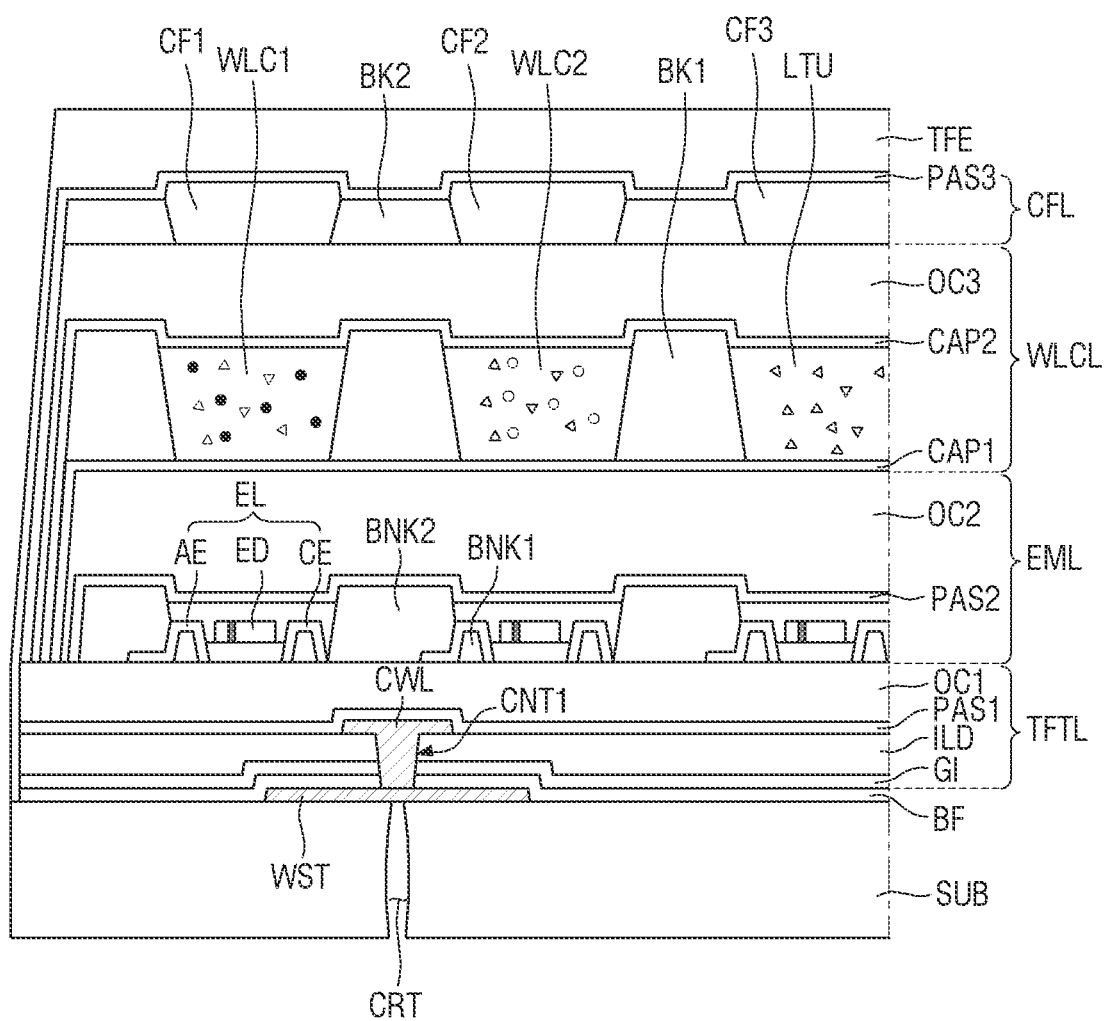

In FIG. 52, a first passivation layer PAS1 may cover the connection line CWL and the interlayer insulating film ILD, and a first planarization layer OC1 may cover the first passivation layer PAS1.

A light emitting element layer EML, a wavelength conversion layer WLCL, a color filter layer CFL, and an encapsulation layer TFE may be sequentially stacked on the thin-film transistor layer TFTL.

Figure 53:
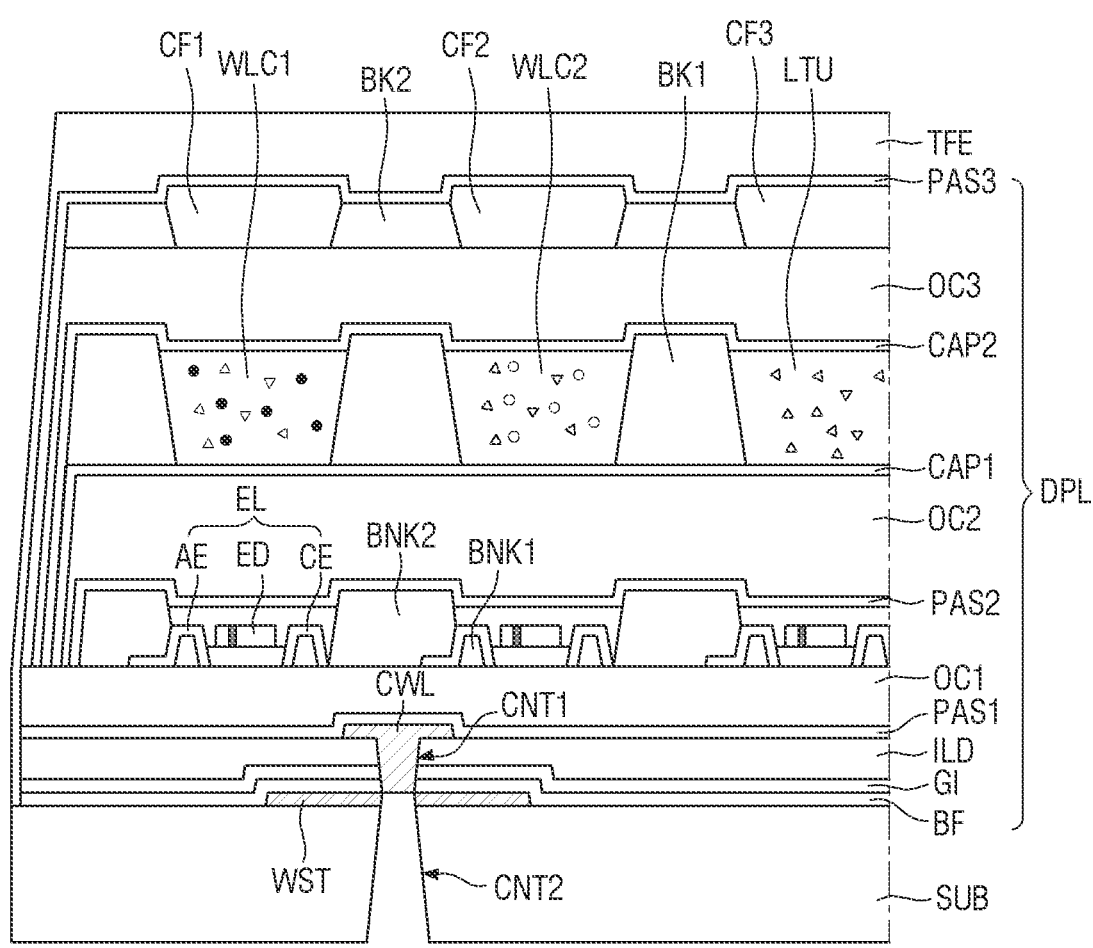

In FIG. 53, a second contact hole CNT2 may pass through the substrate SUB and the etching stopper WST from the lower surface of the substrate SUB.

The etching stopper WST located on the substrate SUB may control an etching depth in the third direction (Z-axis direction). Therefore, the etching stopper WST can prevent or reduce damage to the thin-film transistor layer TFTL during an etching process.

For example, the substrate SUB may be etched through a wet etching process, and the etching stopper WST may be etched through a dry etching process. However, embodiments according to the present disclosure are not limited thereto.

Figure 54:
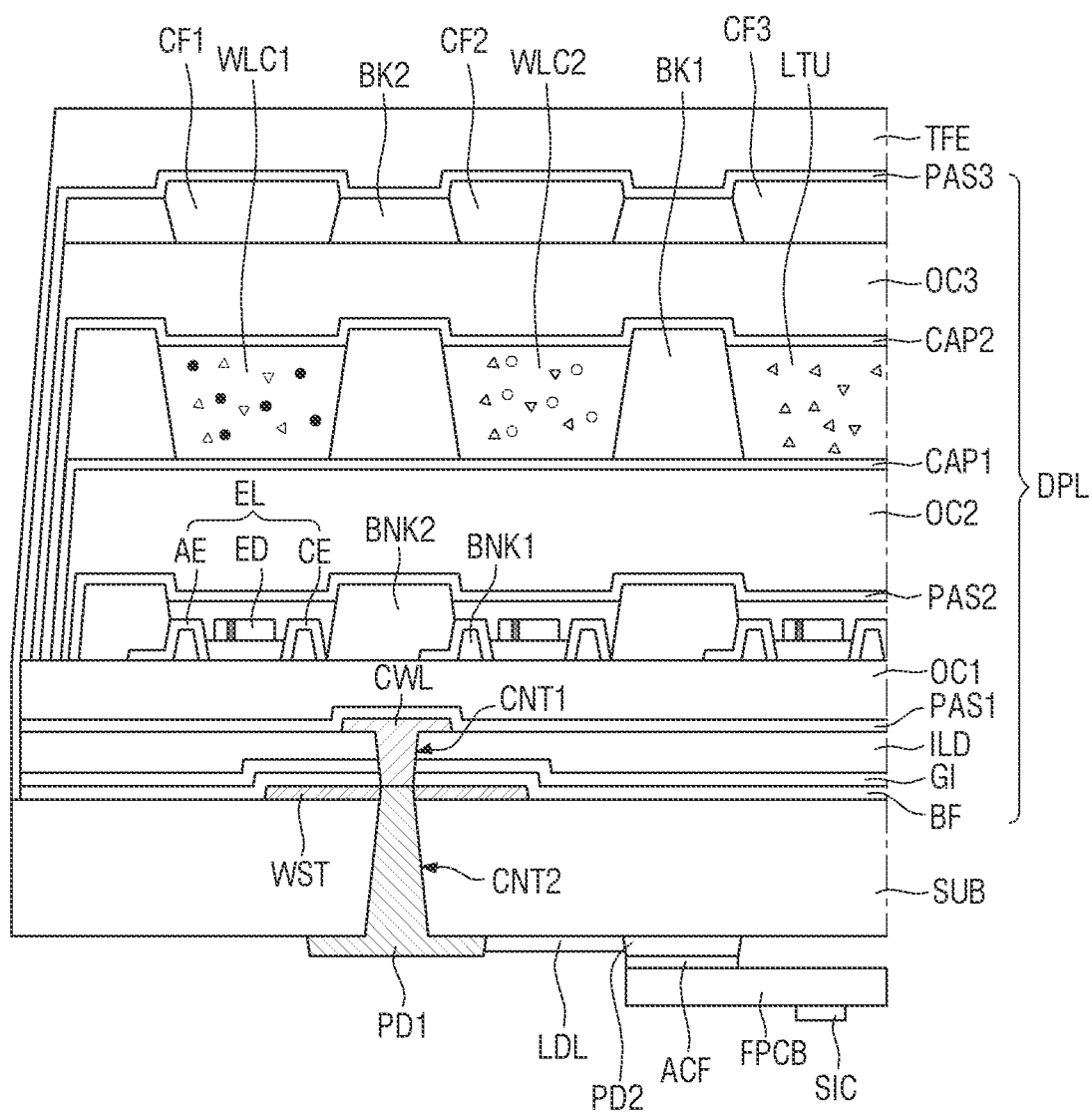

In FIG. 54, a first pad part PD1 may be located on the lower surface of the substrate SUB and connected to the connection line CWL exposed through the second contact hole CNT2.

A second pad part PD2 may be located on the lower surface of the substrate SUB and spaced apart from the first pad part PD1. The second pad part PD2 may be connected to the first pad part PD1 through a lead line LDL. The second pad part PD2 may receive various voltages or signals from a flexible film FPCB and supply the voltages or signals to the first pad part PD1 and the connection line CWL.

In a display device and a tiled display device including the same according to some example embodiments, a plurality of insulating layers are stacked to a thickness (e.g., a set or predetermined thickness) on a substrate. Therefore, splitting of the top of the insulating layers can be prevented or reduced. Accordingly, the display device and the tiled display device including the same can prevent or reduce damage to a thin-film transistor layer during an etching process by preventing or reducing instances of splitting of an etching stopper on the insulating layers.

In a display device and a tiled display device including the same according to some example embodiments, a pad part is located on a lower surface of a substrate, thereby minimizing the area of a non-display area of the display device. Therefore, the tiled display device can prevent or reduce the visibility or perceptibility of a non-display area or a boundary part between a plurality of display devices by minimizing or reducing a gap between the display devices.

However, the characteristics of embodiments according to the present disclosure are not restricted to the one set forth herein. The above and other effects of the embodiments will become more apparent to one of daily skill in the art to which the embodiments pertain by referencing the claims and their equivalents.

What is claimed is:

1. A display device comprising:
    a substrate comprising a first contact hole;
    a thin-film transistor layer on a first surface of the substrate and comprising a plurality of insulating layers and a thin-film transistor;
    an etching stopper on one or more of the insulating layers and contacting the substrate through a second contact hole surrounding the first contact hole in a plan view;
    a connection line on the etching stopper; and
    a pad part on a second surface of the substrate opposite the first surface of the substrate and connected to the connection line through the first contact hole,
    wherein the first contact hole and the second contact hole are spaced apart from each other in a common layer in a plan view.

2. The display device of claim 1, wherein the insulating layers comprise:
    a gate insulating layer on the substrate;
    an interlayer insulating film on the gate insulating layer; and
    a passivation layer on the interlayer insulating film,
    wherein the etching stopper is on the interlayer insulating film.

3. The display device of claim 2, further comprising a light emitting element layer on the thin-film transistor layer and having a light emitting element connected to the thin-film transistor, wherein the thin-film transistor layer further comprises a connection electrode on the interlayer insulating film and connected between a first electrode of the thin-film transistor and the light emitting element.

4. The display device of claim 2, wherein the first contact hole additionally passes through the gate insulating layer, the interlayer insulating film, and the etching stopper.

5. The display device of claim 2, wherein a portion of the etching stopper inserted into the second contact hole surrounds the pad part at a distance.

6. A display device comprising:
    a substrate comprising a first contact hole;
    a thin-film transistor layer on a first surface of the substrate and comprising a plurality of insulating layers and a thin-film transistor;
    an etching stopper on at least one of the insulating layers and contacting the substrate through a second contact hole surrounding the first contact hole in a plan view; and
    a pad part on a second surface of the substrate opposite the first surface of the substrate and connected to the etching stopper through the first contact hole,
    wherein the first contact hole and the second contact hole are spaced apart from each other in a common layer plan view.

7. The display device of claim 6, wherein the insulating layers comprise:
    a gate insulating layer on the substrate;
    an interlayer insulating film on the gate insulating layer; and
    a passivation layer on the interlayer insulating film,
    wherein the etching stopper is on the interlayer insulating film.

8. The display device of claim 7, wherein the first contact hole additionally passes through the gate insulating layer and the interlayer insulating film.

9. The display device of claim 6, wherein the insulating layers comprise:
    a gate insulating layer on the substrate;
    an interlayer insulating film on the gate insulating layer; and
    a passivation layer on the interlayer insulating film,
    wherein the etching stopper is on the gate insulating layer.

10. The display device of claim 9, wherein the first contact hole additionally passes through the gate insulating layer.

11. The display device of claim 6, further comprising:
    a flexible film on the second surface of the substrate and connected to the pad part; and
    a source driver on the flexible film.

* * * * *

UNITED STATES PATENT AND TRADEMARK OFFICE
CERTIFICATE OF CORRECTION

| | | |
|---|---|---|
| PATENT NO. | : 12,120,933 B2 | Page 1 of 1 |
| APPLICATION NO. | : 17/379445 | |
| DATED | : October 15, 2024 | |
| INVENTOR(S) | : Jae Been Lee et al. | |

It is certified that error appears in the above-identified patent and that said Letters Patent is hereby corrected as shown below:

In the Claims

In Column 40, Line 38, in Claim 6, before "plan view." insert -- in a --.

Signed and Sealed this
Fifteenth Day of July, 2025

Coke Morgan Stewart
*Acting Director of the United States Patent and Trademark Office*